United States Patent
Noguchi

(10) Patent No.: US 8,681,998 B2
(45) Date of Patent: Mar. 25, 2014

(54) VOLUME CORRECTION DEVICE, VOLUME CORRECTION METHOD, VOLUME CORRECTION PROGRAM, AND ELECTRONIC EQUIPMENT

(75) Inventor: Masayoshi Noguchi, Chiba (JP)

(73) Assignee: Sony Corporation, Tokyo (JP)

( * ) Notice: Subject to any disclaimer, the term of this patent is extended or adjusted under 35 U.S.C. 154(b) by 695 days.

(21) Appl. No.: 12/701,782

(22) Filed: Feb. 8, 2010

(65) Prior Publication Data

US 2010/0208918 A1   Aug. 19, 2010

(30) Foreign Application Priority Data

Feb. 16, 2009   (JP) .................................. 2009-032272

(51) Int. Cl.
*H04R 29/00* (2006.01)
*H03G 3/00* (2006.01)

(52) U.S. Cl.
USPC .............................. 381/56; 381/104; 381/107

(58) Field of Classification Search
USPC ............ 381/56, 107, 104, 102, 109; 391/110; 704/210, 225, 214
See application file for complete search history.

(56) References Cited

U.S. PATENT DOCUMENTS

| 5,018,205 | A | 5/1991 | Takagi et al. |
| 6,249,757 | B1 * | 6/2001 | Cason ........................... 704/214 |
| 6,870,933 | B2 | 3/2005 | Roover |
| 2004/0213421 | A1 | 10/2004 | Jacobs |
| 2005/0232445 | A1 | 10/2005 | Vaudrey et al. |
| 2006/0159190 | A1 | 7/2006 | Wu et al. |
| 2008/0152155 | A1 | 6/2008 | Avendano et al. |
| 2008/0304673 | A1 * | 12/2008 | Otani .............................. 381/57 |
| 2010/0142729 | A1 | 6/2010 | Noguchi |
| 2010/0189270 | A1 | 7/2010 | Noguchi |

FOREIGN PATENT DOCUMENTS

| CN | 1507293 A | 6/2004 |
| EP | 0 624 030 A1 | 11/1994 |
| JP | 63-193604 A | 8/1988 |
| JP | 01-311709 A | 12/1989 |
| JP | 03-009700 A | 1/1991 |
| JP | 04-303900 A | 10/1992 |
| JP | 5-23700 U | 3/1993 |
| JP | 08-009498 A | 1/1996 |
| JP | 08-222979 A | 8/1996 |

(Continued)

OTHER PUBLICATIONS

Office Action in related Japanese Application No. 2011-023852 dated Oct. 2, 2012, pp. 1-3.

*Primary Examiner* — Vivian Chin
*Assistant Examiner* — Douglas Suthers
(74) *Attorney, Agent, or Firm* — Wolf, Greenfield & Sacks, P.C.

(57) ABSTRACT

A volume correction device includes: a variable gain means for controlling a gain, given to an input audio signal, according to a gain control signal; a consecutive relevant sounds interval detection means for detecting a consecutive relevant sounds interval, during which a group of temporally adjoining consecutive relevant sounds is present, in the input audio signal; a mean level detection means for detecting the mean level of the input audio signal attained during the consecutive relevant sounds interval, and whose time constant for mean level detection is set to a smaller value during the leading period of the consecutive relevant sounds interval than during the remaining period; a gain control signal production means for producing the gain control signal, so that the mean level will be equal to a reference level, and feeding the gain control signal to the variable gain means.

12 Claims, 32 Drawing Sheets

(56) References Cited

FOREIGN PATENT DOCUMENTS

| | | | |
|---|---|---|---|
| JP | 08-292787 A | 11/1996 |
| JP | 2002-101002 A | 4/2002 |
| JP | 3321820 | 6/2002 |
| JP | 2003-084790 A | 3/2003 |
| JP | 2003-524906 T | 8/2003 |
| JP | 3475476 | 9/2003 |
| JP | 2004-129187 A | 4/2004 |
| JP | 2005-229544 A | 8/2005 |
| JP | 2006-171663 A | 6/2006 |
| JP | 2006-524475 T | 10/2006 |
| JP | 2007-129383 A | 5/2007 |
| JP | 2007-158873 A | 6/2007 |
| JP | 2008-079065 A | 4/2008 |
| JP | 2008-309704 A | 12/2008 |
| JP | 2008-310901 A | 12/2008 |
| JP | 2009-025500 A | 2/2009 |
| WO | WO 96/29780 A1 | 9/1996 |
| WO | WO 99/53612 A1 | 10/1999 |
| WO | WO 2008/035227 A2 | 3/2008 |
| WO | WO 2008/059640 A1 | 5/2008 |
| WO | WO 2008/073487 A2 | 6/2008 |
| WO | WO 2008/078232 A1 | 7/2008 |

* cited by examiner

35 LEADING CONSECUTIVE RELEVANT SOUNDS PERIOD DETECTION BLOCK

36 MEAN LEVEL PRODUCTION BLOCK

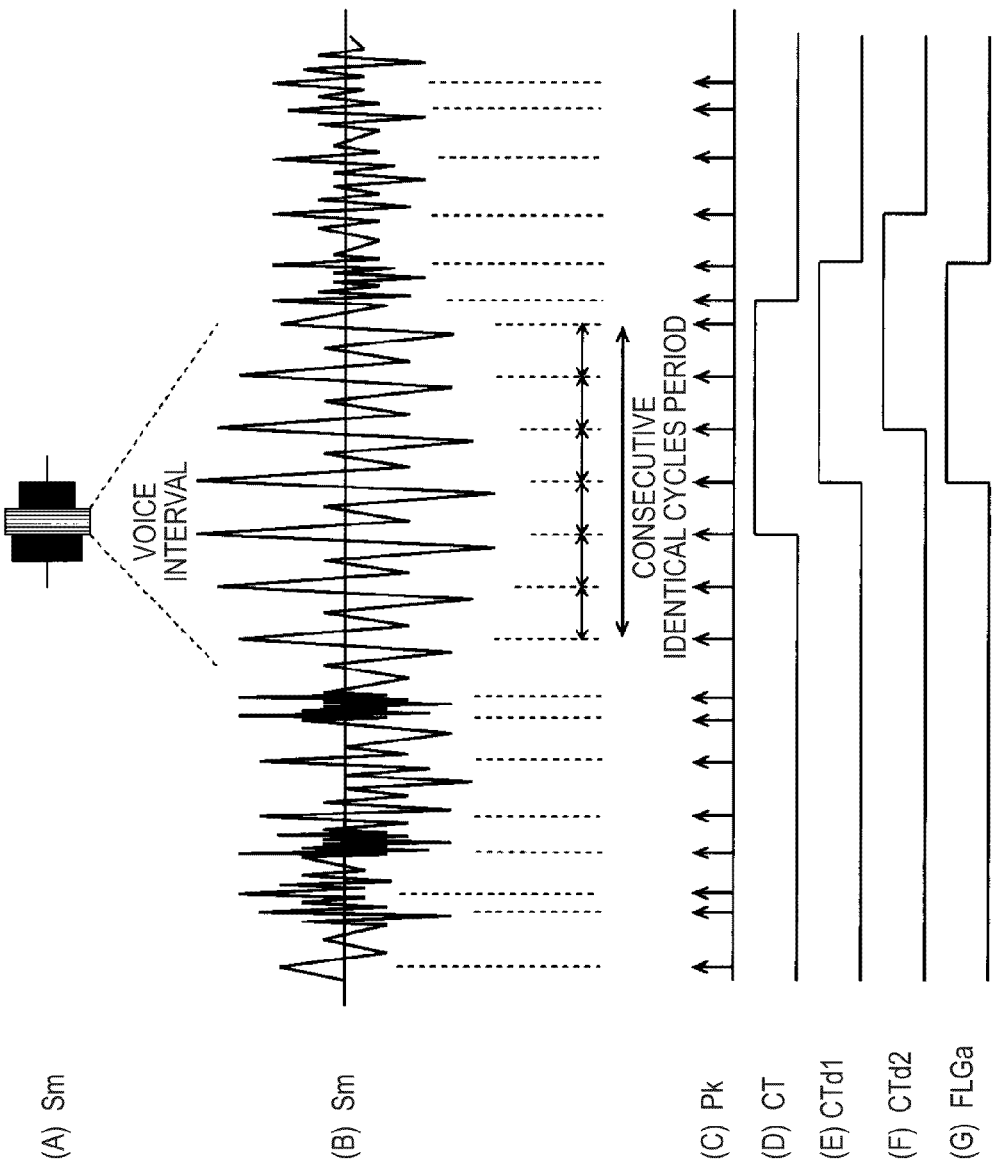

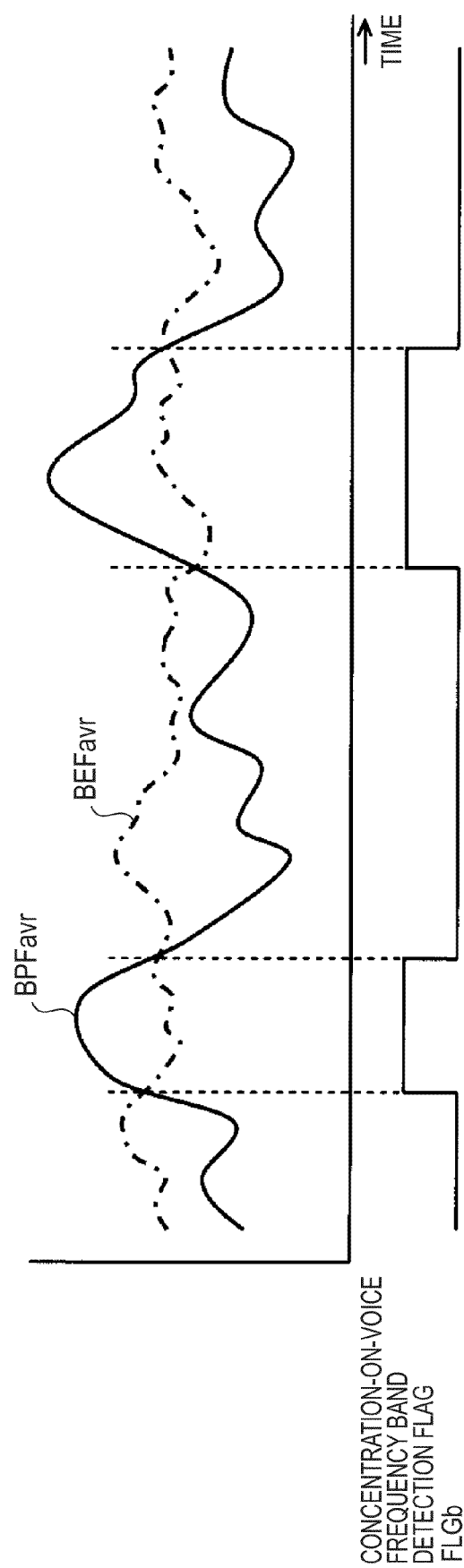

FOR ANGLE θa

FOR ANGLE θb

ORIENTING-DIRECTION DISTRIBUTION P(θ)

RELATIONSHIP BETWEEN ORIENTATIONAL ANGLE θ AND ORIENTING DIRECTION OF AUDIO SIGNAL

38 LEADING CONSECUTIVE RELEVANT SOUNDS PERIOD DETECTION BLOCK

39 VOICE MEAN LEVEL PRODUCTION BLOCK

VOLUME CORRECTION DEVICE, VOLUME CORRECTION METHOD, VOLUME CORRECTION PROGRAM, AND ELECTRONIC EQUIPMENT

CROSS REFERENCE TO RELATED APPLICATIONS

The present application claims priority to Japanese Priority Patent Application JP 2009-032272, filed in the Japan Patent Office on Feb. 16, 2009, the entire contents of which is hereby incorporated by reference.

1. Field of the Invention

The present invention relates to a volume correction device, a volume correction method, and a volume correction program that are preferably adapted to an audio output section of electronic equipment represented by, for example, a television set.

2. Description of the Related Art

When broadcast channels to be received by a television set are switched, or when plural pieces of input equipment are switched at an audiovisual (AV) center in an AV system, a large change may occur in an output volume due to a difference in a level between contents.

In such a case, if a user wants to obtain a volume he/she likes, the user has to perform a volume adjusting manipulation using a remote control or the like so as to control the volume. The user may find it time-consuming.

An example of a technique for solving the above problem is disclosed in patent document 1 (Japanese Patent No. 3475476). According to the patent document 1, when channels are switched at the time of receiving a television broadcast, plural pieces of input equipment are switched, or contents whose signal levels have a large difference are switched, information on a level difference between channels or information on switching is acquired in advance. Thereafter, according to the patent document 1, a volume is corrected based on the information on a level difference between channels or the information on switching that is acquired in advance.

As another example of a volume correction method for solving the aforesaid problem, a volume control method based on automatic gain control (AGC) (may be called an AGC method) is widely known.

FIG. 38 is a block diagram showing an example of the configuration of a volume correction section adopting the AGC method. The example shown in FIG. 38 is a case where volume correction is performed on input audio signals SiL and SiR on two left and right channels.

Namely, in this example, the input audio signals SiL and SiR on the two left and right channels are fed to variable gain amplifiers 1L and 1R whose gains are varied or controlled based on a gain control signal.

The input audio signals SiL and SiR on the two left and right channels are added up by an adder 2. A sum output signal sent from the adder 2 is multiplied by a gain of ½ by an amplifier 3, and then fed to a mean level detection unit 4. The mean level detection unit 4 detects the mean level of the sum output signal.

The mean level detected by the mean level detection unit 4 is fed to a gain control signal production unit 5. The gain control signal production unit 5 compares the mean level sent from the mean level detection unit 4 with a reference level determined in advance. The result of the comparison is used to produce a gain control signal based on which the difference between the signal levels is nullified. The gain control signal is then fed to the variable gain amplifiers 1L and 1R.

The variable gain amplifiers 1L and 1R have the gains thereof varied or controlled based on the gain control signal sent from the gain control signal production unit 5. In this case, the gains to be given to the input audio signals SiL and SiR on the two left and right channels are controlled so that the mean level of the sum output signal sent from the adder 2 will be equal to the reference level at the variable gain amplifiers 1L and 1R.

As a result, output audio signals SoL and SoR on the two left and right channels and fed from the variable gain amplifiers 1L and 1R are automatically corrected to represent a certain volume level. That is, if the output audio signals represent a small volume, the volume is increased. If the output audio signals represent a large volume, the volume is decreased. Therefore, loud sounds will not be outputted and a soft sound that is inaudible will be made audible.

Aside from the foregoing volume correction method based on AGC, various volume correction methods have been proposed. For example, patent document 2 (Japanese Patent No. 3321820) has disclosed a method according to which: a compressor is included; and when a high-level audio signal is inputted, the level of an output audio signal is controlled to be smaller than the input level in order to control a volume within a certain range.

SUMMARY OF THE INVENTION

The foregoing problem arises not only in a case where signals representing different contents obtained before and after pieces of input equipment or receiving channels are switched have a level difference but also in a case where the same content is being received.

Specifically, for example, even while the same broadcast channel or broadcast program is being received, an output volume is changed in a commercial message (CM) portion or along with a change of scenes. This may be found disgusting.

According to the aforesaid volume control to be achieved using the AGC method, even the volume of the same content can be controlled with a mean level of an entire audio signal, which represents the content, as a reference. An output volume is expected to be held constant. However, the existing volume control to be achieved using the AGC method is confronted with a problem described below.

Specifically, the existing volume control to be achieved using the AGC method is such that a mean level of an entire audio signal is detected with a predetermined certain time constant designated for detection, and the detected mean level is used to implement volume control in the entire audio signal.

When the time constant for detection of the mean level of an audio signal is set to a small value, an output volume can be held constant by swiftly coping with a change in the output volume represented by the audio signal. Therefore, for example, at the leading time point of a commercial message portion, at the time of a change of scenes, or at a time point at which a level difference is noticeable, a change in an output volume is expected to be nullified in order to hold the output volume constant.

However, when volume control is implemented to quickly cope with a change in the mean level of an audio signal by setting a time constant for detection of the mean level to a small value, since a change in the level is faithfully followed, sounds may be fluctuated even during a steady-state audio interval.

In contrast, when the time constant for detection of the mean level of an audio signal is set to a large value, since a minute change in the audio signal level is not followed, a fluctuation in sounds occurring during a steady-state audio interval can be prevented. A volume can be controlled to be comfortably audible.

However, in this case, a problem arises in that a response to a large change in a level difference occurring at a time at which pieces of input equipment or receiving channels are switched, at the leading time point of a commercial message part, or at the time point of a change of scenes is degraded.

Thus, there is a need for a device and method capable of implementing satisfactory volume control during an audio interval during which a large level difference occurs, such as, during which channels are switched or the leading time point of a commercial message part comes, and during a steady-state audio interval.

According to one embodiment of the invention, there is provided a volume correction device including:

a variable gain means for controlling a gain, which is given to an input audio signal, according to a gain control signal;

a consecutive relevant sounds interval detection means for detecting a consecutive relevant sounds interval, during which a group of temporally adjoining consecutive relevant sounds is present, in the input audio signal;

a mean level detection means for detecting the mean level of the input audio signal attained during the consecutive relevant sounds interval detected by the consecutive relevant sounds interval detection means, and whose time constant for mean level detection is set to a smaller value during a certain period, which begins at the leading time point of the consecutive relevant sounds interval, than during the remaining period of the consecutive relevant sounds interval; and a gain control signal production means for producing the gain control signal, based on which the gain to be given to the input audio signal is controlled, so that the mean level detected by the mean level detection means will be equal to a reference level, and feeding the produced gain control signal to the variable gain means.

According to the one embodiment of the invention, the consecutive relevant sounds interval detection means detects a consecutive relevant sounds interval, during which a group of temporally adjoining consecutive relevant sounds is present, in an input audio signal. The mean level detection means detects the mean level of the input audio signal during the consecutive relevant sounds interval. The time constant for mean level detection is set to a smaller value during the certain period, which begins at the leading time point of the consecutive relevant sounds interval, than during the remaining period of the consecutive relevant sounds interval.

As a result, during the certain period beginning at the leading time point of the consecutive relevant sounds interval, the mean level detection means detects the mean level of the input audio signal so as to swiftly cope with a change in the audio signal level. During a steady-state audio interval succeeding the certain period that begins at the leading time point of the consecutive relevant sounds interval, the mean level detection means detects the mean level of the input audio signal without following a minute change in the audio signal level.

As mentioned above, based on the mean level detected by the mean level detection means, the gain control signal production means produces a gain control signal based on which a gain to be given to the input audio signal is controlled, and feeds the produced gain control signal to the variable gain means.

Therefore, during the certain period beginning at the leading time point of the consecutive relevant sounds interval during which a large level difference may occur, the variable gain means performs gain control on the input audio signal so that the large level difference will be quickly suppressed. Accordingly, the level difference occurring between adjoining consecutive relevant signals intervals is quickly corrected even at the leading time point of each of the consecutive relevant signals intervals.

During an interval which succeeds the certain period beginning at the leading time point of the consecutive relevant sounds interval and during which the level of an audio signal makes a steady change, the variable gain means does not follow a minute change in the audio signal level, but controls a gain, which is given to an input audio signal, so that the mean level of the audio signal will be held constant. Accordingly, a fluctuation in sounds during the steady-state audio interval can be prevented.

According to the one embodiment of the present invention, satisfactory volume control is implemented during an audio interval during which a large level difference occurs, such as, during which channels are switched or the leading time point of a commercial message portion comes, and during a steady-state audio interval.

According to another embodiment of the present invention, in the volume correction device according to the one embodiment, during the certain period beginning at the leading time point of the consecutive relevant sounds interval, the mean level detection means compares the mean level, which is detected by the mean level detection means, with the mean level of the input audio signal, and changes the time constant for mean level detection, which is designated during the certain period, according to the result of the comparison.

In the another embodiment of the present invention, during the certain period beginning at the leading time point of the consecutive relevant sounds interval, the mean level of the input audio signal attained during the consecutive relevant sounds interval is compared with the mean level thereof attained during the preceding consecutive relevant sounds interval detected by the mean level detection means. Based on the result of the comparison, the time constant for mean level detection to be designated during the certain period beginning at the leading time point of the consecutive relevant sounds interval is changed or controlled.

For example, in order to expedite gain correction, which is intended to increase a volume, more greatly than gain correction intended to decrease the volume, when the mean level of the input audio signal is higher than the mean level attained during the preceding consecutive relevant sounds interval, the time constant mean level detection to be designated during the certain period is decreased. Thus, volume correction can be achieved so that: the level difference with respect to the preceding consecutive relevant sounds interval can be satisfactorily compensated; and a fluctuation derived from a level change can be suppressed.

According to still another embodiment of the present invention, there is provided a volume correction device including:

a variable gain means for controlling a gain, which is given to an input audio signal, according to a gain control signal;

a consecutive relevant sounds interval detection means for detecting a consecutive relevant sounds interval, during which a group of temporally adjoining consecutive relevant sounds is present, in the input audio signal;

a voice interval detection means for detecting a voice interval that is a time interval during which an audio signal representing human voice is contained in the input audio signal;

a voice mean level detection means for detecting the mean level of the input audio signal attained during the voice interval detected by the voice interval detection means, and whose time constant for mean level detection is set to smaller value during a certain period, which begins at the leading time point of the consecutive relevant sounds interval, than during the remaining period of the consecutive relevant sounds interval; and a gain control signal production means for producing the gain control signal, based on which the gain to be given to the input audio signal is controlled, so that the mean level detected by the voice mean level detection means will be equal to a reference level, and feeding the produced gain control signal to the variable gain means.

According to the still another embodiment of the present invention, the voice mean level detection means detects the mean level of the input audio signal, that is, the voice mean level only during the time interval which is detected by the voice interval detection means and during which the audio signal representing human voice is contained in the input audio signal.

Therefore, the same advantage as that of the one embodiment can be provided. In addition, since the volume of human voice is corrected to have a certain level, lines or the like become comfortably audible.

According to yet another embodiment of the present invention, in the volume correction device according to the still another embodiment, during the certain period beginning with the leading time point of the consecutive relevant sounds interval, the voice mean level production means compares the mean level, which is detected by the voice mean level detection means, with the mean level of the input audio signal attained during the voice interval, and changes the time constant for mean level detection, which is designated during the certain period, according to the result of the comparison.

According to the yet another embodiment of the present invention, similarly to the another embodiment thereof, volume correction is achieved to satisfactorily compensate a level difference with respect to the preceding consecutive relevant sounds interval and to suppress a fluctuation derived from intonation.

According to further another embodiment of the present invention, there is provided a volume correction device including:

a variable gain means for controlling a gain, which is given to an input audio signal, according to a gain control signal;

a consecutive relevant sounds interval detection means for detecting a consecutive relevant sounds interval, during which a group of temporally adjoining consecutive relevant sounds is present, in the input audio signal;

a voice interval detection means for detecting a voice interval that is a time interval during which an audio signal representing human voice is contained in the input audio signal;

a voice mean level detection means for detecting the mean level of the input audio signal attained during the voice interval detected by the voice interval detection means, and whose time constant for mean level detection is set to a smaller value during a certain period, which begins at the leading time point of the consecutive relevant sounds interval, than during the remaining period of the consecutive relevant sounds interval;

a non-voice mean level detection means for detecting the mean level of an audio signal that represents sounds other than human voice and silence and that is contained in the input audio signal; and a gain control signal production means that when a non-voice mean level detected by the non-voice mean level detection means is not higher by a certain magnitude than a voice mean level detected by the voice mean level detection means, produces the gain control signal, based on which the gain to be given to the input audio signal is controlled, so that the voice mean level detected by the voice mean level detection means will be equal to a reference level, that when the non-voice mean level detected by the non-voice mean level detection means is larger by the certain magnitude than the voice mean level detected by the voice mean level detection means, produces the gain control signal, based on which the gain to be given to the input audio signal is controlled, so that the non-voice mean level detected by the non-voice mean level detection means will be equal to the reference level, and that feeds the produced gain control signal to the variable gain means.

According to the further another embodiment of the present invention, when loud sounds other than voice are inputted, volume correction can be achieved to quickly lower the level of an audio signal so as to correct the volume.

According to the embodiments of the invention, volume control is satisfactorily performed on an input audio signal both during an audio interval during which a level difference is large, such as, during which channels are switched or the leading time point of a commercial message portion comes, and during a steady-state audio interval.

BRIEF DESCRIPTION OF THE DRAWINGS

FIG. 15 is a diagram for use in explaining processing actions to be performed in the configuration shown in FIG. 14;

FIG. 17 is a diagram for use in explaining part of the configuration shown in FIG. 13;

DESCRIPTION OF THE PREFERRED EMBODIMENTS

Figure 1:
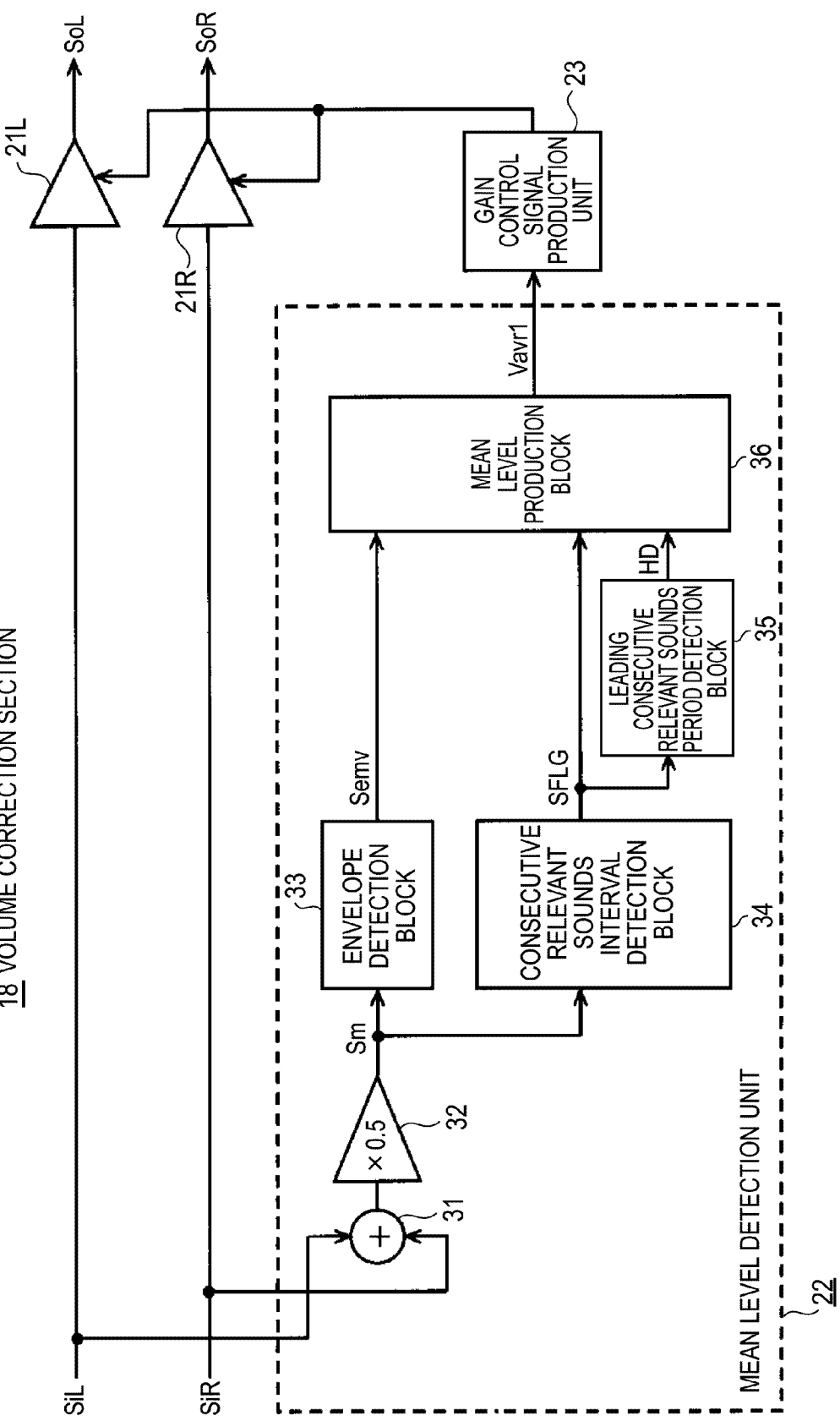
FIG. 1 is a block diagram for use in explaining an example of the configuration of a volume correction device in accordance with a first embodiment of the present invention.

Referring to the drawings, volume correction devices in accordance with embodiments of the present invention will be described below. The volume correction devices of the embodiments to be described below are adapted to an audio output section of a television set.

Figure 2:
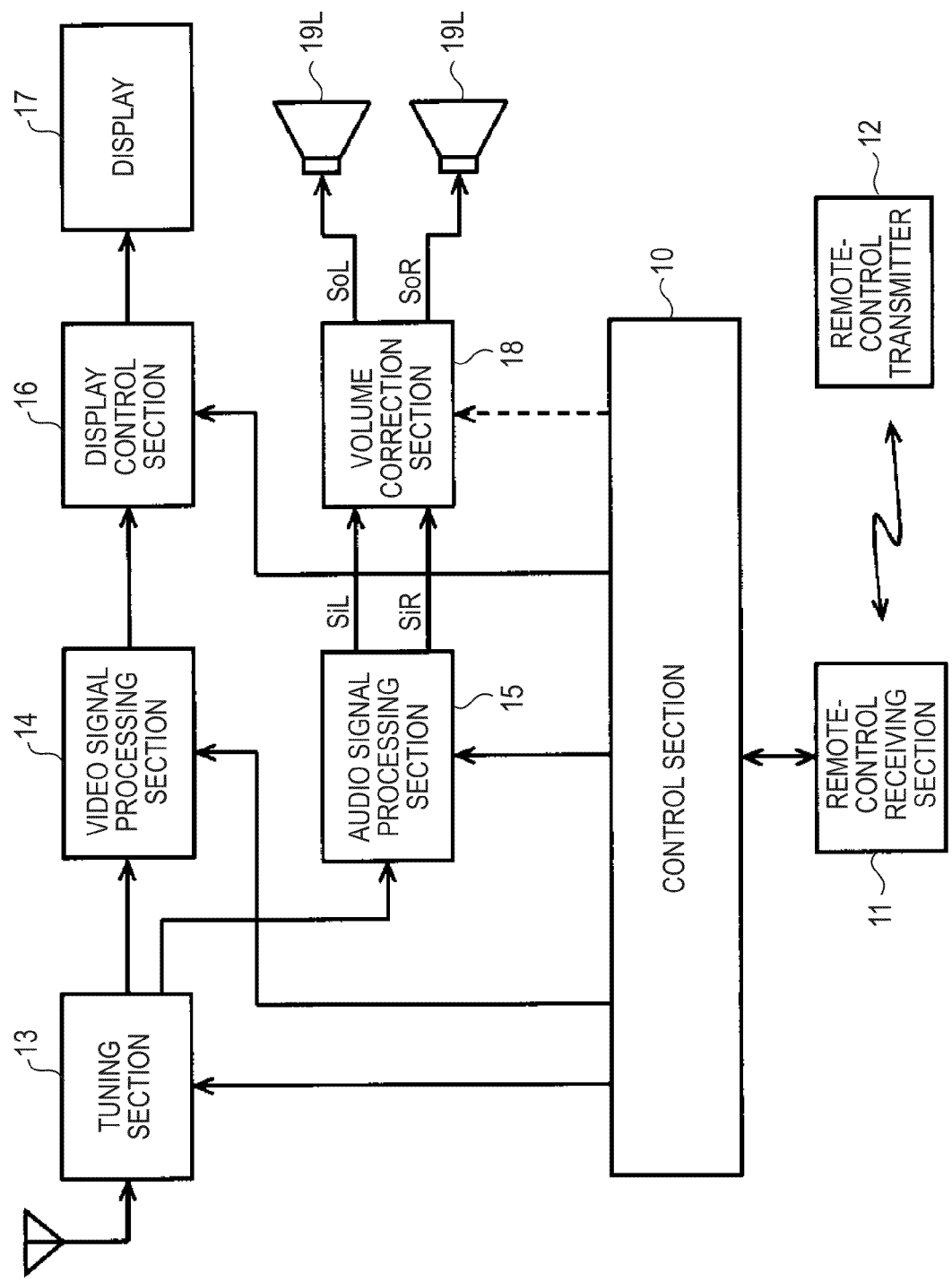
FIG. 2 is a block diagram for use in explaining an example of electronic equipment to which the volume correction device in accordance with the embodiment of the present invention is adapted.

FIG. 2 is a block diagram showing an example of the configuration of a television set. The television set shown in FIG. 2 includes a control section 10 formed using a microcomputer. A remote-control receiving section 11 is connected to the control section 10. The remote-control receiving section 11 receives a remote-control signal sent from a remote-control transmitter 12, and transmits the signal to the control section 10. The control section 10 executes processing control according to the received remote-control signal.

The control section 10 feeds control signals to the components of the television set, receives a television broadcast signal, and executes pieces of processing for video reproduction and audio reproduction.

A tuning section 13 selects and extracts a signal on a broadcast channel, which is designated with a channel selection control signal sent from the control section 10 responsively to a user's remote-control manipulation, from the television broadcast signal. The tuning section 13 demodulates or decodes a video signal and an audio signal from the selected and extracted signal on the broadcast channel, and feeds the video signal to a video signal processing section 14 and the audio signal to an audio signal processing section 15.

The video signal processing section 14 performs predetermined processing on the video signal under the control of the control section 10, and feeds the processed video signal to a display 17, which is realized with, for example, a liquid crystal display, via a display control section 16. Thus, an image of a broadcast program on the selected broadcast channel is displayed on the display 17.

The audio signal processing section 15 performs predetermined processing on the audio signal under the control of the control section 10. In the present embodiment, the audio signal processing section 15 produces audio signals SiL and SiR on two left and right channels from the audio signal sent from the tuning section 13, and feeds the processed audio signals SiL and SiR to a volume correction section 18.

The volume correction section 18 is a component to which the volume correction device in accordance with the present embodiment is adapted. The input audio signals SiL and SiR are, as mentioned later, subjected to volume correction, and outputted as output audio signals SoL and SoR. The output audio signals SoL and SoR sent from the volume correction section 18 are fed to loudspeakers 19L and 19R, whereby sounds are reproduced. Thus, sounds representing the broadcast program on the selected channel are released through the loudspeakers 19L and 19R.

The volume correction device of the present embodiment will be described below by taking the volume correction section 18 for instance.

First Embodiment

FIG. 1 is a block diagram showing an example of the overall configuration of the volume correction section 18 that is the volume correction device in accordance with the first embodiment of the present invention.

As shown in FIG. 1, even in the present embodiment, the input audio signals SiL and SiR on the two left and right channels are fed to variable gain amplifiers 21L and 21R whose gains are varied or controlled according to a gain control signal.

The input audio signals SiL and SiR on the two left and right channels are fed to a mean level detection unit 22. As described later, the mean level of an entire audio signal, which is a sum signal of the input audio signals SiL and SiR on the two left and right channels, attained during a consecutive relevant sounds interval is detected.

What is referred to as a consecutive relevant sounds interval is an interval, during which an audio signal is present, in the sum signal of the input audio signals SiL and SiR. If the consecutive relevant sounds interval includes plural intervals, the intervals are a group of audio signal intervals that are temporally adjoining and are relevant to one another.

For example, as far as a television broadcast program is concerned, scene-associated audio intervals that are audio intervals associated with a scene are regarded as the consecutive relevant sounds interval. Sounds are associated with a video scene. When scenes are changed, a relatively long silent interval is generated. Within a scene, even if the silent interval is a temporally short period, audio signal present intervals temporally adjoin the silent interval.

In the present embodiment, one or plural audio signal present intervals that temporally adjoin are thought to be intervals (scene-associated audio intervals) associated with one scene or mutually relevant audio intervals, and are regarded as the consecutive relevant sounds interval.

In the case of a television broadcast program, a relatively long silent interval is generally generated prior to the timing of broadcasting a commercial message. Therefore, the timing of initiating broadcasting of a commercial message is associated with the leading time point of a consecutive relevant sounds interval.

When channels are switched, since a silent interval is generated in an input audio signal, the channel switching time is regarded as a breakpoint of a consecutive relevant sounds interval.

The mean level detection unit 22 detects the mean level of an audio signal during each of consecutive relevant sounds intervals that are generated discretely on a time base. During a silent interval between consecutive relevant sounds intervals, the mean level detection unit 22 holds the mean level detected during the temporally preceding consecutive relevant sounds interval. Thus, the mean level detection unit 22 detects a gross mean level of an input audio signal.

As described later, the mean level detection unit 22 included in the present embodiment has a time constant thereof for mean level detection set to a smaller value during a certain period, which begins at the leading time point of a consecutive relevant sounds interval, so that the mean level of an input audio signal can be quickly detected. Thus, a level difference between temporally adjoining consecutive relevant sounds intervals can be quickly compensated.

Further, the mean level detection unit 22 employed in the present embodiment has the time constant thereof for mean level detection set to a larger value during the remaining period, which succeeds the certain period beginning at the leading time point of the consecutive relevant sounds interval, than during the certain period, so as not to follow a minute variation in an audio signal level.

The mean level detected by the mean level detection unit 22 is fed to a gain control signal production unit 23. The gain control signal production unit 23 compares the mean level of the audio signal, which is detected by the mean level detection unit 22, with a predetermined reference level, and produces the gain control signal, which nullifies the difference between the mean levels, according to the result of the comparison. The gain control signal production unit 23 feeds the produced gain control signal to the variable gain amplifiers 21L and 21R.

The variable gain amplifiers 21L and 21R have the gains thereof varied or controlled with the gain control signal sent from the gain control signal production unit 23. In this case, the variable gain amplifiers 21L and 21R control the gains to be given to the input audio signals SiL and SiR on the two left and right channels so that the mean level of the sum signal of the input audio signals SiL and SiR on the two left and right channels attained during the consecutive relevant sounds interval will be equal to the reference level.

As mentioned above, the outputs of the variable gain amplifiers 21L and 21R are subjected to automatic volume control using the audio signal mean level, which is detected during the consecutive relevant sounds interval by the mean level detection unit 22, as a reference.

The output audio signals SoL and SoR on the two left and right channels fed from the variable gain amplifiers 21L and 21R are received by the loudspeakers 19L and 19R, whereby sounds are reproduced. In this case, the reproduced sounds have the volumes thereof satisfactorily controlled both during an audio interval during which a large level difference is generated, such as, during which channels are switched or the leading part of a commercial message portion comes is reproduced, and during a steady-state audio interval.

In the present embodiment, the mean level detection unit 22 is configured as shown in FIG. 1.

First, the input audio signals SiL and SiR on the two left and right channels are added up by an adder 31. A sum output signal sent from the adder 31 is multiplied by a gain of ½ by an amplifier 32. A sum output signal Sm sent from the amplifier 32 is fed to an envelope detection block 33. The envelope detection block 33 detects an envelope exhibiting the waveform of the sum output signal Sm, and outputs an envelope signal Semv. The envelope signal Semv representing the envelope of the sum output signal Sm detected by the envelope detection block 33 is fed to a mean level production block 36.

Figure 3:
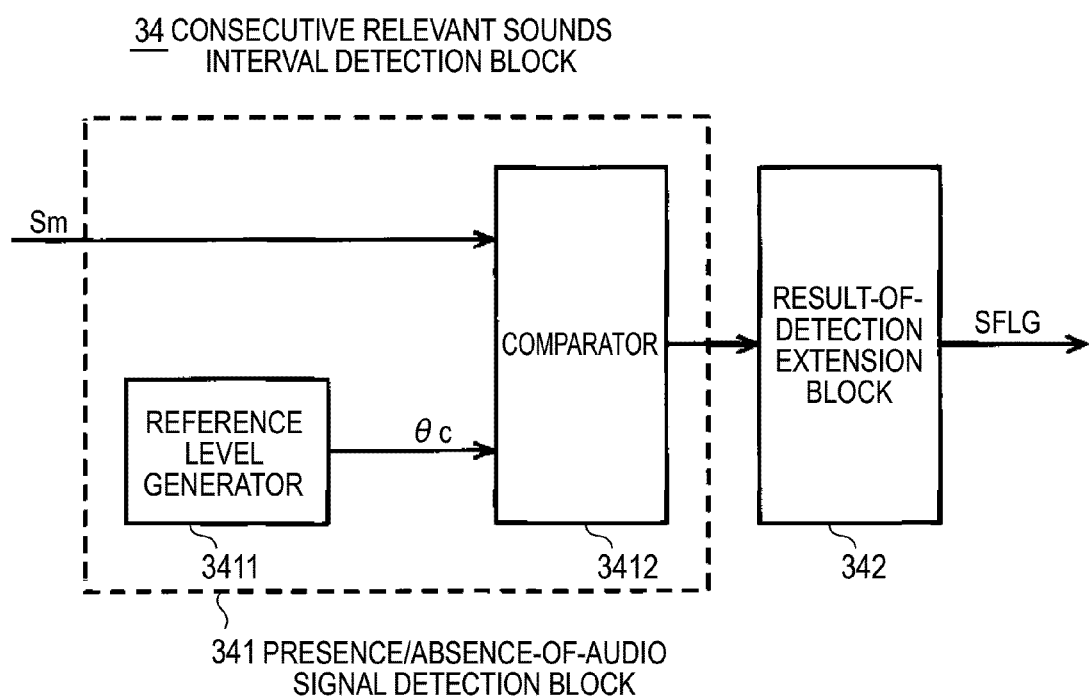
FIG. 3 is a block diagram showing an example of the configuration of a consecutive relevant sounds interval detection block employed in the embodiment shown in FIG. 1.

The sum output signal Sm sent from the amplifier 32 is fed to a consecutive relevant sounds interval detection block 34. The consecutive relevant sounds interval detection block 34 includes, as shown in FIG. 3, a presence/absence-of-audio signal detection block 341 and a result-of-detection extension block 342. The result-of-detection extension block 342 produces a signal representing an audio signal present interval that is represented by a detection output signal sent from the presence/absence-of-audio signal detection block 341 and is extended by delaying the end time point thereof by a certain period.

[Example of the Configuration of the Consecutive Relevant Sounds Interval Detection Block 34]

FIG. 3 shows an example of the basic configuration of the consecutive relevant sounds interval detection block 34. The presence/absence-of-audio signal detection block 341 includes a reference level generator 3411 and a comparator 3412. The comparator 3412 compares the sum output signal Sm, which is sent from the amplifier 32 (see part (A) of FIG.

Figure 4:
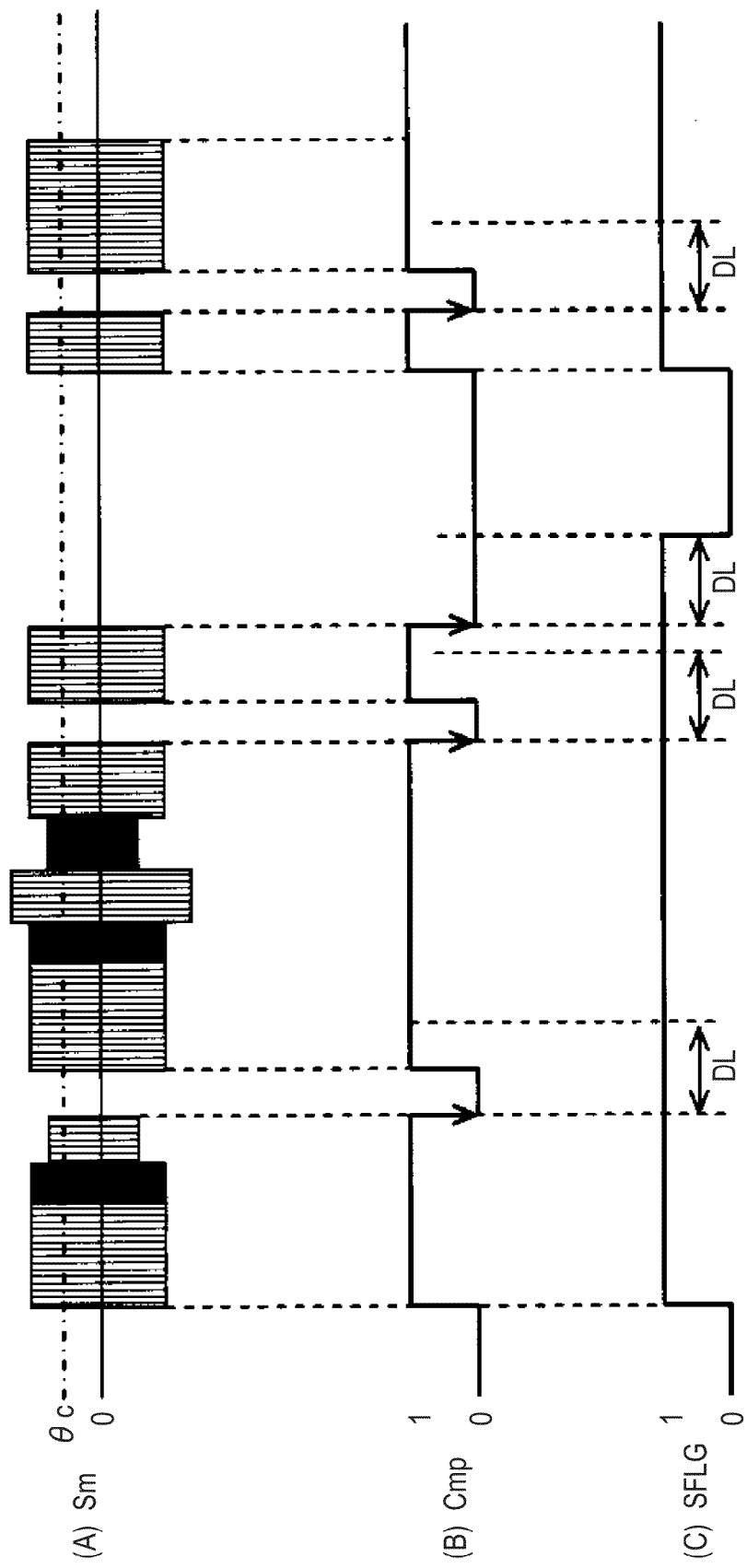
FIG. 4 is a diagram showing a timing chart for use in explaining actions to be performed in the consecutive relevant sounds interval detection block having the configuration shown in FIG. 3.

4), with a reference threshold level θc sent from the reference level generator 3411 (see part (A) of FIG. 4).

The comparator 3412 outputs a detection output Cmp (see part (B) of FIG. 4), which represents 1 when the sum output signal Sm is larger than the reference threshold level θc, and represents 0 when the sum output signal Sm is lower than the reference threshold level θc, to the result-of-detection extension block 342. In other words, the presence/absence-of-audio signal detection output Cmp sent from the comparator 3412 is set to 1 during an audio signal present interval, and represents 0 during an audio signal absent interval (non-signal interval). The detection output Cmp of the comparator 3412 is fed to the result-of-detection extension block 342.

The result-of-detection extension block 342 delays the fall time point of the detection output Cmp by a predetermined extension time DL so as to extend the duration of the detection output. In other words, the result-of-detection extension block 342 works to extend a "1" interval, which is the audio signal present interval represented by the detection output Cmp, by the extension time DL.

Therefore, an interval during which the detection output Cmp of the presence/absence-of-audio signal detection block 341 represents 0 is shorter than the predetermined extension time DL, the adjoining "1" intervals that are the audio signal present intervals are almost, as shown in part (C) of FIG. 4, joined. When the interval during which the detection output Cmp of the presence/absence-of-audio signal detection block 341 represents 0 is longer than the extension time DL, the output of the result-of-detection extension block 342 falls, as shown in part (C) of FIG. 4 to represent 0.

When the times among audio signal present intervals are shorter than the extension time DL, sounds represented by the audio signals during the intervals are detected as a group of consecutive relevant sounds that are relevant to one another. An output of the result-of-detection extension block 342 is a consecutive relevant sounds interval detection flag SFLG (part (C) of FIG. 4) indicating a consecutive relevant sounds interval.

The extension time DL designated for the result-of-detection extension block 342 is set to a time length, which makes it possible to recognize, for example, scene-associated audio intervals, as a consecutive relevant sounds interval, in advance on a fixed basis. By adjusting the extension time DL, the audio intervals to be detected as a consecutive relevant sounds interval can be adjusted.

In the example shown in FIG. 3, to what value the reference threshold level θc, which is used to detect the audio signal present intervals in the sum output signal Sm, is set has significant meanings. If the reference threshold level θc is set to a too small value, even a noise that is not an audio signal may be detected as the audio signal. If the reference threshold level θc is set to a too large value, presence or absence of the audio signal is not properly detected.

In the present embodiment, a threshold level θd that dynamically changes along with a change in the level of an audio signal is substituted for the threshold level θc that is set to a fixed value. Thus, presence or absence of the audio signal can be properly detected.

Figure 5:
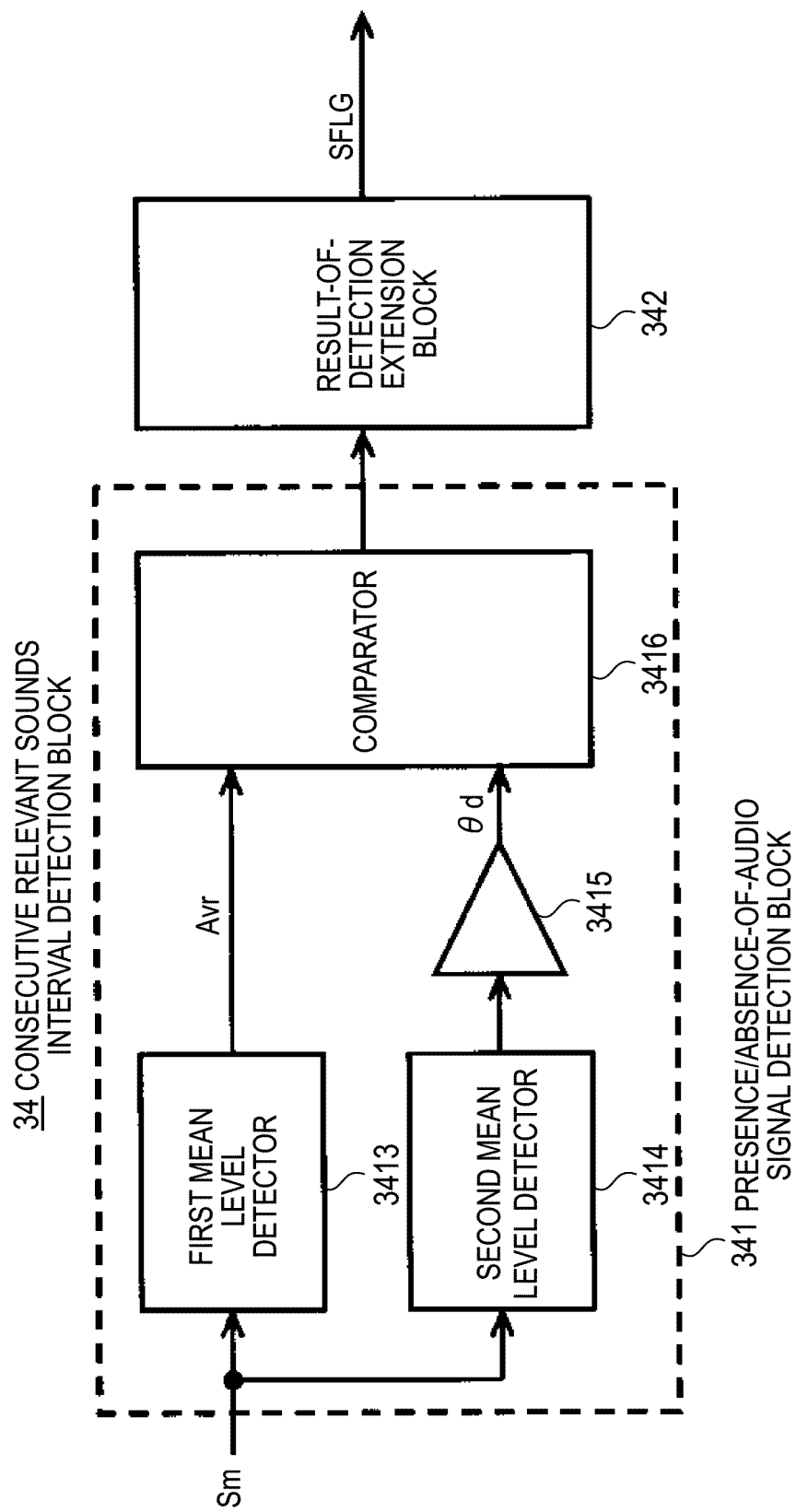
FIG. 5 is a block diagram showing another example of the configuration of the consecutive relevant sounds interval detection block employed in the embodiment shown in FIG. 1.

FIG. 5 shows an example of the configuration of the consecutive relevant sounds interval detection block 34 to be adopted when the threshold level θd that dynamically changes is employed.

The presence/absence-of-audio signal detection block 341 of the consecutive relevant sounds interval detection block 34 includes, as shown in FIG. 5, a first mean level detector 3413, a second mean level detector 3414, an attenuator 3415, and a comparator 3416. The configuration of the result-of-detection extension block 342 and the path along which a presence/absence-of-audio signal detection output is fed from the presence/absence-of-audio signal detection block 341 to the result-of-detection extension block 342 are identical to those in the example shown in FIG. 3.

Presence/absence-of-audio signal detecting actions to be performed in the presence/absence-of-audio signal detection block 341 having the configuration shown in FIG. 5 will be described with reference to FIG. 6.

Figure 6:
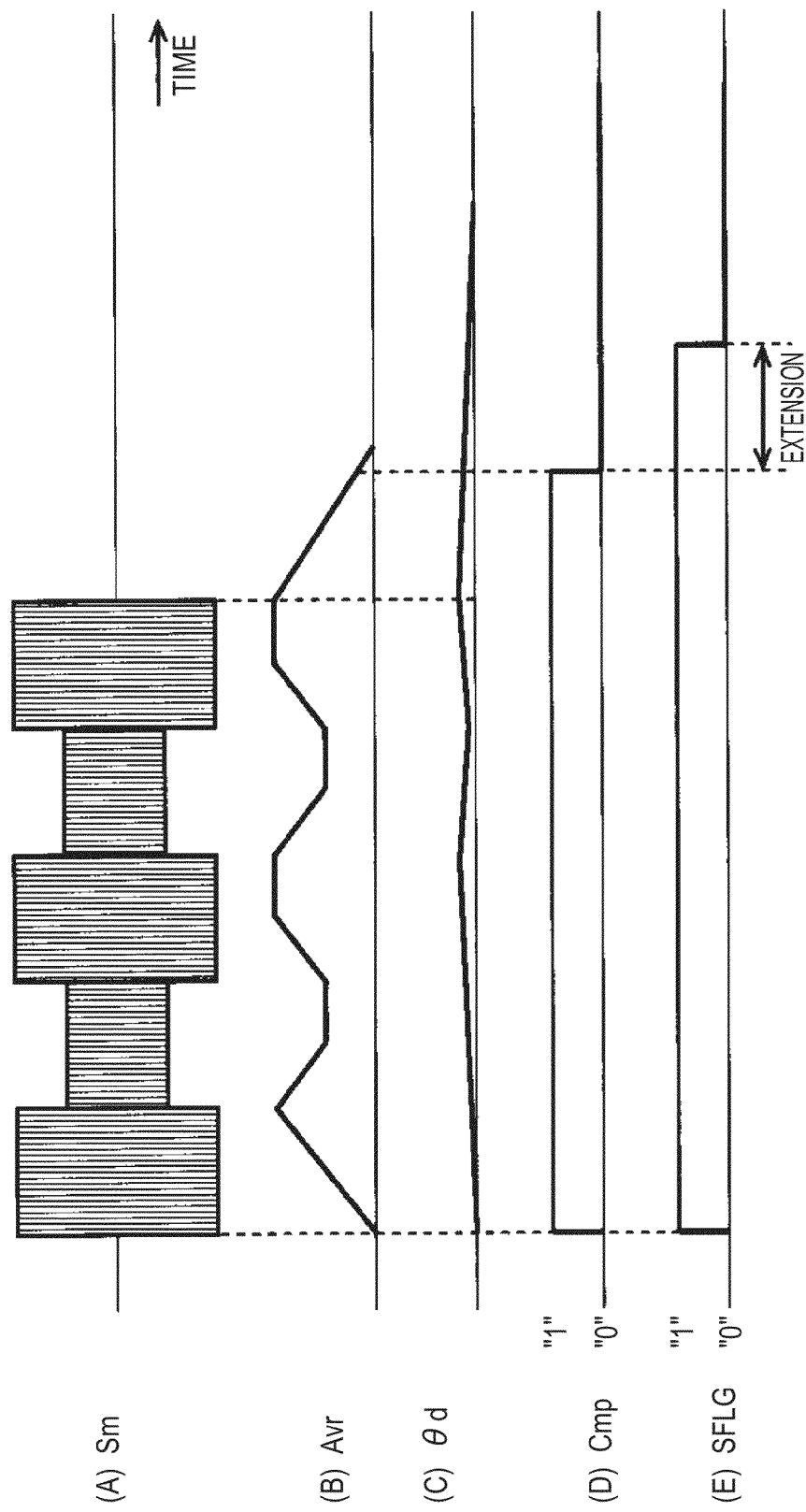
FIG. 6 is a diagram showing a timing chart for use in explaining actions to be performed in the consecutive relevant sounds interval detection block having the configuration shown in FIG. 5.

The first mean level detector 3413 detects the mean level of a sum output signal Sm (see part (A) of FIG. 6), which is an input signal thereof, while successfully following a change in the level, and has a time constant thereof for mean level detection set to a small value.

The second mean level detector 3414 detects the mean level of the sum output signal Sm for the purpose of designating the threshold level θd that changes along with a change in the level of the sum output signal Sm, and has the time constant thereof for mean level detection set to a large value.

The mean level Avr (See part (B) of FIG. 6) of the sum output signal Sm detected by the first mean level detector 3413 is fed to the comparator 3416. The mean level of the sum output signal Sm detected by the second mean level detector 3414 is attenuated by the attenuator 3415, and then fed as the threshold level θd (see part (C) of FIG. 6) to the comparator 3416.

The comparator 3416 detects a period, during which the mean level Avr of the sum output signal Sm exceeds the threshold level θd, as an audio signal present interval, and outputs a detection output Cmp (see part (D) of FIG. 6) that is set to 1 during the audio signal present interval.

The detection output Cmp of the comparator 3416 is fed to the result-of-detection extension block 342. The result-of-detection extension block 342 outputs a consecutive relevant sounds interval detection flag SFLG (see part (E) of FIG. 6) that indicates an interval during which the detection output Cmp of the comparator 3416 represents 1 and which is extended by the extension time DL.

The consecutive relevant sounds interval detection flag SFLG outputted as mentioned above from the consecutive relevant sounds interval detection block 34 is fed to the mean level production block 36 and also fed to the leading consecutive relevant sounds period detection block 35.

The leading consecutive relevant sounds period detection block 35 produces and outputs a leading period detection flag HD that indicates a period of a predefined time length beginning at the leading time point of the consecutive relevant sounds interval detected by the consecutive relevant sounds interval detection block 34.

[Example of the Configuration of the Leading Consecutive Relevant Sounds Period Detection Block 35]

Figure 7:
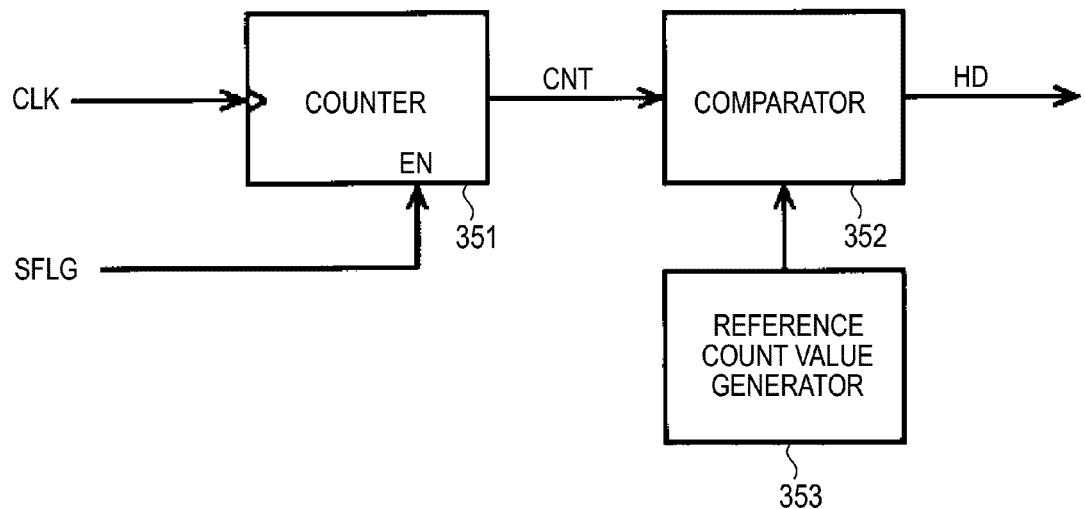
FIG. 7 is a block diagram for use in explaining an example of the configuration of a leading consecutive relevant sounds period detection block employed in the embodiment shown in FIG. 1.

In the present embodiment, the leading consecutive relevant sounds period detection block 35 is configured as shown in FIG. 7. Namely, the leading consecutive relevant sounds period detection block 35 includes a counter 351, a comparator 352, and a reference count value generator 353.

A clock signal CLK sent from a clock generator that is not shown is fed to a clock terminal of the counter 351. The consecutive relevant sounds interval detection flag SFLG sent from the consecutive relevant sounds interval detection block 34 is fed to an enabling terminal EN of the counter 351, and is also fed to a reset terminal RS of the counter 351.

Accordingly, during a consecutive relevant sounds interval during which the consecutive relevant sounds interval detection flag SFLG is set to 1, the counter 351 counts the number of times by which the cycle of the clock signal CLK is repeated. The count value is reset with the fall of the consecutive relevant sounds interval detection flag SFLG.

The count value output CNT of the counter 351 is fed to the comparator 352. The reference count value sent from the reference count value generator 353 is also fed to the comparator 352.

The comparator 352 compares the count value output CNT with the reference count value, and produces and outputs the leading period detection flag HD that is set to 1 during a period during which the count value output CNT of the counter 351 reaches the reference count value, and is reset to 0 during a succeeding period. In other words, the leading period detection flag HD is a signal set to 1 only during a certain period beginning at the leading time point of a consecutive relevant sounds interval.

Thus, the leading period detection flag HD that is set to 1 only during the certain period beginning at the leading time point of the consecutive relevant sounds interval is obtained from the leading consecutive relevant sounds period detection block 35. The leading period detection flag HD is fed to the mean level production block 36.

The mean level production block 36 detects the mean level of the sum output signal Sm using an envelope signal sent from the envelope detection block 31 during the consecutive relevant sounds interval that is an interval during which the consecutive relevant sounds interval detection flag SLFG is set to 1.

In the mean level detection to be performed by the mean level production block 36, during the certain period that begins at the leading time point of a consecutive relevant sounds interval and that is indicated by the leading period detection flag HD, the time constant for mean level detection is set to a small value so that the mean level production block 36 can quickly follow a change in the mean level of the sum output signal Sm. During the period other than the certain period beginning at the leading time point of the consecutive relevant sounds interval, the time constant of the mean level production block 36 for mean level detection is set to a large value for fear the mean level production block 36 may follow a minute variation in an audio signal.

The mean level production block 36 holds a mean level, which is detected during the preceding consecutive relevant sounds interval, during a time between the preceding and succeeding consecutive relevant sounds intervals (a silent interval).

[Example of the Configuration of the Mean Level Production Block 36]

Figure 8:
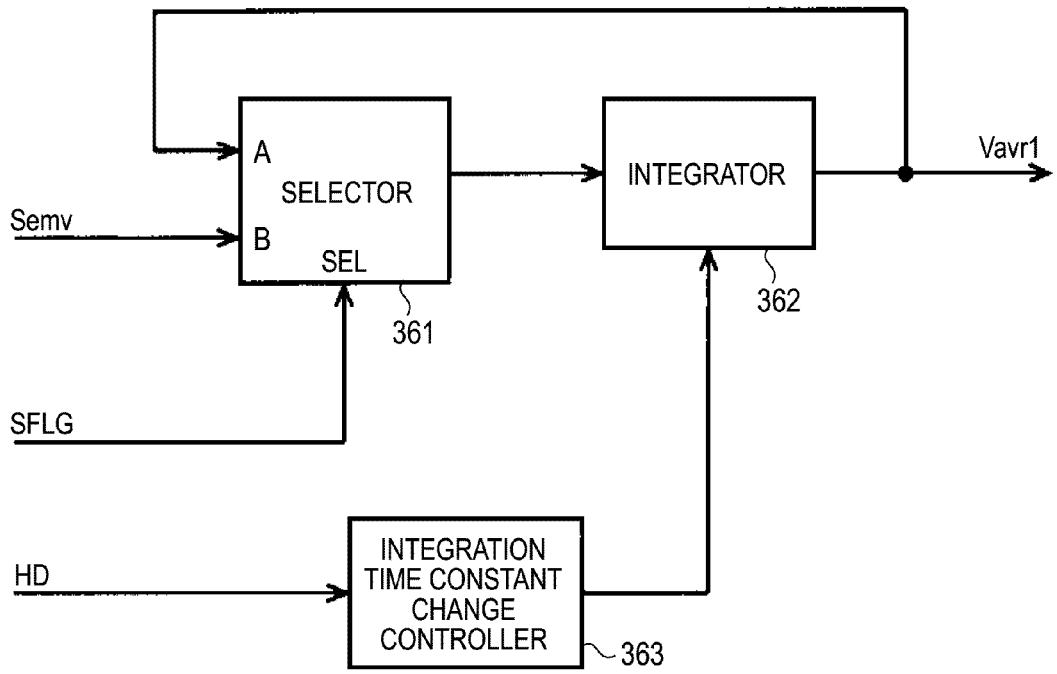
FIG. 8 is a block diagram for use in explaining an example of the configuration of a mean level production block employed in the embodiment shown in FIG. 1.

FIG. 8 shows an example of the configuration of the mean level production block 36 that performs the foregoing processing actions. Namely, the mean level production block 36 employed in the present embodiment includes a selector 361, an integrator 362, and an integration time constant change controller 363.

The envelope signal Semv sent from the envelope detection block 33 is fed to one of the input terminals of the selector 351, and the consecutive relevant sounds interval detection flag SFLG is fed as a selection signal to the selector 361. An output signal of the selector 361 is fed to the integrator 362. An output signal of the integrator 362 is fed to the other input terminal of the selector 361, and is outputted as an output signal Vavr1 of the mean level production block 36. The integrator 362 adds an input signal to a result of integration so as to obtain the integral of the input signal, and thus detects the mean level of the input signal. In this case, an integral output of the integrator 362 will not exceed the level of the input signal whether the integral output increases or decreases. An arithmetic expression of integration to be performed by the integrator 362 is presented below.

$$Y_t = 1/N(Y_{(t-1)} \times (N-1) + X_t) \quad (1)$$
$$= Y_{(t-1)} \times (N-1)/N + X_t \times 1/N$$

where $Y_t$ denotes an integral output for a current sample $X_t$, $Y_{(t-1)}$ denotes an immediately preceding integral output, $X_t$ denotes an input sample. The suffix t denotes a sample number assigned to each of input samples that are sequentially inputted.

In the expression (1), when the immediately preceding integral output $Y_{(t-1)}$ and input sample $X_t$ have the same value, $Y_t = Y_{(t-1)}$ is established. Namely, the result of integration will not exceed the input sample value whether the result of integration increases or decreases.

In the expression (1), N denotes a time constant for integration. The time constant for integration N is an example of the time constant for mean level detection employed in the present embodiment. In this case, when the time constant for integration N is large, an adverse effect of a new input sample on the result of the previous integration is limited. The integration proceeds moderately. This means that a minute change in the input signal is not followed.

If the time constant for integration N is small, a new input sample largely affects a result of integration. Integration therefore proceeds quickly, and an integral output is quickly reflected on a change in the input signal.

In the example shown in FIG. 8, the time constant for integration of the integrator 362 is changed or controlled with a control signal sent from the integration time constant change controller 363. Specifically, the leading period detection flag HD is fed to the integration time constant change controller 363. During the certain period which begins at the leading time point of a consecutive relevant sounds interval and during which the leading period detection flag HD is set to 1, the time constant for integration of the integrator 362 is set to a small value, for example, N=100.

During the period succeeding the certain period which begins at the leading time point of the consecutive relevant sounds interval and during which the leading period detection flag HD is reset to 0, the integration time constant change controller 363 sets the time constant for integration of the integrator 362 to a large value, for example, N=1000.

Based on the consecutive relevant sounds interval detection flag SFLG, the selector 361 selects the envelope signal Semv sent from the envelope detection block 33 during the consecutive relevant sounds interval, and feeds the signal to the integrator 362.

During the consecutive relevant sounds interval, the integrator 362 integrates the envelope signal Semv sent from the envelope detection block 33, and produces a signal representing the mean level of the envelope signal.

In this case, during the certain period beginning at the leading time point of the consecutive relevant sounds interval, since the time constant for integration is small, the integrator 362 performs integration so that the output of the integrator will quickly reach the level of the envelope signal Semv. During the period succeeding the certain period that begins at the leading time point of the consecutive relevant sounds interval, since the time constant for integration is large, the integrator 362 performs integration so that the output of the integrator will moderately reach the level of the envelope signal Semv.

During an interval other than the consecutive relevant sounds interval, the selector 361 selects an output signal of the integrator 362 and feeds it to the integrator 362. Therefore, during the interval other than the consecutive relevant sounds interval, the integrator 362 sustains (holds) the level of the output signal thereof.

As mentioned above, the integrator 362 provides the mean level output Vavr1 that represents the mean level attained during the discrete consecutive relevant sounds interval.

Next, referring to FIG. 9, processing actions to be performed in the mean level detection unit 22 will be described below.

Figure 9:
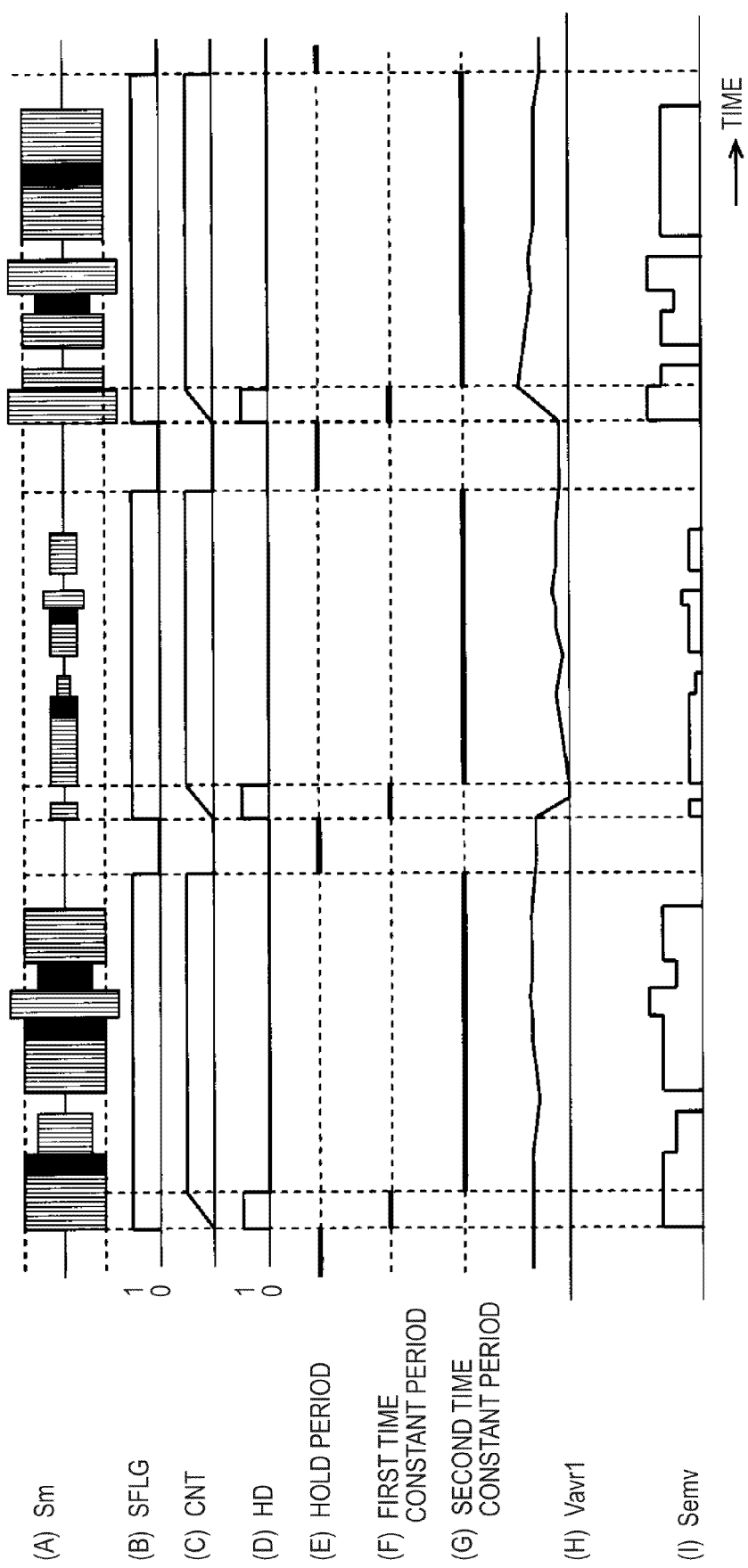
FIG. 9 is a diagram showing a timing chart for use in explaining the volume correction device in accordance with the first embodiment of the present invention.

Assume that the sum output signal Sm sent from the amplifier 32 is, for example, a wave shown in part (A) of FIG. 9. The envelope signal Semv sent from the envelope detection block 33 is a wave shown in part (I) of FIG. 9.

In the sum output signal Sm shown in part (A) of FIG. 9, temporally adjoining audio signal present intervals are detected by the consecutive relevant sounds interval detection block 34. The consecutive relevant sounds interval detection flag SFLG shown in part (B) of FIG. 9 is therefore produced.

When the consecutive relevant sounds interval begins, the counter 351 included in the leading consecutive relevant sounds period detection block 35 initiates counting of the number of times by which the cycle of the clock signal CLK is repeated. The count value CNT gradually increases as shown in part (C) of FIG. 9. The leading consecutive relevant sounds period detection block 35 detects the certain period beginning at the leading time point of the consecutive relevant sounds interval and ending at a time point at which the count value CNT reaches a threshold count value, and outputs the leading period detection flag HD that indicates the certain period as shown in part (D) of FIG. 9.

The mean level production block 36 receives the envelope signal Semv sent from the envelope detection block 33, the consecutive relevant sounds interval detection flag SFLG, and the leading period detection flag HD, and performs the aforesaid integrating action.

In this case, in the mean level production block 36, a period between adjoining consecutive relevant sounds intervals that is an interval during which the consecutive relevant sounds interval flag SFLG is reset to 0 is recognized as a hold period during which the integral output of the integrator 362 is held as indicated with a bold line in part (E) of FIG. 9.

In the mean level production block 36, the leading period of the consecutive relevant sounds interval that is an interval during which the leading period detection flag HD is set to 1 is regarded as a first time constant period during which the time constant for integration of the integrator 362 is set to a small value as indicated with a bold line in part (F) of FIG. 9.

In the mean level production block 36, a period other than the leading period, which is indicated by the leading period detection flag HD, within the consecutive relevant sounds interval is regarded as a second time constant period during which the time constant for integration of the integrator 362 is set to a large value as indicated with a bold line in part (G) of FIG. 9.

The mean level production block 36 obtains a continuous mean level output Vavr1 (see part (H) of FIG. 9) as a mean level detection output representing the mean level of an audio signal attained during each of consecutive relevant sounds intervals.

The mean level output Vavr1 is fed to the gain control signal production unit 23.

The gain control signal production unit 23 compares a voice mean level signal Vavr sent from the mean level detection unit 22 with a predefined reference level, and produces a gain control signal, which nullifies the difference between the levels, as a result of the comparison.

The gain control signal produced by the gain control signal production unit 23 is fed to the variable gain amplifiers 21L and 21R. The variable gain amplifiers 21L and 21R have the gains thereof controlled based on the gain control signal so that the mean levels of the input audio signals SiL and SiR will be equal to the reference level. As a result, the gains to be given by the variable gain amplifiers 21L and 21R are controlled so that the output audio signals SoL and SoR will remain substantially constant.

The output signal Vavr of the mean level production block 36 produced as mentioned above represents the mean level of the audio signal attained during each of consecutive relevant sounds intervals. During the leading part of the consecutive relevant sounds interval, the output signal Vavr quickly follows the mean level of the input audio signal. This means that volume control is achieved in order to nullify a variation in the level of the audio signal occurring during the consecutive relevant sounds interval.

During the period succeeding the leading period of the consecutive relevant sounds interval, since the time constant for mean level detection (the time constant for integration in the foregoing example) is set to a large value, a minute variation in voice occurring during the consecutive relevant sounds interval is not followed but comfortably audible output sounds are released.

In the above description, the mean level production block 36 detects the mean level of the sum output signal Sm by integrating the envelope signal Semv sent from the envelope detection block 33. However, in the first embodiment, the envelope detection block 33 may not be included, but the mean level production block 36 may receive the sum output signal Sm and detect the mean level through integration.

Second Embodiment

The second embodiment is a variant of the foregoing first embodiment. In the first embodiment, the time constant for mean level detection employed during the leading period of a consecutive relevant sounds interval includes only one kind of time constant. In the second embodiment, the time constant for mean level detection employed during the leading period of the consecutive relevant sounds interval is varied depending on whether the mean level detected during the succeeding consecutive relevant sounds interval is higher or lower than the mean level detected during the preceding consecutive relevant sounds interval.

For example, when the level of an audio signal abruptly increases, if volume control is implemented to rapidly suppress the increase, a sound fluctuation occurs at the level change time point. There is a fear that the sound fluctuation may give an unnatural feeling. When the mean level attained during the succeeding consecutive relevant sounds interval gets higher, the time constant for mean level detection is set to a larger value than the one employed when the mean level attained during the succeeding consecutive relevant sounds interval gets lower. This is intended to slow down integration.

In contrast, when the level of an audio signal gets lower than that attained during the preceding consecutive relevant sounds interval, if the signal level is raised too quickly, a drawback occurs. In order to compensate the drawback, the relationship between the time constant for mean level detection and whether the mean level attained during the succeeding consecutive relevant sounds interval is higher or lower is a reverse relationship. In other words, when the mean level attained during the succeeding consecutive relevant sounds interval is lower, the time constant for mean level detection is made larger than the time constant for mean level detection employed when the mean level attained during the succeeding consecutive relevant sounds interval is higher.

Whether the former approach or latter approach is adopted is determined based on the contents of a broadcast program content or according to the user's likes.

An example to be described below is concerned with the former approach in which when the level of an audio signal abruptly increases, the level of an audio output is effectively held constant without any drawback.

Figure 10:
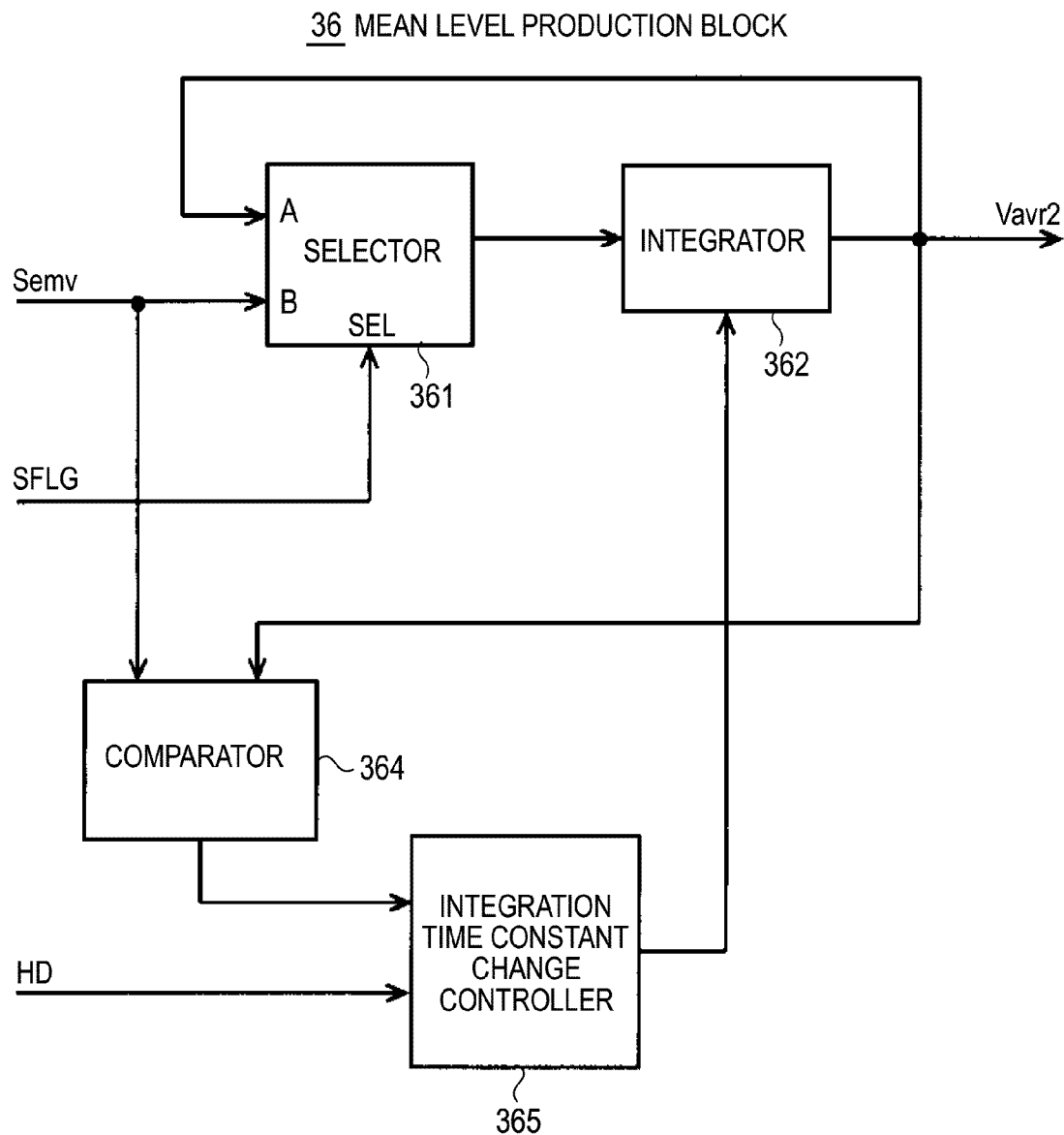
FIG. 10 is a block diagram for use in explaining an example of the configuration of a major portion of a volume correction device in accordance with a second embodiment of the present invention.

The second embodiment is different from the first embodiment only in the configuration of the mean level production block 36. FIG. 10 shows an example of the configuration of the mean level production block 36 employed in the second embodiment. In the second embodiment, the configurations of the components of the mean level detection unit 22 other than the mean level production block 36 are identical to those employed in the first embodiment.

The mean level production block 36 employed in the second embodiment includes, as shown in FIG. 10, a selector 361, an integrator 362, a comparator 364, and an integration time constant change controller 365. Since the selector 361 and integrator 362 have the same constitutions as those employed in the first embodiment and shown in FIG. 8, the same reference numerals are assigned to the selector and integrator.

In the second embodiment, the envelope signal Semv and a mean level output Vavr2 that is an integral output of the integrator 362 in this example are fed to the comparator 364. The mean level output Vavr2 that is an integral output of the integrator 362 represents the mean level attained during an immediately preceding consecutive relevant sounds interval. The envelope signal Semv is a signal representing the mean level attained during the current consecutive relevant sounds interval.

Therefore, the comparator 364 detects whether the mean level of the audio signal attained during the current consecutive relevant sounds interval is higher or lower than the mean level thereof attained during the preceding consecutive relevant sounds interval.

The comparator 364 feeds an output, which represents the result of the comparator, to the integration time constant change controller 365. The leading period detection flag HD sent from the leading consecutive relevant sounds period detection block 35 is, similarly to that in the first embodiment, also fed to the integration time constant change controller 365.

When the result-of-comparison output of the comparator 364 signifies that the current mean level is higher than the preceding one at the leading period of a consecutive relevant sounds interval, the integration time constant change controller 365 sets the time constant for integration of the integrator 362, which is employed during the leading period, to a large value. When the result-of-comparison output of the comparator 364 signifies that the current mean level is lower than the preceding one, the integration time constant change controller 365 sets the time constant for integration of the integrator 362, which is employed during the leading period, to a small value.

The other pieces of processing are identical to those performed in the first embodiment. Referring to the timing chart of FIG. 11, processing actions to be performed in the mean level detection unit 22 included in the second embodiment will be described below.

Figure 11:
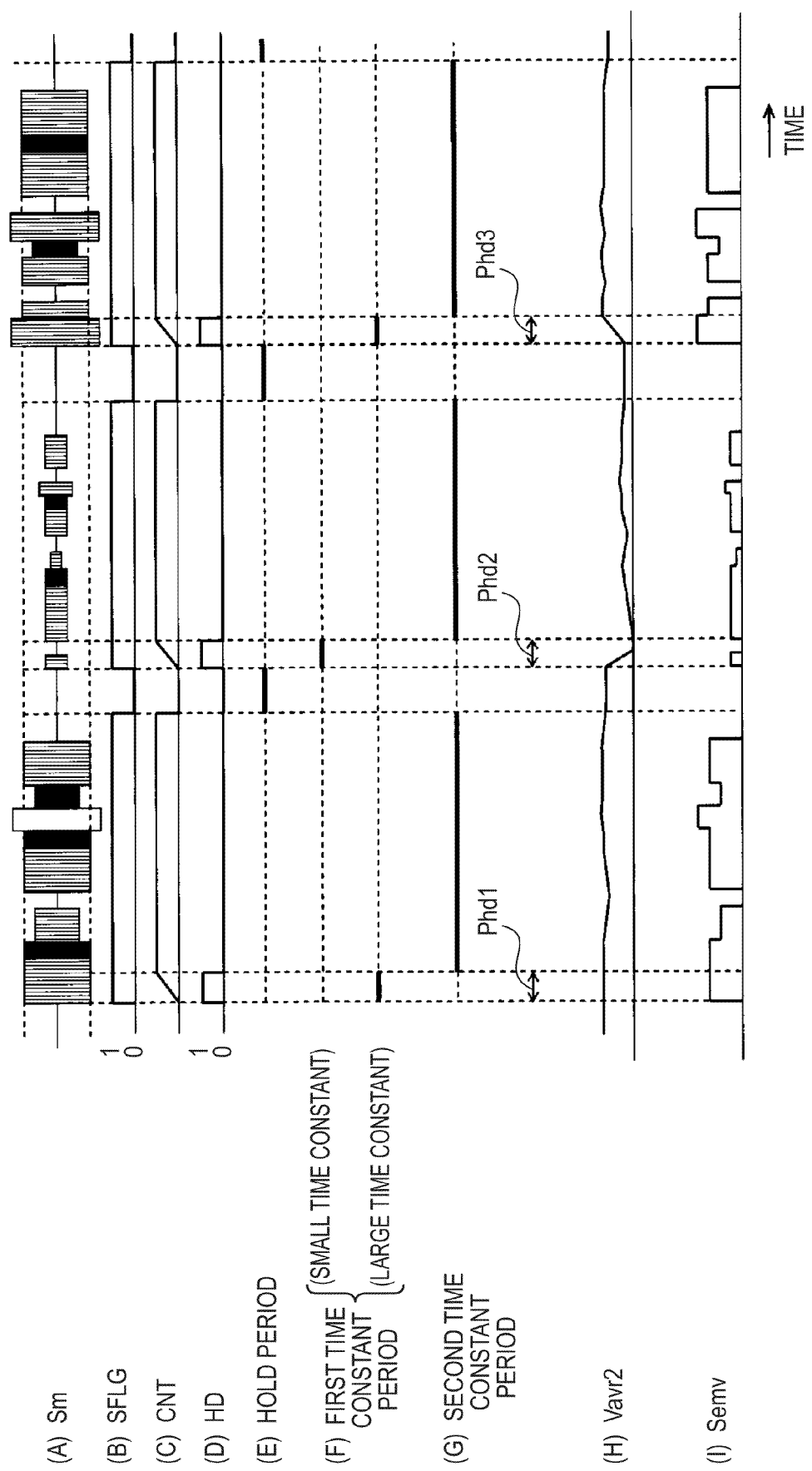
FIG. 11 is a diagram showing a timing chart for use in explaining the volume correction device in accordance with the second embodiment of the present invention.

Parts (A) to (E) of FIG. 11 are identical to parts (A) to (E) of FIG. 9 showing the signals and flags employed in the first embodiment. As shown in part (G) of FIG. 11, during the period other than the leading period of a consecutive relevant sounds interval, the time constant for mean level detection is, similarly to that in the first embodiment (see part (G) of FIG. 9), set to a larger value than the one employed during the leading period (in this example, a larger time constant for integration), for example, set to N=1000.

In the second embodiment, as shown in parts (H) and (I) of FIG. 11, the comparator 364 compares the integral output Vavr2 of the integrator 362 with the envelope signal Semv during each of the leading periods Phd1, Phd2, and Phd3 of consecutive relevant sounds intervals. Based on the result-of-comparison output, as shown in part (F) of FIG. 11, the integration time constant change controller 365 controls the time constant of the integrator 362 to be employed during the first time constant period (leading period).

Specifically, in the example shown in FIG. 11, since the integral output Vavr2 and envelope signal Semv are equal to each other during the first leading period Phd1, the comparator 364 feeds the result-of-comparison output, which signifies the fact, to the integration time constant change controller 365. The integration time constant change controller 365 in turn sets the first time constant of the integrator 362 (time constant for integration), which is employed during the leading period of the consecutive relevant sounds interval, to a large time constant that is large for a time constant employed during the leading period, for example, N=120.

During the second leading period Phd2, the envelope signal Semv representing the mean level attained during the current consecutive relevant sounds interval is lower than the integral output Vavr2 representing the mean level attained during the preceding consecutive relevant sounds interval. Therefore, the comparator 364 feeds the result-of-comparison output, which signifies the fact, to the integration time constant change controller 365. The integration time constant change controller 365 in turn sets the first time constant (time constant for integration) of the integrator 362, which is employed in the leading period of the consecutive relevant sounds interval, to a small time constant that is small for a time constant to be employed during the leading period, for example, N=80. During the second leading period Phd2, the integrator 362 performs an integrating action so that the output thereof will more quickly follow the level of the audio signal. That is, volume control is achieved to increase a small volume up to a certain level.

During the third leading period Phd3, since the level of the envelope signal Semv is higher than that of the integral output Vavr2, the comparator 364 feeds the result-of-comparison output, which signifies the fact, to the integration time constant change controller 365. The integration time constant change controller 365 in turn sets the first time constant of the integrator 362 (time constant for integration), which is employed during the leading period of the consecutive relevant sounds interval, to the large time constant that is large for the time constant employed during the leading period. Thus, volume control is implemented so that the high level of the audio signal is suppressed to a certain level without generation of a sound fluctuation at a level change time point.

According to the volume correction device of the second embodiment, volume correction can be achieved so that a level difference with respect to a preceding consecutive relevant sounds interval can be quickly compensated, and a fluctuation derived from a change in the level of an audio signal can be suppressed.

Third Embodiment

For example, when it comes to a television broadcast or a movie content recorded in a recording medium, an audio signal represents numerous kinds of sounds including human voice, background music (BGM), and sound effects. When a user uses a remote control or the like to manually control a volume, the level of the audio signal is often adjusted with a signal level of a component of the audio signal, which represents the human voice, as a reference so that lines will be properly audible.

The aforesaid volume correction method is a method of achieving volume control by monitoring the level of an entire audio signal. For example, when volume control is implemented based on an AGC method with the mean level of the audio signal as a reference, volume control is performed on the entire audio signal so that a loud sound will not be released or an inaudible small-volume sound will be audible.

However, when the volume of human voice is intently heard, the volume of human voice is not typically retained at a certain level. Lines may not be said to be comfortably audible.

In the third embodiment to be described below, human voice represented by a component of an audio signal is noted, and the mean level of the signal component is obtained in order to make lines or the like comfortably audible.

Figure 12:
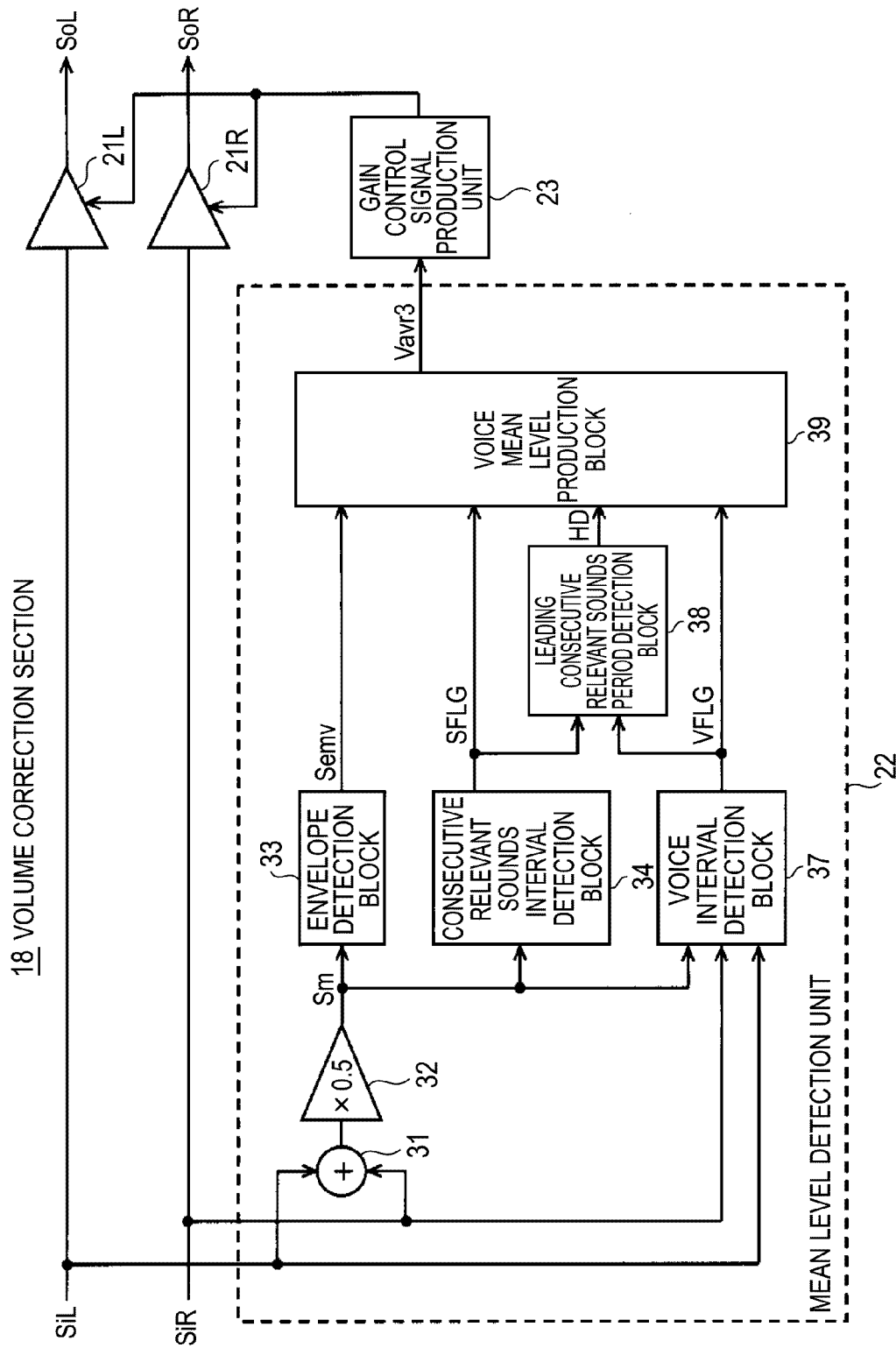
FIG. 12 is a block diagram for use in explaining an example of the configuration of a volume correction device in accordance with a third embodiment of the present invention.

FIG. 12 is a block diagram showing an example of the configuration of the volume control section 18 employed in the third embodiment. In FIG. 12, the same reference numerals are assigned to components identical to those of the aforesaid first embodiment. An iterative description will be omitted.

The third embodiment includes, in addition to the same components as those of the first embodiment shown in FIG. 1, a voice interval detection block 37, and substitutes a leading consecutive relevant sounds period detection block 38 for the leading consecutive relevant sounds period detection block 35 included in the first embodiment. Further, a voice mean level production block 39 is substituted for the mean level production block 36 included in the first embodiment.

The sum output signal Sm sent from the amplifier 32 is fed to both the envelope detection block 33 and consecutive relevant sounds interval detection block 34, and also fed to the voice interval detection block 37. The input audio signals SiL and SiR on the two left and right channels are fed to the voice interval detection block 37.

As described later, the voice interval detection block 37 detects a voice interval that is a time interval during which an audio signal representing human voice is contained in the sum output signal Sm sent from the amplifier 32. The voice interval detection block 37 employed in the present embodiment detects a voice interval that is a time interval during which the audio signal representing human voice is contained in each of the input audio signals SiL and SiR on the two left and right channels.

In the present embodiment, the voice interval detection block 37 detects a voice interval using a feature quantity of a human voice signal. The feature quantity of the human voice signal falls into plural kinds. The voice interval detection block 37 employed in the present embodiment detects the voice interval on the basis of each of the plural feature quantities of the human voice signal, and calculates the AND of the results of detection. Thus, the precision in the detected voice interval is upgraded.

The voice interval detection block 37 produces and outputs a voice interval detection flag VFLG indicating a detected voice interval. The voice interval detection block 37 feeds the voice interval detection flag VFLG to the leading consecutive relevant sounds period detection block 38, and also feeds it to the voice mean level production block 39.

The envelope signal Semv sent from the envelope detection block 33, the consecutive relevant sounds interval detection flag SFLG sent from the consecutive relevant sounds interval detection block 34, and the leading period detection flag HD sent from the leading consecutive relevant sounds period detection block 35 are fed to the voice mean level production block 39.

Basically, the voice mean level production block 39 performs the same actions as those performed in the first embodiment. However, the third embodiment is different from the first embodiment in a point that during the consecutive relevant sounds interval, the voice mean level production block 39 detects the mean level of a component of an audio signal occupying a voice interval detected by the voice interval detection block 37, but does not detect the mean level of the entire audio signal. Similarly to the aforesaid first embodiment, the time constant for mean level detection is changed between the certain period beginning at the leading time point of the consecutive relevant sounds interval and the succeeding period.

[Example of the Configuration of the Voice Interval Detection Block 37]

As mentioned above, the voice interval detection block 37 notes the feature quantities of a human voice signal, and detects a voice interval that is a time interval during which a signal component representing human voice is contained in the input audio signal Sm. In the present embodiment, the voice interval detection block 37 notes that the human voice signal has plural kinds of feature quantities, and detects a voice interval on the basis of each of the plural feature quantities. Based on the voice intervals that are the results of detection, the voice interval detection block 37 produces and outputs the voice interval detection flag VFLG. Thus, the precision in the detected voice interval is upgraded.

Figure 13:
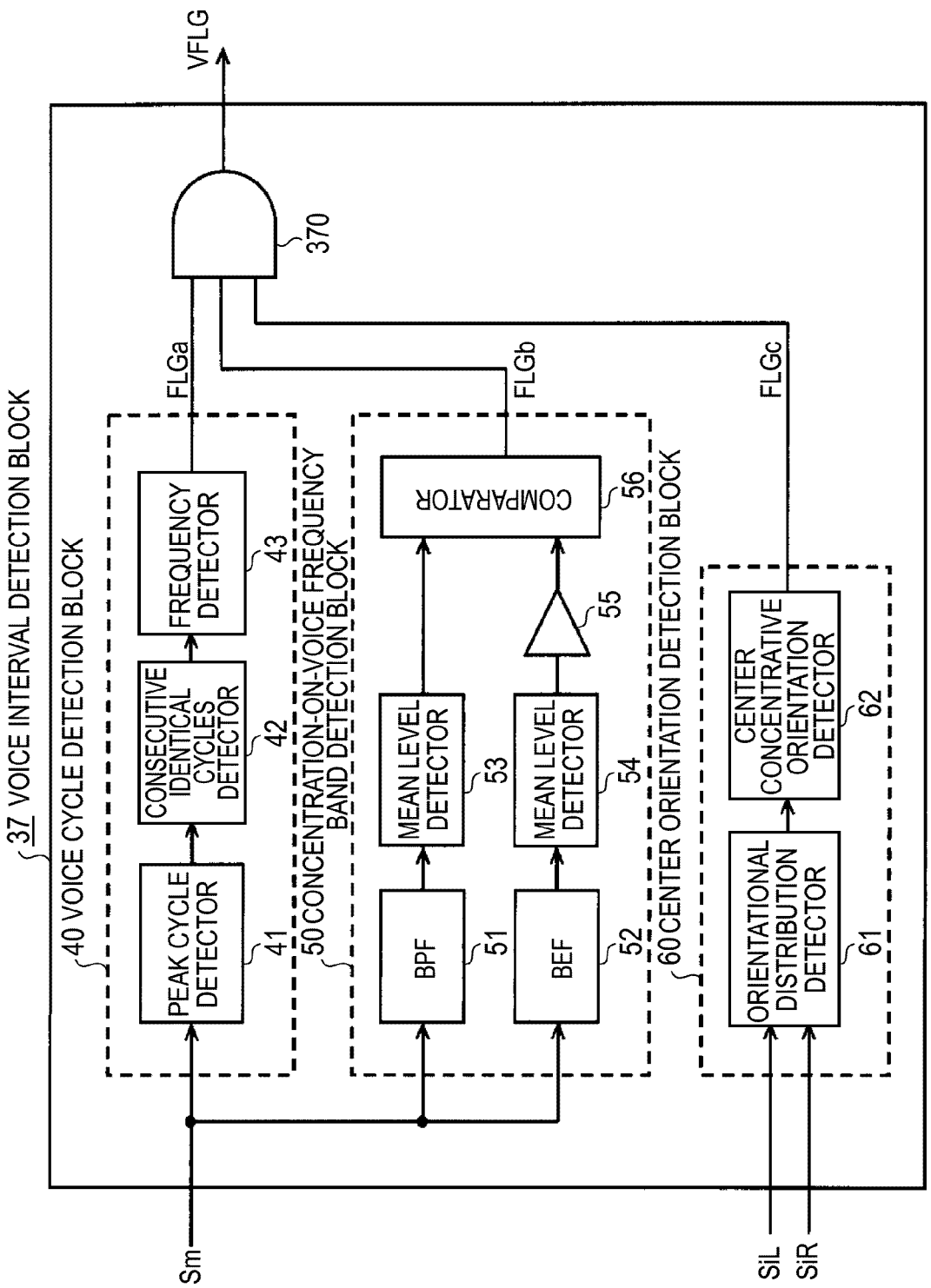
FIG. 13 is a block diagram showing an example of the detailed configuration of part of the example of the configuration of the volume correction device in accordance with the third embodiment of the present invention.

FIG. 13 is a block diagram showing an example of the configuration of the voice interval detection block 37 included in the present embodiment.

In the present embodiment, the voice interval detection block 37 includes three detection blocks of a voice cycle detection block 40, a concentration-on-voice frequency band detection block 50, and a center orientation detection block 60. Each of the three detection blocks 40, 50, and 60 detects one of the feature quantities of a human voice signal to be used to specify a voice interval. The AND of three detection outputs of the three detection blocks 40, 50, and 60 is calculated in order to improve the precision in detecting a voice interval. The three detection blocks 40, 50, and 60 will be described below.

<Voice Cycle Detection Block 40>

A human voice signal includes plural characteristic frequency components, and has a feature that it is plotted as a waveform having the peaks of a fundamental frequency component, which determines a pitch, intensified. The waveform persists during one vowel period. The peaks of the fundamental frequency component define a mountainous envelope having ridges associated with vowels, and repeatedly appear at intervals of the same cycle. Therefore, the peaks of the waveform of an input audio signal are detected, and the continuity of the cycle of the detected peaks is detected. Thus, an interval during which voice is present can be readily specified through low-load processing. That is, the continuity of the same peak cycle in a human voice signal is adopted as one feature quantity for detecting the voice interval. Thus, the voice interval can be detected.

The peak cycle is associated with a slope including gradual rises and falls. However, a difference between adjoining peak cycles is small. Therefore, when the sameness between the adjoining peak cycles is detected with a certain degree of tolerance accepted, while an adverse effect of a variation in the peak cycle is avoided, a voice interval during which human voice is present can be detected.

Accordingly, in the present embodiment, the voice cycle detection block 40 includes a peak cycle detector 41, a consecutive identical cycles detector 42, and a frequency detector 43.

The peak cycle detector 41 detects the peaks of an input audio signal Sm, and detects the cycle of the detected peaks.

The consecutive identical cycles detector 42 decides whether adjoining cycles of peaks detected by the peak cycle detector 41 are identical to each other. If the cycles of peaks are identical to each other, the identicalness in the cycle of peaks is recognized as being continuous. In this case, only when the adjoining cycles of peaks are the adjoining cycles of peaks falling within a voice frequency band, the consecutive identical cycles detector 42 decides whether the adjoining peak cycles are identical to each other. For example, when the peak cycles range from about 1 ms to about 10 ms, the sameness between the adjoining peak cycles is decided.

The frequency detector 43 prepares three or more outputs of the consecutive identical cycles detector 42 that are delayed by one peak cycle, and makes a majority decision on the plural outputs. Thus, an adverse effect derived from a variation in the peak cycle is removed. Specifically, when the peak cycle is varied, although one or plural peak cycles during which the variation time point is present may be detected as a voice interval defined with consecutive identical cycles by the consecutive identical cycles detector 42, the one or plural peak cycles may not be detected as the consecutive identical cycles. The frequency detector 43 prevents one or plural cycles from being detected to be inconsecutive so that stable detection outputs indicating consecutive identical cycles can be obtained.

Figure 14:
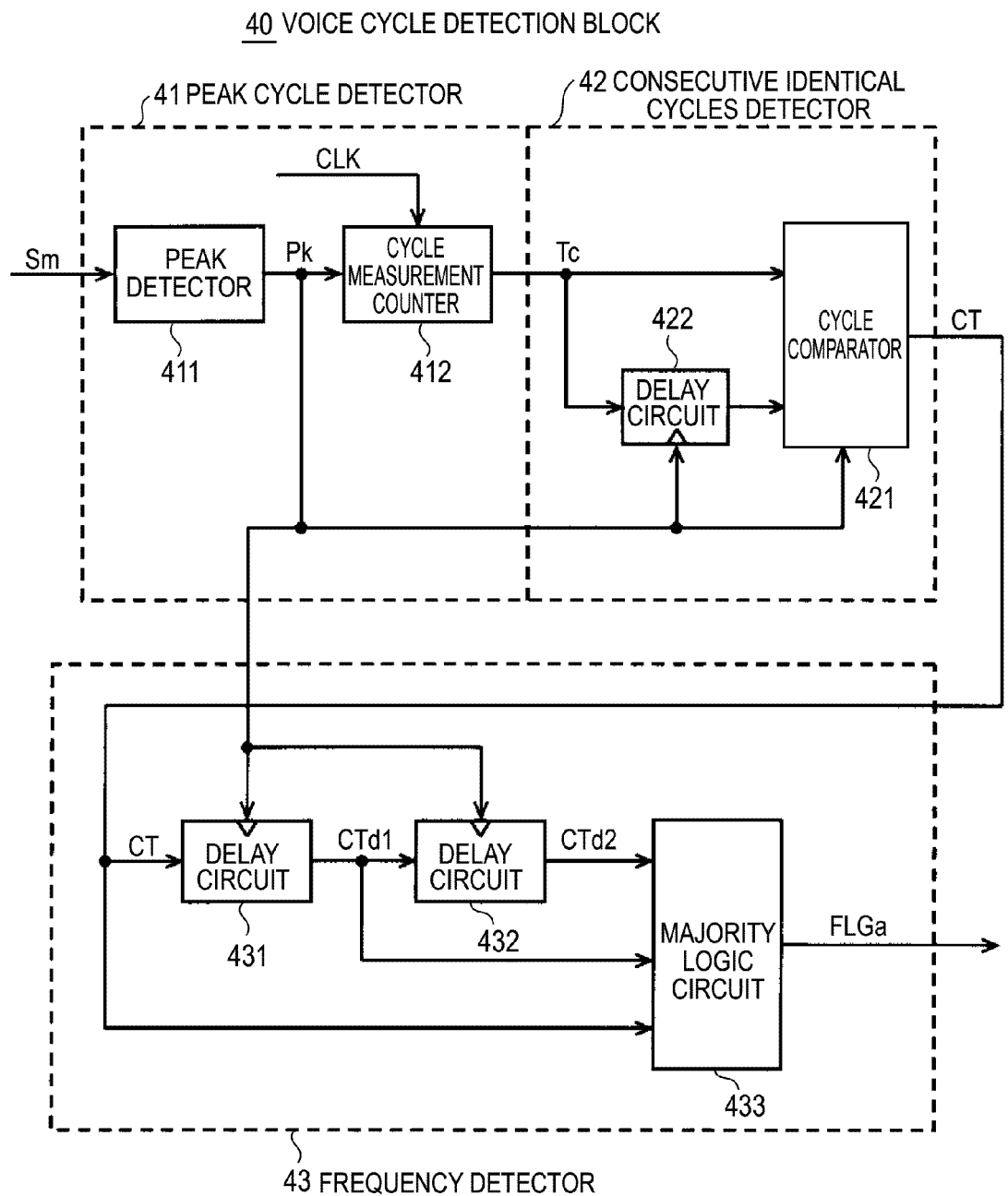
FIG. 14 is a block diagram showing an example of the detailed configuration of part of the example of the configuration of the volume correction device in accordance with the third embodiment of the present invention.

FIG. 14 is a diagram showing an example of the detailed configuration of the voice cycle detection block 40. The peak cycle detector 41 includes a peak detector 411 and a cycle measurement counter 412. The consecutive identical cycles detector 42 includes a cycle comparator 421 and a delay circuit 422.

The frequency detector 43 includes two delay circuits 431 and 432 that delay an output signal of the consecutive identical cycles detector 42 by one peak cycle, and a majority logic circuit 433.

Actions to be performed in the voice cycle detection block 40 will be described with reference to a voice waveform diagram of FIG. 15. Part (B) of FIG. 15 shows the waveform of an audio signal occupying a voice interval within the duration of a component of the sum audio signal Sm shown in part (A) of FIG. 15. In part (A) of FIG. 15, an area indicated with equidistant stripes denotes a human voice interval, and a black area denotes a non-voice interval.

The peak detector 411 included in the peak cycle detector 41 detects in this example the positive peaks of the input audio signal Sm shown in part (A) of FIG. 15, and outputs a peak detection output Pk representing the detection time points (detected positions) of the peaks (see part (C) of FIG. 15). The peak detector 411 detects as a peak, for example, a peak value exceeding a predetermined threshold.

The peak detection output Pk sent from the peak detector 411 is fed to the cycle measurement counter 412. The clock CLK whose frequency is much higher than the number of peak cycles of a human voice signal per sec is fed to the cycle measurement counter 412. The number of times by which the cycle of the clock CLK is repeated is counted during a time between adjoining detection time points represented by the peak detection output Pk, whereby a peak cycle is measured. Therefore, the cycle measurement counter 412 outputs the peak cycle as a count of the number of times by which the cycle of the clock CLK is repeated.

A count value Tc serving as a peak cycle detection output of the cycle measurement counter 412 is fed to the consecutive identical cycles detector 42.

In the consecutive identical cycles detector 42, the count value Tc that is the peak cycle detection output sent from the cycle measurement counter 412 is fed to the cycle comparator 421 as it is. After the count value Tc is delayed by the delay circuit 422, it is fed to the cycle comparator 412.

The delay circuit 422 is formed as a latch to which the peak detection output Pk is fed as a clock, delays the count value Tc, which is sent from the cycle measurement counter 412, by one peak cycle, and feeds the count value to the cycle comparator 421.

In this example, the cycle comparator 421 first checks whether the count value Tc sent from the cycle measurement counter 412 is a count value consistent with a peak cycle ranging from 1 ms to 10 ms. If the count value Tc is not the count value consistent with the peak cycle ranging from 1 ms to 10 ms, the cycle comparator 421 does not perform cycle comparison but drives in this example the output CT to a low level (0). If the count value Tc is the count value consistent with the peak cycle ranging from 1 ms to 10 ms, the cycle comparator 421 performs a comparing operation of comparing adjoining preceding and succeeding peak cycles with each other as described below.

Specifically, the cycle comparator 421 compares a count value Tcp, which is consistent with a peak cycle at a current time point and is sent from the cycle measurement counter 412, with a count value Tcb consistent with an immediately preceding peak cycle, and decides whether the peak cycles are identical to each other. Not only when the count values Tcp and Tcb consistent with the preceding and succeeding peak cycles are identical to each other but also when the difference between the count values is so small as to fall within a permissible range, or in other words, is so small that the count values may be regarded as being identical to each other, the cycle comparator 421 decides that the peak cycles are identical to each other. The difference between the count values to be permitted to decide that the count values are identical to each other is predefined based on the permissibility of precision in detecting a voice interval.

The cycle comparator 421 outputs a consecutive identical cycles detection flag CT (see part (D) of FIG. 15). If a decision is made that the count values Tcp and Tcb consistent with the preceding and succeeding peak cycles are identical to each other, the consecutive identical cycles detection flag CT is driven to a high level (1). If a decision is made that the count values Tcp and Tcb are not identical to each other, the consecutive identical cycles detection flag CT is driven to the low level (0).

The consecutive identical cycles detection flag CT is fed to the frequency detector 43. The frequency detector 43 includes, as mentioned above, in this example, the two delay circuits 431 and 432 and majority logic circuit 433.

The delay circuits 431 and 432 are in this example formed as latches to which the peak detection output Pk is fed as a clock, and delay the input signal by one peak cycle.

The delay circuit 431 receives the consecutive identical cycles detection flag CT sent from the consecutive identical cycles detector 42 as an input signal, and outputs a signal CTd1 (see part (E) of FIG. 15) produced by delaying the consecutive identical cycles detection flag Ct by one peak cycle.

The delay circuit 432 receives the output signal CTd1 sent from the delay circuit 431, and outputs a signal CTd2 (see part (F) of FIG. 15) produced by delaying the output signal CTd1 by one peak cycle.

The three signals of the consecutive identical cycles detection flag CT, one-peak cycle delayed signal CTd1, and two-peak cycles delayed signal CTd2 are fed to the majority logic circuit 433.

The majority logic circuit 433 produces and outputs a voice cycle detection flag FLGa (see part (G) of FIG. 15). When two out of the three signals CT, CTd1, and CTd2 take on the high level (1), the voice cycle detection flag FLGa is set to 1. Otherwise, the voice cycle detection flag FLGa is reset to 0.

According to the frequency detector 43, even when the consecutive identical cycles detector 42 fails to detect some peak cycles within a voice interval as consecutive identical cycles due to a variation among the peak cycles, the voice cycle detection flag FLGa representing the voice interval covering the peak cycles can be outputted.

As mentioned above, the voice cycle detection flag FLGa produced through detection performed by the voice cycle detection block 40 is fed to an AND gate 370.

In the foregoing example, the frequency detector 43 uses two delay circuits to make a majority decision on three signals that are different from one another by one peak cycle. Alternatively, the frequency detector 43 may use three or more delay circuits to make the majority decision. In this case, the majority decision may not be a simple majority decision, but a threshold may be designated and a majority decision may be made on signals exceeding the threshold. For example, four delay circuits may be used to make a majority decision on five signals that are different from one another by one peak cycle. In this case, only when not three or more signals but four or more signals represent 1, the voice interval detection flag FLGa may be set to 1.

In the foregoing example, the voice cycle detection block 40 detects the positive peaks of a voice wave. Alternatively, negative peaks may be detected. Both the positive and negative peaks may be detected, and an OR of the positive and negative peaks may be employed.

<Concentration-on-Voice Frequency Band Detection Block 50>

The frequency band within which principal components of a human voice signal representing vowels fall is often an intermediate frequency band ranging from 100 Hz to 1 kHz. Therefore, an interval during which human voice is present can be specified by detecting a period during which the signal component in the frequency band ranging from 100 Hz to 1 kHz is larger than the other components. In other words, the frequency band of the principal components of the human voice signal representing vowels may be used as a feature quantity for detecting the voice interval in order to detect the voice interval.

A signal including many frequency components representing a background noise and a bursting sound other than human voice can be excluded. In the present embodiment, a frequency band covering vowels is adopted as the frequency band of human voice. Frequency components representing consonants are excluded. This is because the signal levels representing vowels are subjectively perceived as the volume of human voice.

In the present embodiment, the concentration-on-voice frequency band detection block 50 includes, as shown in FIG. 13, a bandpass filter (BPF) 51, a band elimination filter (BEF) 52, mean level detectors 53 and 54, an amplifier 55, and a comparator 56.

Figure 16A:
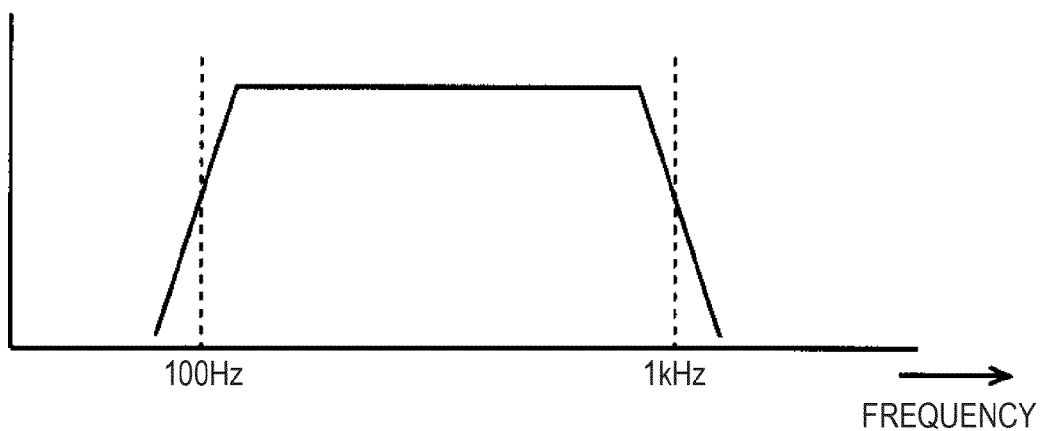
FIGS. 16A and 16B are diagrams for use in explaining part of the configuration shown in FIG. 13.
Figure 16B:
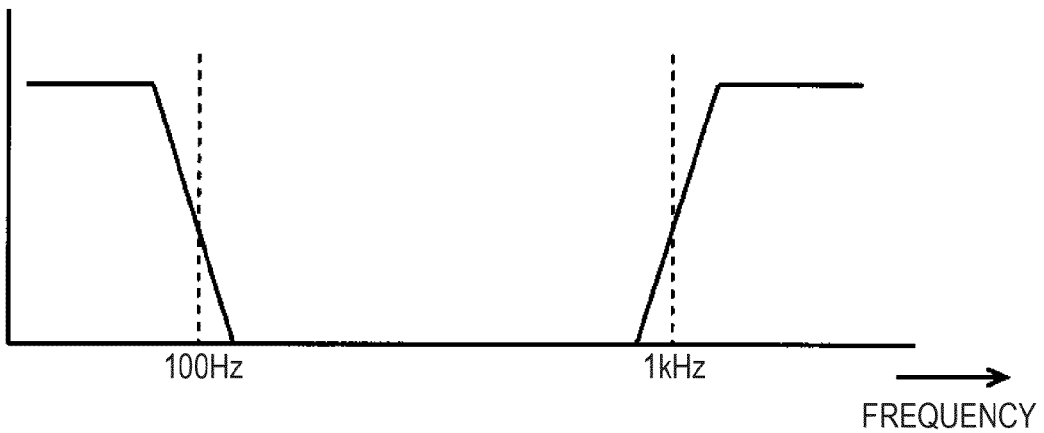

The bandpass filter 51 is, as shown in FIG. 16A, in this example, a filter having a passing property that the bandpass filter offers as a passband thereof a frequency band which ranges from 100 Hz to 1 kHz and within which human voice falls. The band elimination filter 52 is, as shown in FIG. 16B, a filter having a passing property that the band elimination filter has as a non-passband thereof the frequency band which ranges from 100 Hz to 1 kHz and within which human voice falls. Namely, the band elimination filter 52 is a filter having as a passband thereof a frequency band within which human voice does not fall.

The sum output signal Sm of the input audio signals SiL and SiR on the two left and right channels sent from the amplifier 32 is fed to both the bandpass filter 51 and band elimination filter 52.

The bandpass filter 51 samples signal components, which fall within a frequency band within which human voice falls and which is equal to or higher than 100 Hz and equal to or lower than 1 kHz, from the sum output signal Sm. The signal components are fed to the mean level detector 53. The mean level detector 53 detects the mean level of the signal components of the sum output signal Sm which fall within the frequency band equal to or higher than 100 Hz and equal to or lower than 1 kHz. A mean level signal BPFavr representing the detected mean level (see a wave drawn with a solid line in FIG. 17) is outputted from the mean level detector 53.

The band elimination filter 52 samples signal components of the sum output signal Sm, which fall within a frequency band that is equal to or lower than 100 Hz and equal to or higher than 1 kHz and that does not cover human voice, and feeds the signal components to the mean level detector 54. The mean level detector 54 detects the mean level of the signal components of the sum output signal Sm falling within the frequency band that is equal to or higher than 100 Hz and equal to or lower than 1 kHz and that does not cover human voice. A mean level signal BEFavr representing the detected mean level (see a wave drawn with a dot-dash line in FIG. 17) is outputted from the mean level detector 54.

The mean level signal BPFavr sent from the mean level detector 53 is fed to the comparator 56 as it is, while the mean level signal BEFavr sent from the mean level detector 54 is weighted by the amplifier 55 and then fed to the comparator 56. Herein, a weighting value to be given by the amplifier 55 is concerned with the precision in detecting a voice interval. In this example, the larger the weight given by the amplifier 55 is, the shorter an interval detected as the voice interval is. The weighting may be performed on the output BPFavr of the mean level detector 53.

When the mean level signal BPFavr in the frequency band covering mainly voice exceeds a level obtained by weighting the mean level signal BEFavr in the frequency band that does not cover voice, the comparator 56 sets a concentration-on-voice frequency band detection flag FLGb so as to signify that a voice frequency band-concentrated interval is detected. In this example, as shown in FIG. 17, during the detected voice frequency band-concentrated interval, the concentration-on-voice frequency band detection flag FLGb is driven to the high level (1).

As mentioned above, the concentration-on-voice frequency band detection flag FLGb provided as a result of detection by the concentration-on-voice frequency band detection block 50 is fed to the AND gate 370.

As mentioned above, the bandpass filter 51 and band elimination filter 52 are employed. However, as the pieces of means for sampling the signal in the frequency band that mainly covers human voice and the signal in the frequency band that does not cover human voice are not limited to the bandpass filter 51 and band elimination filter 52. Other filters such as a low-pass filter and a high-pass filter may be used to separate the frequency bands.

The comparator 56 may compare the signal in the frequency band that mainly covers human voice or the signal in the frequency band, which does not cover human voice, with an input signal itself. Otherwise, the difference between the signal in the frequency band that mainly covers human voice or the signal in the frequency band that does not cover human voice and the input signal may be compared with the signal in the frequency band that mainly covers human voice or the signal in the frequency band that does not cover human voice.

<Center Orientation Detection Block 60>

For example, as for contents for stereophonic radio or television broadcasting, a majority of human lines is oriented to a center channel in efforts to make the human lines comfortably audible. Therefore, during an interval during which human voice is present, an orientational distribution is concentrated on the center channel.

Therefore, in a stereophonic audio signal, an interval during which signal components are oriented to the center channel is specified. Thus, an interval during which voice is present can be specified. Specifically, components of the stereophonic audio signal oriented to the center channel are used as a feature quantity to detect a voice interval. Thus, the voice interval can be detected. When the components of the stereophonic audio signal oriented to the center channel are sampled, signal components other than a signal component that represents vocal and is oriented to the center channel, such as, music signal components that expand to the right and left channels can be excluded.

The center orientation detection block 60 includes, as shown in FIG. 13, an orientational distribution detector 61 and a center concentrative orientation detector 62. The input audio signals SiL and SiR on the two left and right channels are fed to the orientational distribution detector 61, and the orientational distribution detector 61 detects a time-sequentially changing orientational distribution of components of the input audio signals.

Information on an orientational distribution detected by the orientational distribution detector 61 is fed to the center concentrative orientation detector 62. The center concentrative orientation detector 62 detects a time interval on which components oriented to the center channel are concentrated. The center concentrative orientation detector 62 outputs a center concentrative orientation detection flag FLGc indicating a time interval on which signal components oriented to the center channel are concentrated.

Figure 18:
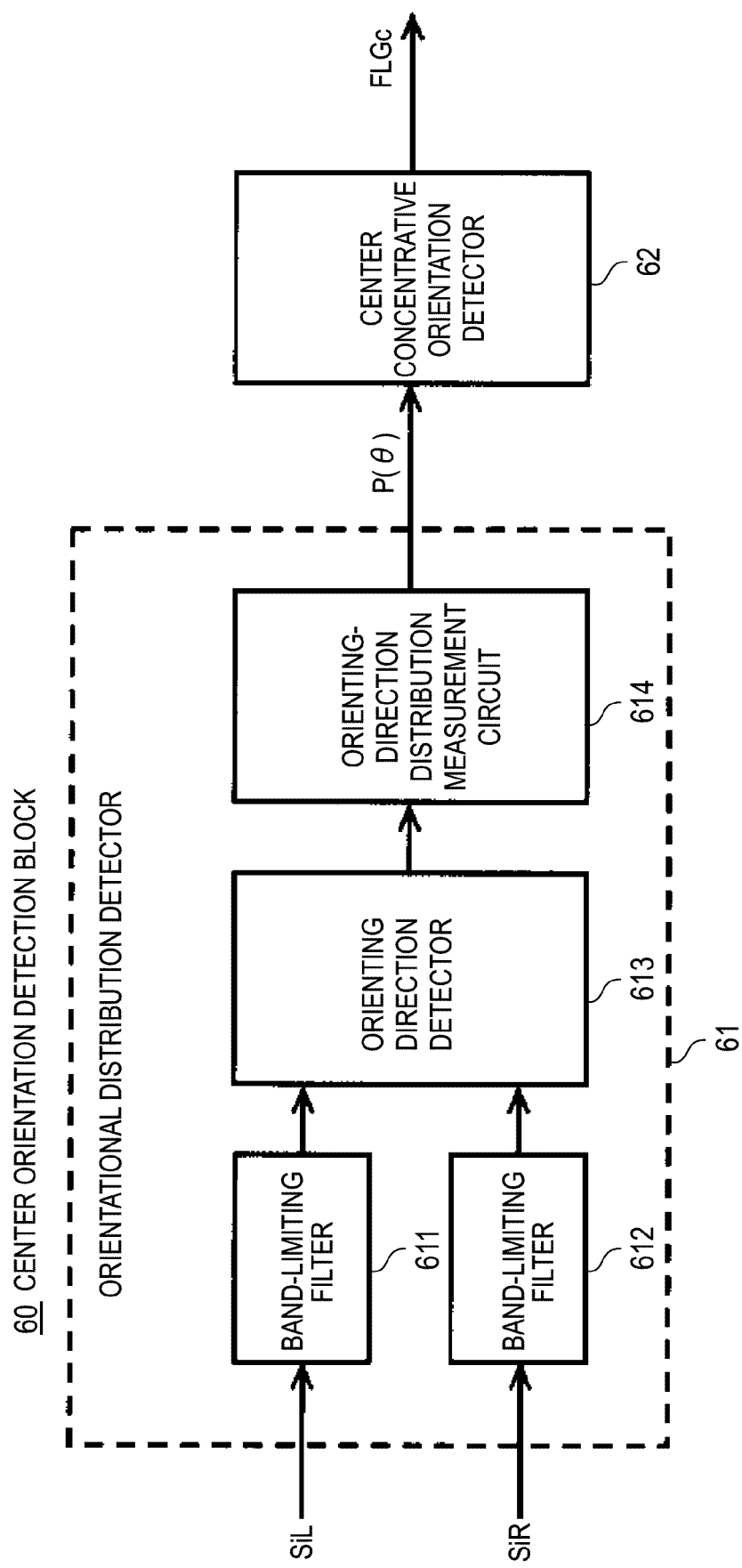
FIG. 18 is a block diagram showing an example of the detailed configuration of part of the configuration shown in FIG. 13.

The orientational distribution detector 61 includes, as shown in FIG. 18, band-limiting filters 611 and 612, an orienting direction detector 613, and an orienting-direction distribution measurement circuit 614.

The input audio signals SiL and SiR on the two left and right channels inputted to the center orientation detection block 60 have components thereof, which fall within a frequency band within which the orienting direction of the components is not particularly perceived, for example, low-frequency components thereof removed by the band-limiting filters 611 and 612.

The input audio signals SiL and SiR on the two channels having the frequency bands thereof limited by the band-limiting filters 611 and 612 are fed to the orienting direction detector 613. The orienting direction detector 613 detects the orienting directions, which are exhibited by the input audio signals SiL and SiR on the two channels at the time of detecting the orienting directions at intervals of a predetermined cycle, according to the levels of the input audio signals SiL and SiR on the two channels having the frequency bands thereof limited.

Specifically, the orienting direction detector 613 samples the levels (amplitudes) of the input audio signals SiL and SiR on the two channels, which have the frequency bands thereof limited, at intervals of a predetermined sampling cycle. In this example, the orienting direction detector 613 detects the orienting directions at the latest sampling time point as the orienting directions at a current time point.

In this case, the orienting direction detector 613 detects the orienting directions at the latest sampling time point using the levels of the input audio signals SiL and SiR obtained at the latest sampling time point, and the levels thereof obtained at the previous sampling time point.

As long as the input audio signals SiL and SiR on the two channels are digital audio signals, the sampling cycle may be equal to a sampling cycle for the digital audio signals. The sampling cycle may not be equal to one sampling cycle for the digital audio signals but may be equal to plural sampling cycles. If the input audio signals of the orienting direction detector 613 are analog signals, the signals may be converted into the digital audio signals in the input stage of the orienting direction detector 613.

Figure 19A:
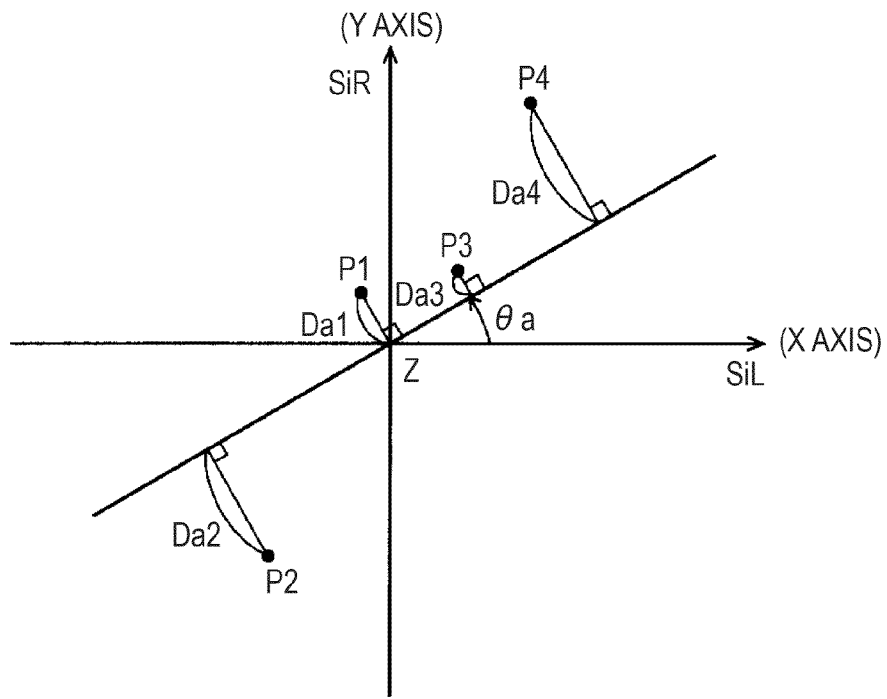
FIGS. 19A and 19B are diagrams for use in explaining the configuration shown in FIG. 18.
Figure 19B:
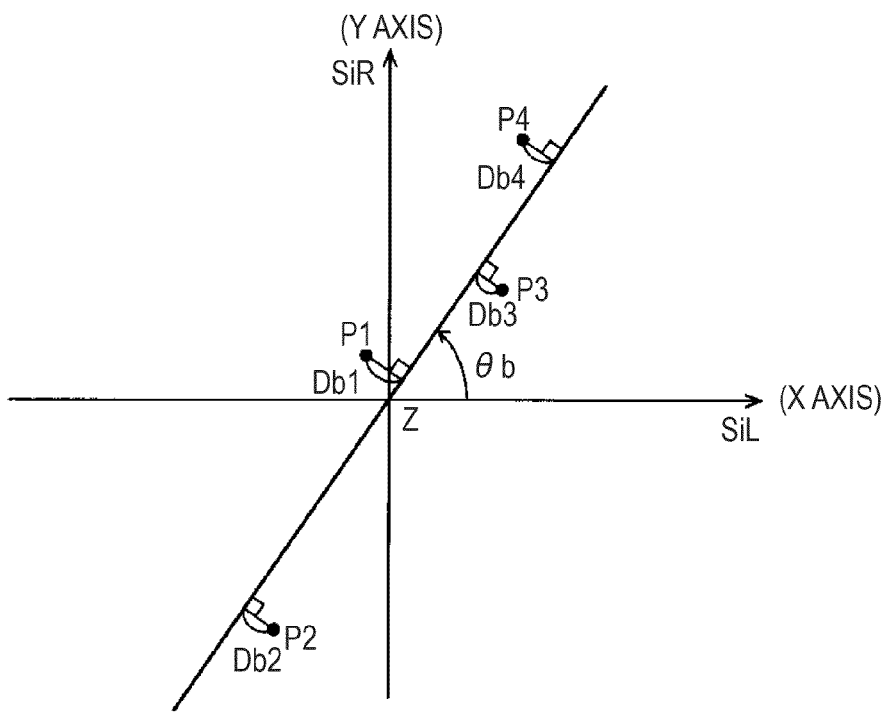

The method of detecting the orienting directions implemented in the orienting direction detector 613 will be described with reference to FIGS. 19A and 19B. FIGS. 19A and 19B show a coordinate space in which an X axis indicates values of the amplitude of the input audio signal SiL on the left channel and a Y axis indicates values of the amplitude of the input audio signal SiR on the right channel.

The orienting direction detector 613 acquires the levels of the input audio signals SiL and SiR on the two channels at time points at which the orienting directions to be detected at intervals of a sampling cycle are detected, and plots points of coordinates, which represent the levels, in the coordinate space shown in FIGS. 19A and 19B as, for example, points P1, P2, P3, and P4. In this example, the point P4 shall be the point of coordinates at the latest detection time point.

Assuming that a straight line (a straight line passing a point of intersection Z between the X and Y axes) expressed by $y = k \cdot x$ (where k denotes a constant) is turned ±90° with the point of intersection Z as a center, that is, the constant k in $y = k \cdot x$ is varied, the orienting direction detector 613 performs calculation to find along which of straight lines determined with different k values (straight lines with different slopes) the plotted points of coordinates P1, P2, P3, and P4 are lined most closely. In other words, the constant k in the equation expressing the straight line whose distances Da1, Da2, Da3, and Da4 or Db1, Db2, Db3, and Db4 to the points of coordinates P1, P2, P3, and P4 amount to the smallest value is calculated.

The orienting direction detector 613 recognizes the slope, which is indicated with the calculated constant k in the equation expressing the straight line, as an orienting direction at a current time point of detection. In the example shown in FIGS. 19A and 19B, an angle on the X axis, that is, an angle in the orienting direction to the left channel (leftward direction) is regarded as 0°, and an angle θ with respect to the X axis (hereinafter, an orientational angle) is detected as an orienting direction.

In FIG. 19A, for the points of coordinates P1, P2, P3, and P4, the orientational angle is detected as an angle θa. In FIG. 19B, for the points of coordinates P1, P2, P3, and P4, the orientational angle is detected as an angle θb.

In the present embodiment, in the orienting direction detector 613, the levels of the input audio signals on the two channels at a current time point (the latest sampling time point), and the levels of the input audio signals on the two channels at the previous sampling time point are not used with the same weights applied thereto. In the present embodiment, the orienting direction detector 613 assigns a larger weight to the levels of the input audio signals on the two channels at a sampling time point close to the current time point.

Figure 20:
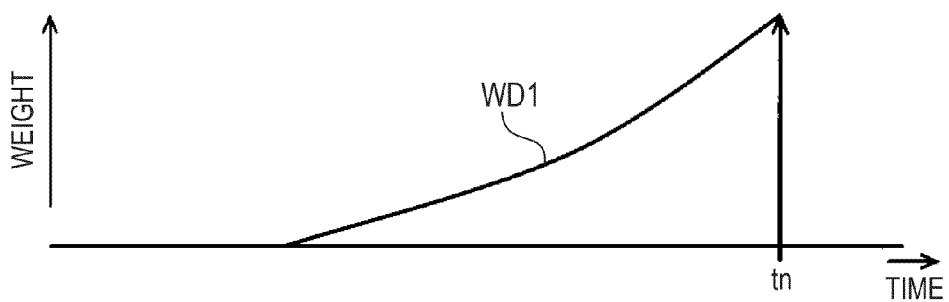
FIG. 20 is a diagram for use in explaining the configuration shown in FIG. 18.

Therefore, for the sample values of the levels of the input audio signals on the two channels, the orienting direction detector 613 uses a time window WD1, which has a characteristic expressed by an exponential curve, so that the weight will, as shown in FIG. 20, get larger at a time point closer to a current time point (in this example, the latest sampling time point tn).

In the above description, the current time point serving as an object-of-processing signal time point is regarded as the latest sampling time point (latest sample time point). Alternatively, a delay circuit that delays by a predetermined time τ may be interposed between the input terminals for the input audio signals SiL and SiR and the variable gain amplifiers 21L and 21R in order to set the current time point, at which signals that are objects of processing are reproduced, to a time point that comes by the time τ later than the time when the input audio signals SiL and SiR are reproduced.

In this case, the orienting direction detector 613 may use the input audio signals SiL and SiR on the two channels to be reproduced as a time point (in the future) succeeding the current time point that is the object-of-processing signal time point to detect orienting directions. For example, in the example shown in FIGS. 19A and 19B, the current point serving as the object-of-processing signal time point is the point P2 or P3.

Figure 21:
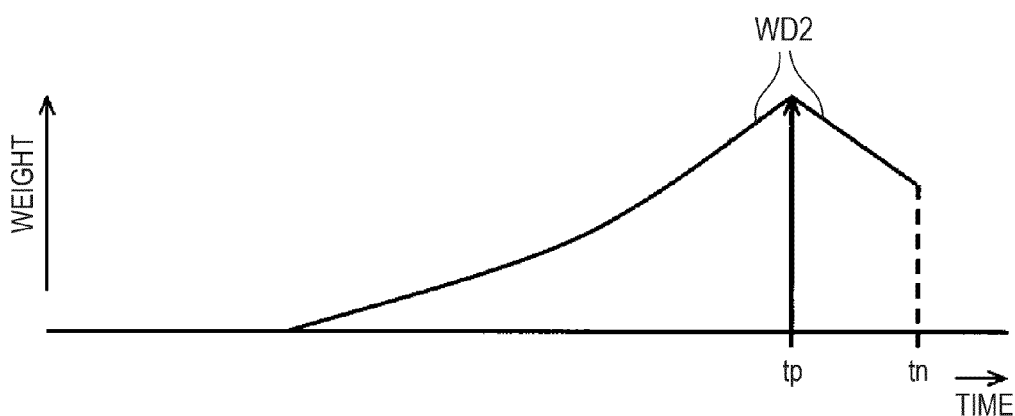
FIG. 21 is a diagram for use in explaining the configuration shown in FIG. 18.

In this case, a time window WD2 having a characteristic expressed by an exponential curve shown in FIG. 21 is substituted for the aforesaid time window WD1. The time window WD2 has the characteristic expressed by the exponential curve that indicates the largest weight in relation to the current time point tp that is the object-of-processing signal time point, and that indicates diminishing weights in a past or future direction.

The levels of the input audio signals SiL and SiR on the two channels at a sampling time point in the past or future may be used as they are without being weighted.

As mentioned above, the orienting direction detector 613 can detect the directions, in which the input audio signals SiL and SiR on the two channels are originated at a current time point, as orientational angles θ.

However, the orientational angle θ at the current time point restricts the orienting direction of an input audio signal at one time point to one direction, but does not reflect the intensities of the signal in directions. In the present embodiment, therefore, the results of detection of the orienting directions of the input audio signals SiL and SiR on the two channels at the current time point performed by the orienting direction detector 613 (orientational angles θ) are fed to the orienting-direction distribution measurement circuit 614.

The orienting-direction distribution measurement circuit 614 obtains the distribution in all azimuths of values of each of the orientational angles θ detected by the orienting direction detector 613 over a predetermined time interval d, and measures ratios at which the values of the orienting directions of the input audio signals on the two channels are distributed in what angular directions.

In this case, the predetermined time interval d ranges, for example, several milliseconds to several hundreds of milliseconds, and is, in this example, set to several tens of milliseconds. In the present embodiment, the orienting-direction distribution measurement circuit 614 weights the values of the orientational angles θ detected by the orienting direction detector 613 over the predetermined time interval d in the same manner as the manner signified by the characteristic expressed by the weighting coefficient employed by the orienting direction detector 613.

Figure 22:
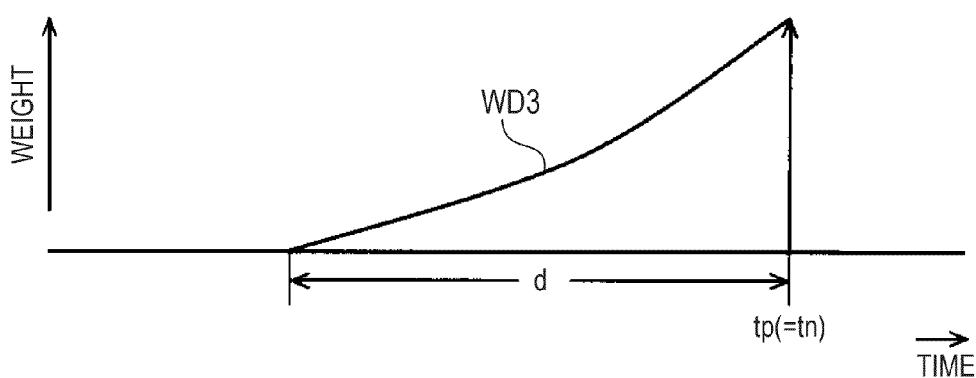
FIG. 22 is a diagram for use in explaining the configuration shown in FIG. 18.

Specifically, the orienting-direction distribution measurement circuit 614 uses a time window WD3 (see FIG. 22), according to which weighting is performed so that an orientational angle will exponentially get larger at a time point closer to a current time point tp (in this example, tp=tn (latest sampling time point)).

As mentioned above, when the delay time τ is given to input audio signals and the time window shown in FIG. 21 is adopted as a time window according to which weighting is performed by the orienting direction detector 613, the time window similar to the one shown in FIG. 21 is also adopted as a time window for the orienting-direction distribution measurement circuit 614. In this case, the time interval d is a time interval covering both the future and past of the current time point tp. Incidentally, the values of the orientational angle may be used as they are without being weighted.

Figure 23:
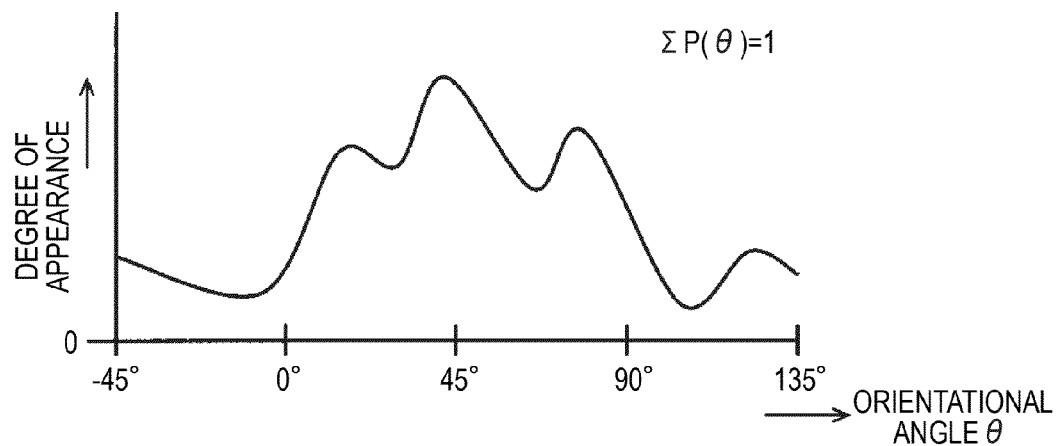
FIG. 23 is a diagram for use in explaining the configuration shown in FIG. 18.

FIG. 23 shows an example of an orienting-direction distribution P (θ) that is a distribution of values of the orientational angle θ obtained by the orienting-direction distribution measurement circuit 614. The axis of abscissas indicates values of the orientational angle θ obtained with the X axis (the orienting direction to the left channel) regarded as a reference, and the axis of ordinates indicates values of a degree of appearance (<1) of the values of the orientational angle. In the present embodiment, the orienting-direction distribution P (θ) is produced so that the sum of all the values of the orientational angle θ will be 1.

$$\Sigma P(\theta) = 1$$

Figure 24:
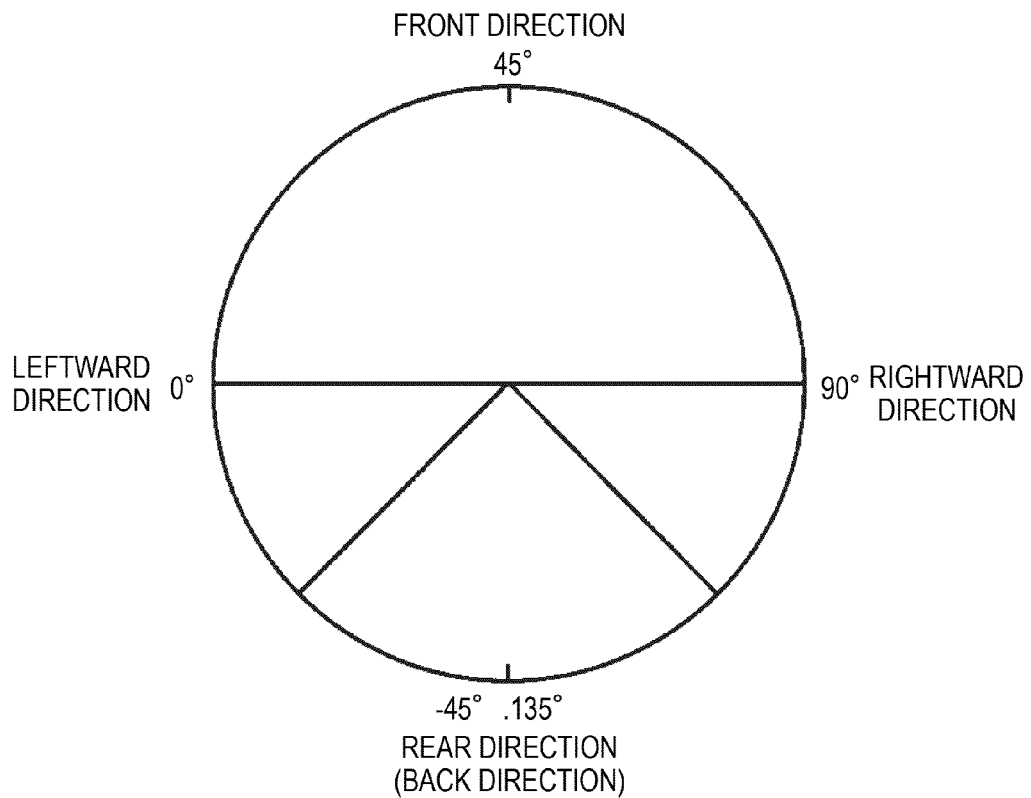
FIG. 24 is a diagram for use in explaining the configuration shown in FIG. 18.

FIG. 24 shows the relationship between the orientational angle θ and the orienting direction of an audio signal. A front direction, a leftward direction, and a rightward direction indicated in FIG. 24 are directions with respect to a listener.

As mentioned above, the orienting-direction distribution measurement circuit 614 provides information on the orienting-direction distribution P (θ) shown in FIG. 23 in relation to a current time point (a current sampling time point or current sample time point that is an object-of-processing signal time point).

The information on the orienting-direction distribution P(θ) is fed to the center concentrative orientation detector 62. The center concentrative orientation detector 62 calculates a center concentrative orientation signal by weighting the orienting-direction distribution P(θ), which is calculated by the orientational distribution detector 61, mainly in the direction to the center channel.

Figure 25:
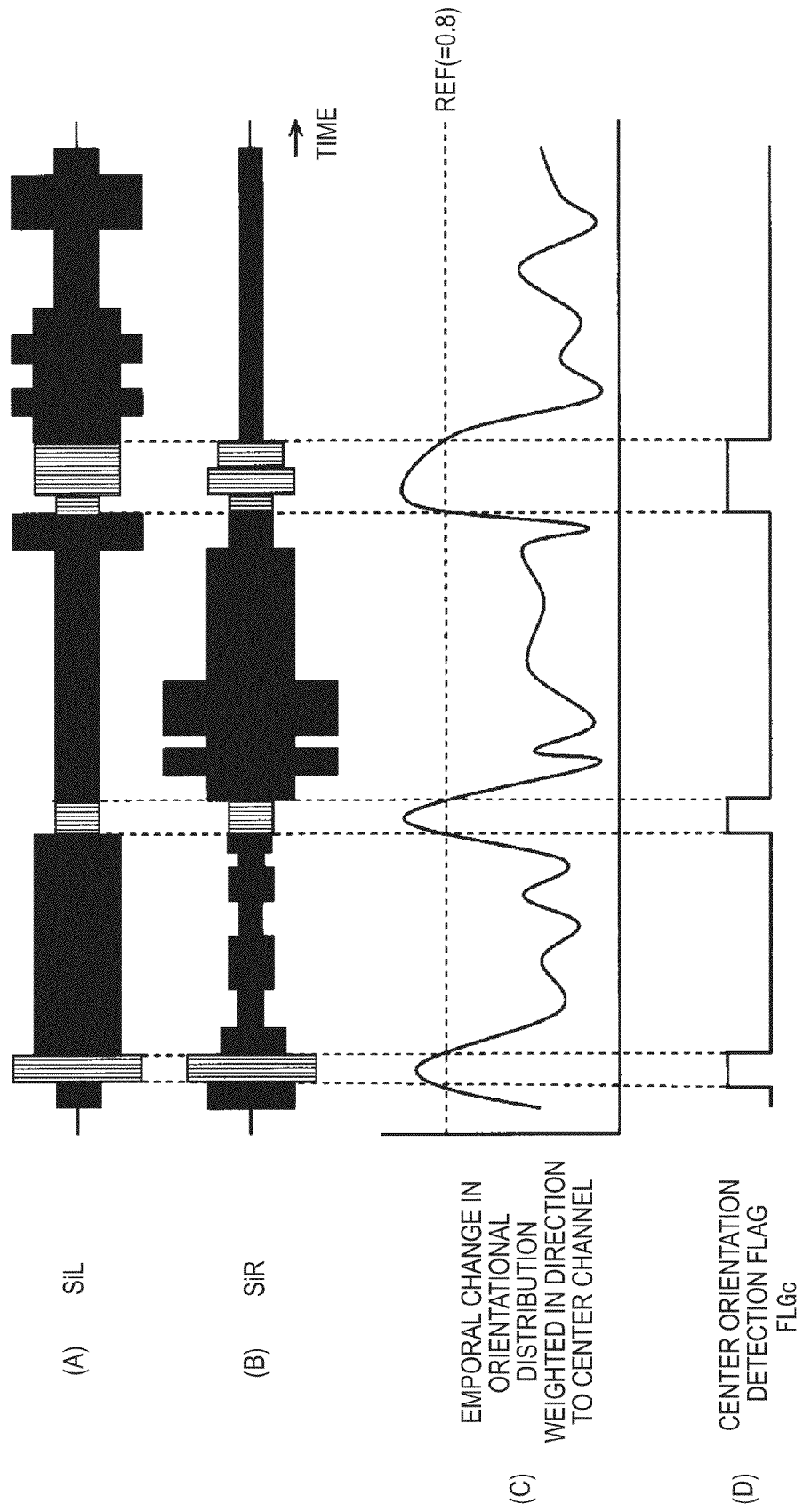
FIG. 25 is a waveform diagram for use in explaining processing actions to be performed in the configuration shown in FIG. 18.

Assume that the audio signal SiL on the left channel and the audio signal SiR on the right channel are signals shown in parts (A) and (B) of FIG. 25. In the parts (A) and (B) of FIG. 25, areas having equidistant stripes drawn therein denote intervals during which a human voice component oriented to the center channel is present. The other black area denotes intervals during which a signal component other than the human voice component is present.

In the example shown in FIG. 25, a center concentrative orientation signal calculated by the center concentrative orientation detector 62 is a wave shown in part (C) of FIG. 25.

The center concentrative orientation detector 62 compares the calculated value of the center concentrative orientation signal with a predefined reference value REF, and detects an interval, during which the value of the center concentrative orientation signal exceeds the reference value REF, as a center orientation detection interval. In the example shown in FIG. 25, the reference value REF is set to 0.8 (80%). The center concentrative orientation detector 62 outputs a center orientation detection flag FLGc indicating the detected center orientation detection interval.

The center orientation detection flag FLGc produced by the center orientation detector 62 is fed to the AND gate 370.

As a technique of detecting a voice interval by calculating the center concentrative orientation signal is not limited to the technique employing the orientational distribution detector 61 and center concentrative orientation detector 62. For example, simply, the center concentrative orientation signal may be extracted as the sum of the audio signals SiL and SiR on the two channels, and an interval during which the extracted center concentrative orientation signal exceeds a predetermined reference value may be detected as a voice interval.

<Production of a Voice Interval Detection Flag VFLG>

The AND gate 370 outputs a voice interval detection flag VFLG as a signal representing the AND of the voice cycle detection flag FLGa sent from the voice cycle detection block 40, the concentration-on-voice frequency band detection flag FLGb sent from the concentration-on-voice frequency band detection block 50, and the center orientation detection flag FLGc sent from the center orientation detection block 60.

The voice cycle detection flag FLGa, concentration-on-voice frequency band detection flag FLGb, and center orientation detection flag FLGc are flags each indicating the presence of a feature quantity for use in detecting a voice interval. The AND gate 370 calculates the AND of the three flags FLGa, FLGb, and FLGc so as to produce a voice interval detection flag VFLG that is a detection output indicating a human voice interval. Therefore, the precision in detecting the voice interval is improved.

[Example of the Configuration of the Leading Consecutive Relevant Sounds Period Detection Block 38]

Figure 26:
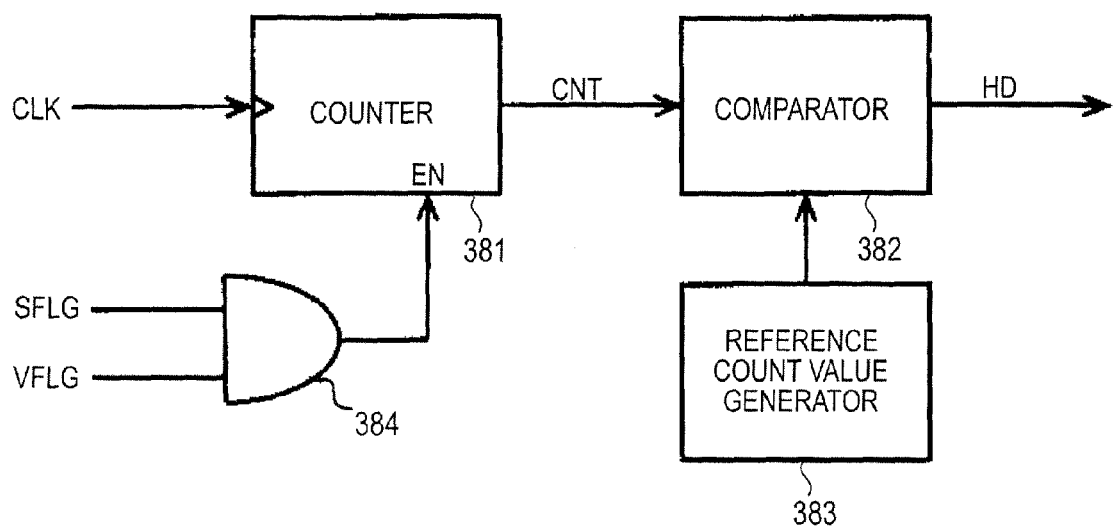
FIG. 26 is a block diagram for use in explaining an example of the configuration of a leading consecutive relevant sounds period detection block employed in the third embodiment of the present invention.

The leading consecutive relevant sounds period detection block 38 has, in the present embodiment, a configuration shown in FIG. 26.

The leading consecutive relevant sounds period detection block 38 includes a counter 381, a comparator 382, a reference count value generator 383, and an AND gate 384. The components of the counter 381, comparator 382, and reference count value generator 383 are identical to the components of the leading consecutive relevant sounds period detection block 35 included in the first embodiment and shown in FIG. 7, that is, the counter 351, comparator 352, and reference count value generator 353. Namely, the leading consecutive relevant sounds period detection block 38 included in the third embodiment is different from the leading consecutive relevant sounds period detection block 35, which is included in the first embodiment and shown in FIG. 7, only in a point that it includes the AND gate 384.

In the third embodiment, the consecutive relevant sounds interval detection flag SFLG and voice interval detection flag VFLG are fed to the AND gate 384, and an output that is the AND of the flags is provided by the AND gate 384. The AND output of the AND gate 384 is fed to the enabling terminal EN of the counter 381.

Therefore, in the third embodiment, the counter 384 counts the number of times, by which the cycle of the clock CLK is repeated, during a consecutive relevant sounds interval and only a voice interval. Therefore, the leading period of the consecutive relevant sounds interval indicated with the leading period detection flag HD in the third embodiment is, unlike the first and second embodiment, not an invariable period but is varied depending on the voice interval within the consecutive relevant sounds interval.

Figure 28:
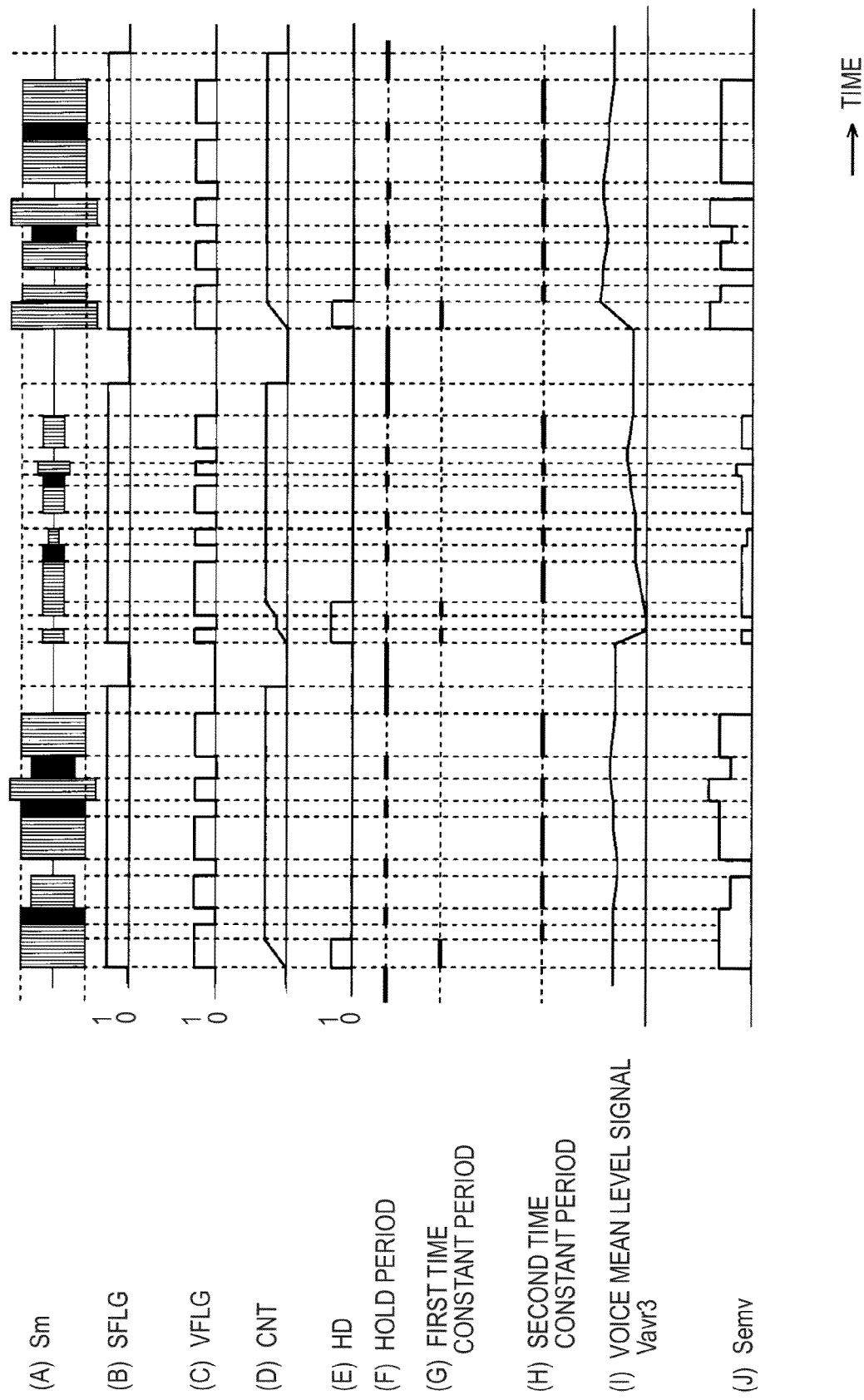
FIG. 28 is a diagram showing a timing chart for use in explaining the volume correction device in accordance with the third embodiment of the present invention.

For example, assume that the sum output signal Sm sent from the amplifier 32 is a wave shown in part (A) of FIG. 28. In part (A) of FIG. 28, an area having equidistant stripes drawn therein denotes a human voice interval, and the other black area denotes a non-voice interval.

In this case, the envelope signal Semv sent from the envelope detection block 33 is a wave shown in part (J) of FIG. 28.

Even in the sum output signal Sm shown in part (A) of FIG. 28, temporally adjoining audio signal present intervals are detected by the consecutive relevant sounds interval detection block 34. A consecutive relevant sounds interval detection flag SFLG like a wave shown in part (B) of FIG. 28 is produced.

Since a voice interval in the sum output signal Sm is detected by the voice interval detection block 37, the voice interval detection block 37 produces a voice interval detection flag VFLG like a wave shown in part (C) of FIG. 28.

When the consecutive relevant sounds interval comes, the counter 381 included in the leading consecutive relevant sounds period detection block 38 initiates counting of the number of times by which the cycle of the clock CLK is repeated. The count value CNT gradually increases as shown in part (C) of FIG. 9.

In the third embodiment, since the AND output of the AND gate 384 is fed to the enabling terminal EN of the counter 381, the counter 381 counts the number of times, by which the cycle of the clock CLK is repeated, during the consecutive relevant interval and voice interval. Therefore, the count value output CNT of the counter 381 is a wave shown in part (D) of FIG. 28.

The leading consecutive relevant sounds period detection block 38 detects a period from the leading time point of the consecutive relevant sounds interval to a time point at which the count value CNT reaches a reference count value, and outputs a leading period detection flag HD indicating the period. Therefore, the leading period detection flag HD becomes a wave shown in part (E) of FIG. 28.

[Example of the Configuration of the Voice Mean Level Production Block 39]

Figure 27:
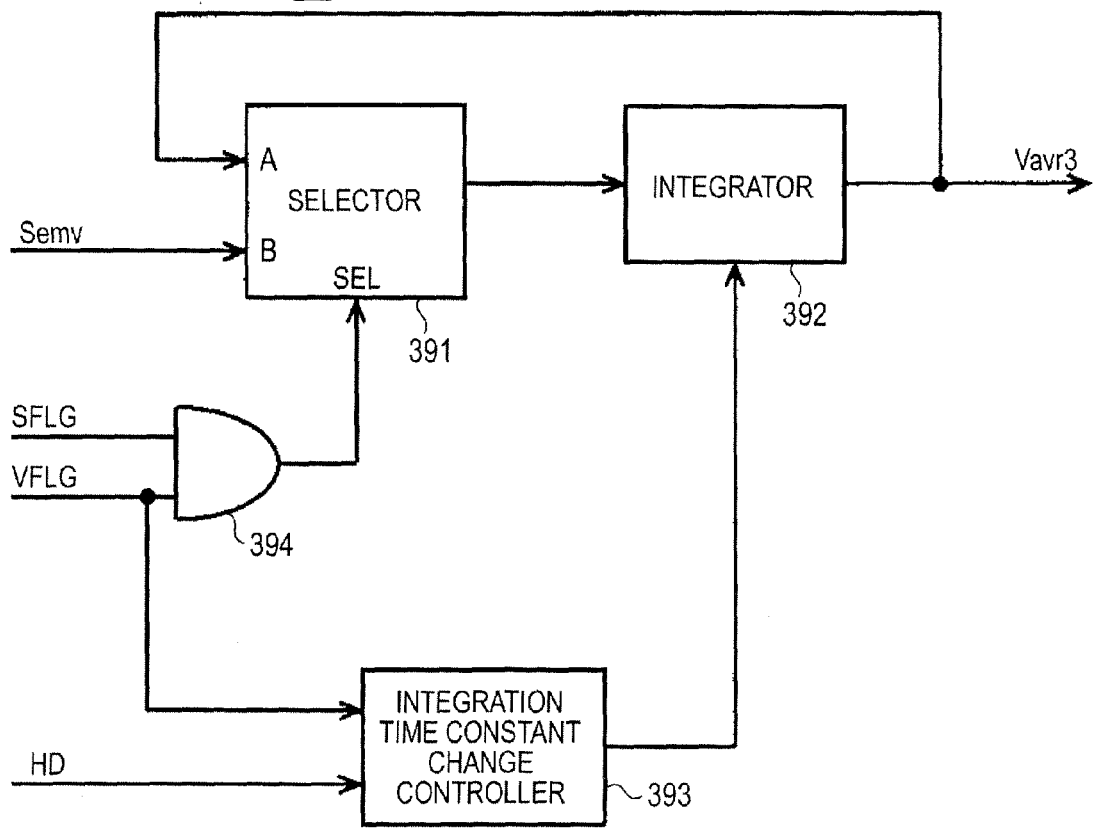
FIG. 27 is a block diagram for use in explaining an example of the configuration of a voice mean level production block employed in the third embodiment of the present invention.

The voice mean level production block 39 shall, in the present embodiment, have a configuration shown in FIG. 27. The voice mean level production block 39 includes a selector 391, an integrator 392, an integration time constant change controller 393, and an AND gate 394.

The configuration including the selector 391, integrator 392, and integration time constant change controller 393 is identical to the configuration of the mean level production block 36 that is employed in the first embodiment and shown in FIG. 8 and that includes the selector 361, integrator 362, and integration time constant change controller 363. The components perform identical processing actions.

The voice mean level production block 39 is different from the mean level production block 36 included in the first embodiment and shown in FIG. 8 in a point that the voice interval detection flag VFLG is concerned with a selecting action to be performed by the selector 391 and with the control of changing the time constant for integration that is implemented by the integration time constant change controller 393.

Specifically, the envelope signal Semv sent from the envelope detection block 33 is fed to one of the input terminals of the selector 391, and the output signal of the integrator 392 is fed to the other input terminal of the selector 391. An output of the selector 391 is fed to the integrator 392.

The consecutive relevant sounds interval detection flag SLFG and voice interval detection flag VFLG are fed to the AND gate 394. An output of the AND gate 394 is fed as a selection signal to the selector 391.

Further, in addition to the leading period detection flag HD, the voice interval detection flag VFLG is fed to the integration time constant change controller 393.

During the voice interval within the consecutive relevant sounds interval, the selector 391 selects the envelope signal Semv, which is sent from the envelope detection block 33, according to the output of the AND gate 394, and feeds the envelope signal to the integrator 392. During a period other than the voice interval within the consecutive relevant sounds interval, the selector 391 selects the output signal of the integrator 392, and feeds it to the integrator 392.

Therefore, during the voice interval within the consecutive relevant sounds interval, similarly to the aforesaid embodiments, the integrator 392 produces a signal by integrating the envelope signal Semv, which is sent from the envelope detection block 33, and averaging the integral. During the period other than the voice interval within the consecutive relevant sounds interval, the integrator 392 sustains (holds) the own output level signal.

Specifically, as indicated with a bold line in part (F) of FIG. 28, the non-consecutive relevant sounds interval during which the consecutive relevant sounds interval flag SFLG is reset to 0, and the non-voice interval during which the voice detection flag VFLG is reset to 0 are regarded as hold periods during which the integral output of the integrator 362 is held.

The time constant for integration of the integrator 392 is changed as described below by the integration time constant change controller 393.

Specifically, during a voice interval, during which the voice detection flag VFLG is set to 1, within the leading period of a consecutive relevant sounds interval during which the leading period detection flag HD is set to 1, the integration time constant change controller 393 sets the time constant for integration of the integrator 392 to a small value. For example, the time constant for integration is set to a value of N=100. In the example shown in FIG. 28, the voice interval corresponds to a first time constant period indicated with a bold line in part (G) of FIG. 28.

During a voice interval, during which the voice detection flag VFLG is set to 1, within each of periods succeeding the leading period of a consecutive relevant sounds interval, the integration time constant change controller 393 sets the time constant of the integrator 392 for integration to a large value. For example, the time constant for integration is set to a value of N=1000. In the example shown in FIG. 28, the voice interval corresponds to a second time constant period indicated with a bold line in part (H) of FIG. 28.

The voice mean level production block 39 produces a voice mean level signal Vavr3 like a wave shown in part (I) of FIG. 28, and feeds it to the gain control signal production unit 23.

A gain control signal produced by the gain control signal production unit 23 is fed to the variable gain amplifiers 21L and 21R. The variable gain amplifiers 21L and 21R have the gains thereof controlled based on the gain control signal so that the voice mean levels of the input audio signals SiL and SiR will be equal to a reference level.

In the example shown in FIG. 28, the voice mean level signal Vavr3 is a wave shown in part (I) of FIG. 28. The gains are controlled so that the level of the voice mean level signal Vavr3 will be equal to the reference level. As a result, the output audio signals SoL and SoR of the variable gain amplifiers 21L and 21R have the gains, which are given thereto, controlled so that the levels thereof will remain nearly constant.

As described above, according to the third embodiment, the mean level of an input audio signal attained during a voice interval indicated with the voice interval detection flag VFLG is obtained, and the gain is controlled so that the mean level will be equal to the reference level. Therefore, the level of a component of the input audio signal representing human voice or lines is controlled to remain constant. Eventually, the lines become comfortably audible.

In the aforesaid third embodiment, the voice interval detection block 37 produces the three flags FLGa, FLGb, and FLGc based on three kinds of feature quantities for use in detecting a human voice interval, and calculates the AND of the flags so as to produce the voice interval detection flag FLG that is a detection output indicating the human voice interval.

However, for simplification of pieces of processing, a flag produced based on any of the three kinds of feature quantities may be adopted as the voice interval detection flag FLG. Two out of the three kinds of feature quantities may be used in combination, and the AND of flags produced based on the two kinds of feature quantities may be calculated in order to produce the voice interval detection flag FLG.

When one of the three kinds of feature quantities or a combination of two feature quantities is employed, a selective manipulation means to be used for selection may be included. A user may use the selective manipulation means to manually select any feature quantities.

The voice interval detection block 37 may further include a silence detector that detects silence represented by an input audio signal Sm. During a silent interval detected by the silence detector, the voice interval detection flag FLG may be masked in order not to adopt the silent interval as a voice interval. In this case, a component that does not represent any intelligence or represents a background noise can be removed. Eventually, the precision in detecting the voice interval is further improved.

The feature quantities concerning a voice signal and being used to detect a voice interval are not limited to the foregoing three kinds of feature quantities. Needless to say, any other feature quantity may be adopted.

Fourth Embodiment

The fourth embodiment is a variant of the foregoing third embodiment. In the third embodiment, only one time constant is adopted as the time constant for mean level detection during the leading period of a consecutive relevant sounds interval. In contrast, in the fourth embodiment, the time constant for mean level detection to be used during the leading period of the consecutive relevant sounds interval is varied depending on whether the mean level attained during a succeeding consecutive relevant sounds interval is higher or lower than the mean level attained during a preceding consecutive relevant sounds interval.

Namely, as the second embodiment is a variant of the first embodiment, so the fourth embodiment is a variant of the third embodiment.

Figure 29:
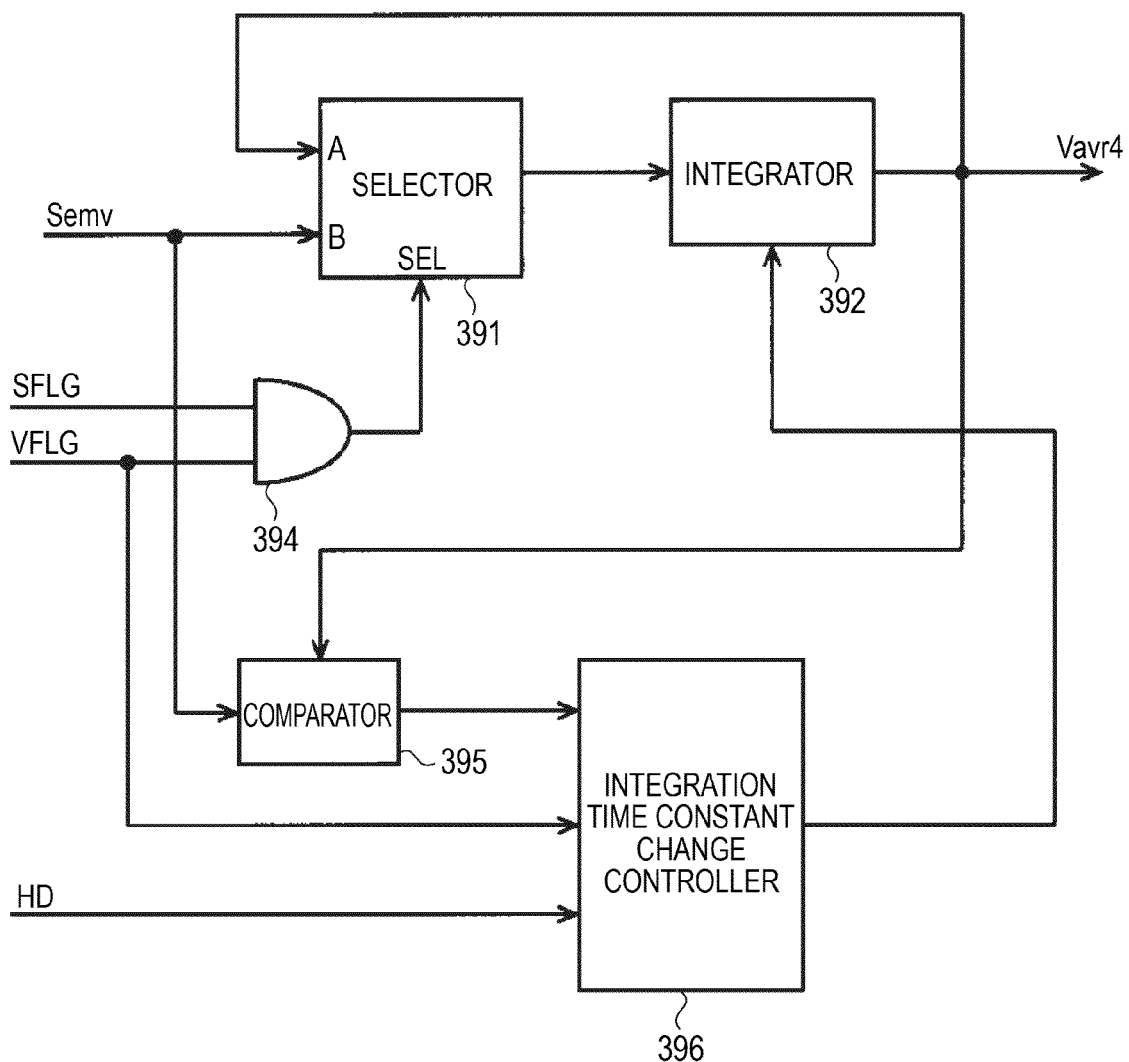
FIG. 29 is a block diagram for use in explaining an example of the configuration of a major part of a volume correction device in accordance with a fourth embodiment of the present invention.

The fourth embodiment is different from the third embodiment only in the configuration of the voice mean level production block 39. FIG. 29 shows an example of the configuration of the voice mean level production block 39 employed in the fourth embodiment. In the fourth embodiment, the configurations of the components of the mean level detection unit 22 other than the voice mean level production block 39 are identical to those in the third embodiment.

The voice mean level production block 39 employed in the fourth embodiment includes, as shown in FIG. 29, a selector 391, an integrator 392, an AND gate 394, a comparator 395, and an integration time constant change controller 396. Since the selector 391, integrator 392, and AND gate 394 have configurations identical to those included in the third embodiment and shown in FIG. 27, the same reference numerals are assigned to the selector, integrator, and AND gate.

In the fourth embodiment, the envelope signal Semv, and the mean level output Vavr4 that is an integral output of the integrator 392 are fed to the comparator 395. The mean level output Vavr4 that is the integral output of the integrator 392 represents a mean level attained during an immediately preceding consecutive relevant sounds interval. The envelope signal Semv is a signal representing a mean level attained during a current consecutive relevant sounds interval.

Accordingly, the comparator 395 detects whether the mean level of an audio signal attained during a current consecutive relevant sounds interval is higher or lower than the mean level of the audio signal attained during a preceding consecutive relevant sounds interval.

The comparator 395 feeds the result-of-comparison output to the integration time constant change controller 396. Similarly to that in the third embodiment, the leading period detection flag HD sent from the leading consecutive relevant sounds period detection block 35 is also fed to the integration time constant change controller 396.

In this example, if the result-of-comparison output sent from the comparator 395 signifies that the current mean level is higher than the preceding one, the integration time constant change controller 396 sets the time constant of the integrator 392 for integration, which is employed during the leading period, to a large value. If the result-of-comparison output of the comparator 364 signifies that the current mean level is lower than the preceding one, the time constant of the integrator 392 for integration to be employed during the leading period is set to a small value.

The other pieces of processing are identical to those performed in the third embodiment. Referring to the timing chart of FIG. 30, the processing actions to be performed in the mean level detection unit 22 included in the fourth embodiment will be described below.

Figure 30:
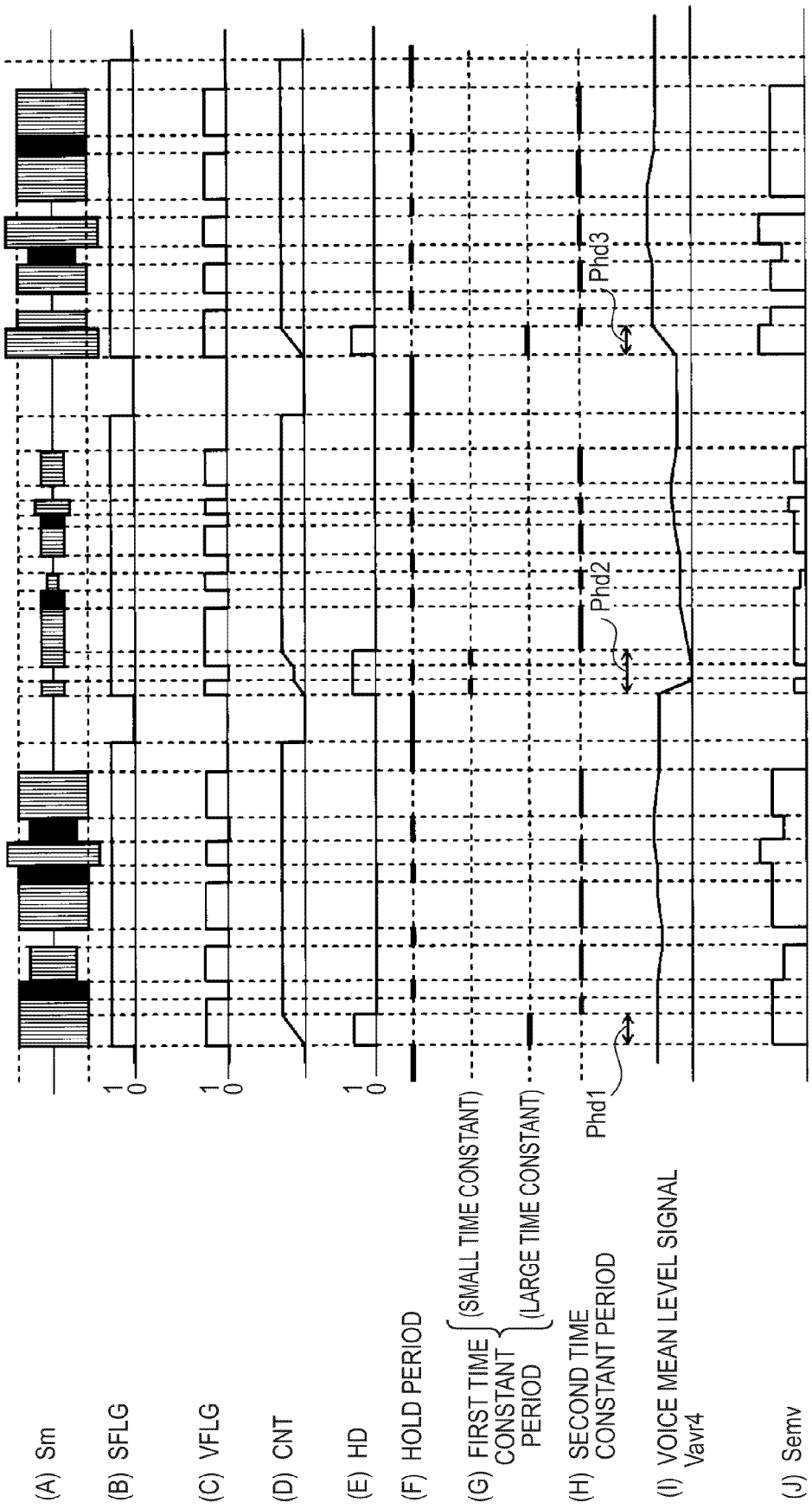
FIG. 30 is a diagram showing a timing chart for use in explaining the volume correction device in accordance with the fourth embodiment of the present invention.

Parts (A) to (F) of FIG. 30 show signals and flags identical to those employed in the third embodiment and shown in parts (A) to (F) of FIG. 28. As shown in part (H) of FIG. 30, during a period other than the leading period of a consecutive relevant sounds interval, similarly to that in the third embodiment (see part (H) of FIG. 28), the time constant for mean level detection is set to a large value (in this example, a large time constant for integration), for example, set to N=1000.

In the fourth embodiment, as shown in parts (I) and (J) of FIG. 30, the comparator 395 compares the integral output Vavr4 of the integrator 392 with the envelope signal Semv during each of the leading periods Phd1, Phd2, and Phd3 of consecutive relevant sounds intervals. Based on the result-of-comparison output, as shown in part (G) of FIG. 30, the integration time constant change controller 396 controls the time constant of the integrator 392 to be employed during a first time constant period (leading period).

Specifically, in the example shown in FIG. 30, since the integral output Vavr4 and envelope signal Semv are equal to each other during the first leading period Phd1, the comparator 395 feeds the result-of-comparison output, which signifies the fact, to the integration time constant change controller 396. The integration time constant change controller 396 in turn sets the first time constant (time constant for integration) of the integrator 392, which is employed during the leading period of the consecutive relevant sounds interval, to a large time constant that is large for the leading period, for example, to N=120.

During the second leading period Phd2, the level of the envelope signal Semv representing the current mean level is lower than the level of the integral output Vavr4 representing the mean level attained during the preceding consecutive relevant sounds interval. Therefore, the comparator 395 feeds the result-of-comparison output, which signifies the fact, to the integration time constant change controller 396. The integration time constant change controller 396 in turn sets the first time constant (time constant for integration) of the integrator 392, which is employed during the leading period of the consecutive relevant sounds interval, to a small time constant that is small for the leading period, for example, to N=80. Accordingly, during the second leading period Phd2, the integrator 392 performs an integrating action so as to more quickly follow the level of an audio signal. Specifically, volume control is implemented to raise an audio signal, which represents soft sounds, to a certain level.

During the third leading period Phd3, the level of the envelope signal Semv is higher than that of the integral output Vavr4. Therefore, the comparator 395 feeds the result-of-comparison output, which signifies the fact, to the integration time constant change controller 396. The integration time constant change controller 396 in turn sets the first time constant (time constant for integration) of the integrator 392, which is employed during the leading period of the consecutive relevant sounds interval, to the large time constant that is large for the leading period. Thus, volume control is implemented to suppress the high level of an audio signal down to a certain level without occurrence of a sound fluctuation at the level change time point.

According to the volume correction device of the fourth embodiment, the same advantage as that of the third embodiment is provided. In addition, volume correction can be achieved so that a level difference with respect to a preceding consecutive relevant sounds interval will be quickly compensated, and a fluctuation derived from a change in the level of an audio signal will be suppressed.

Fifth Embodiment

In the third and fourth embodiments, the gain to be given to an input audio signal is controlled so that the mean level of a human voice signal will be equal to a reference level. Therefore, when the mean level of the human voice signal is lower, the gain to be given to the entire input audio signal is controlled to be increased. Accordingly, if the level of an audio signal component other than the human voice signal is higher than the level of the human voice signal and the difference between the levels is large, a volume represented by the level of the audio signal component other than the human voice signal may be too large. When it comes to a content devoid of human voice, the volume of sounds other than human voice may be outstandingly large.

The fifth embodiment is an example addressing the foregoing problem. The fifth embodiment to be described below is, similarly to the third and fourth embodiments, adapted to the volume correction section 18 of the television set shown in FIG. 2.

Figure 31:
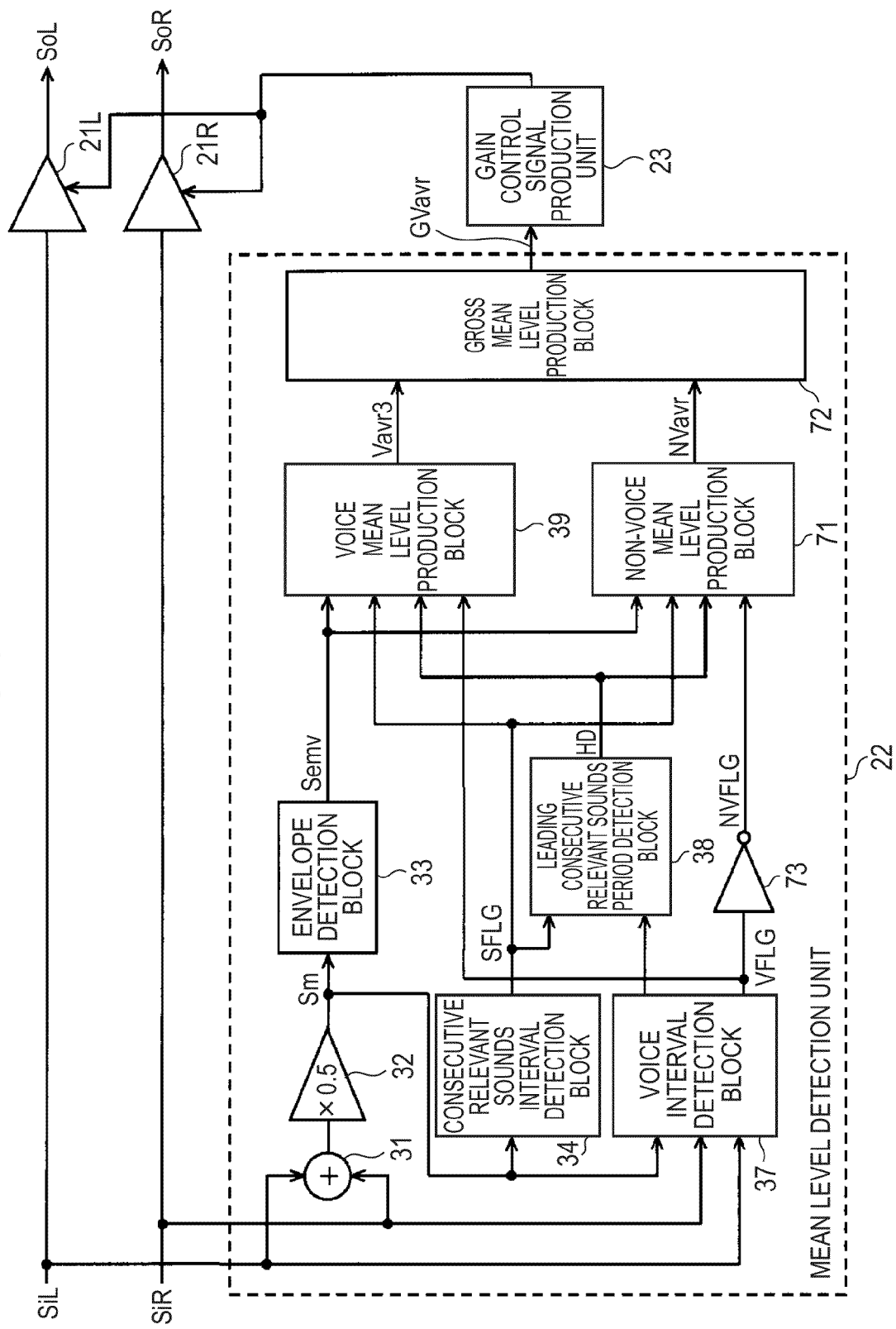
FIG. 31 is a block diagram for use in explaining an example of the configuration of a volume correction device in accordance with a fifth embodiment of the present invention.

FIG. 31 is a block diagram showing an example of the overall configuration of the volume correction section 18 according to the fifth embodiment, and is concerned with a case where the configuration is applied to the third embodiment. In FIG. 31, the same reference numerals are assigned to components identical to those of the volume correction section 18 in accordance with the third embodiment shown in FIG. 12.

In the fifth embodiment, in addition to the voice mean level production block 39 included in the aforesaid third embodiment, a non-voice mean level production block 71 is included and a gross mean level production block 72 is also included. The non-voice mean level production block 71 produces a mean level signal NVavr representing the mean level of the sum output signal Sm attained during an interval during which a signal component other than a voice signal component is present.

The non-voice mean level production block 71 has, in the present embodiment, the same hardware configuration as the voice mean level production block 39 shown in FIG. 27 does.

To the non-voice mean level production block 71, similarly to the voice mean level production block 39, the envelope signal Semv, consecutive relevant sounds interval detection flag SFLG, and leading period detection flag HD are fed. A non-voice interval detection flag NVFLG representing the polarity of the voice interval detection flag VFLG, which is sent from the voice interval detection block 37, determined by a polarity reverse circuit 73 is fed to the non-voice mean level production block 71. Namely, the configuration of the non-voice mean level production block 71 is identical to that of the voice mean level production block 39 except a point that the non-voice interval detection flag NVFLG is fed in place of the voice interval detection flag VFLG.

Since the non-voice interval detection flag NVFLG is fed to the non-voice mean level production block 71 in place of the voice interval detection flag VFLG, an audio signal occupying a non-voice interval is integrated during a consecutive relevant sounds interval. The mean level of the audio signal is detected, and a mean level signal is produced.

A non-voice mean level signal NVavr that is the output signal of the non-voice mean level production block 71, and the voice mean level signal Vavr3 that is the output signal of the voice mean level production block 39 are fed to the gross mean level production block 72.

The gross mean level production block 72 produces a compound level signal GVavr using the voice mean level signal Vavr3 and non-voice mean level signal NVavr.

In the present embodiment, the gross mean level production block 72 decides whether the non-voice mean level NVavr is higher than the level of the voice mean level signal Vavr3 by a predetermined level. If the gross mean level production block 72 decides that the non-voice mean level NVavr is not higher than the voice mean level signal Vavr3 by the predetermined level, it outputs the voice mean level signal Vavr3 as the compound level signal GVavr. If the gross mean level production block 72 decides that the non-voice mean level NVavr is higher than the level of the voice mean level signal Vavr3 by the predetermined level, it outputs the non-voice mean level signal NVavr as the compound level signal GVavr.

The gross mean level production block 72 then feeds the produced compound level signal GVavr to the gain control signal production unit 23.

In the fifth embodiment, the gain control signal production unit 23 produces a gain control signal with which the level of the compound level signal sent from the gross mean level production block 72 will be equal to the reference level, and feeds the gain control signal to the variable gain amplifiers 21L and 21R.

<Gross Mean Level Production Block 72>

Figure 32:
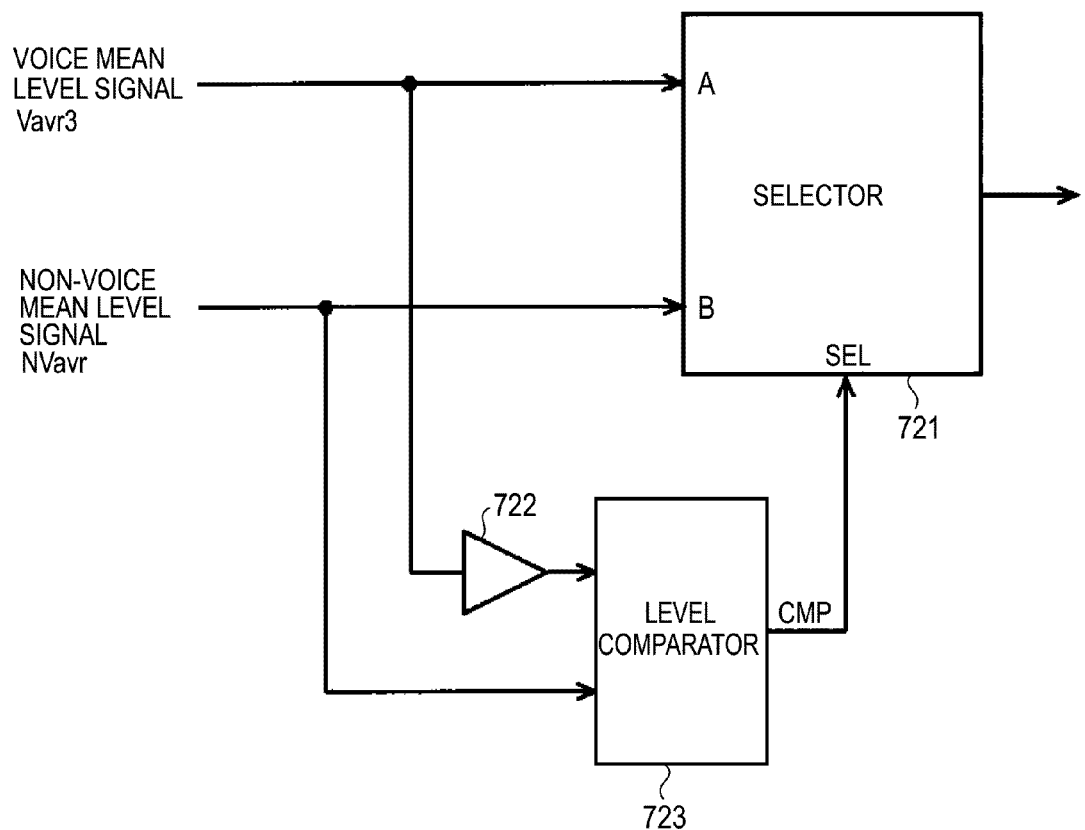
FIG. 32 is a block diagram for use in explaining an example of the configuration of a gross mean level production block employed in the fifth embodiment of the present invention.

FIG. 32 shows an example of the configuration of the gross mean level production block 72 included in the present embodiment.

The gross mean level production block 72 included in the present embodiment includes a selector 721, a weighting amplifier 722, and a level comparator 723. The voice mean level signal Vavr3 sent from the voice mean level production block 39 is fed to one A of the input terminals of the selector 721. The non-voice mean level signal NVavr sent from the non-voice mean level production block 71 is fed to the other input terminal B of the selector 721.

A signal produced by weighting the voice mean level signal Vavr3, which is sent from the voice mean level production block 39, through the weighting amplifier 722, and the non-voice mean level signal NVavr sent from the non-voice mean level production block 71 are fed to the level comparator 723.

A weight to be given by the amplifier 722 is used to designate a level equal to or higher than the level of an audio signal component representing sounds other than voice, which represents a volume smaller than a too large volume, through gain control, and is, in this example, set to a magnification of 2 (×2).

The level comparator 723 compares the levels of the signals with each other. The result-of-comparison output CMP is fed as a selection control signal to the selector 721. When the level of the non-voice mean level signal NVavr is lower than a threshold level θth that is twice higher than the level of the voice mean level signal Vavr3, the result-of-comparison output CMP represents, for example, 1 signifying that the voice mean level signal Vavr3 inputted to the input terminal A is outputted from the selector 721.

When the level of the non-voice mean level signal NVavr is higher than the threshold level θth that is twice higher than the level of the voice mean level signal Vavr3, the result-of-comparison output CMP represents, for example, 0 signifying that the non-voice mean level signal NVavr inputted to the other input terminal B is outputted from the selector 721.

Therefore, as long as the level of the non-voice mean level signal NVavr does not exceed the level that is twice higher than the level of the voice mean level signal Vavr3 (under a condition of NVavr<2Vavr3), the voice mean level signal Vavr3 is selected and fed from the selector 721 to the gain control signal production unit 23.

Under the above condition (NVavr<2Vavr3), similarly to the third embodiment, the gains to be given by the variable gain amplifiers 21L and 21R are controlled so that the level of the voice mean level signal Vavr3 will be equal to the reference level. Thus, level control is achieved so that human voice such as lines will be comfortably audible.

As long as the level of the non-voice mean level signal NVavr exceeds the level that is twice higher than the level of the voice mean level signal Vavr3 (under a condition of NVavr≥2Vavr3), the non-voice mean level signal NVavr is selected and fed from the selector 721 to the gain control signal production unit 23. Under the condition of NVavr≥2Vavr3, the gains to be given by the variable gain amplifiers 21L and 21R are controlled so that the non-voice mean level signal NVavr will be equal to the reference level. Thus, sounds other than voice are prevented from being abnormally loud.

Figure 33:
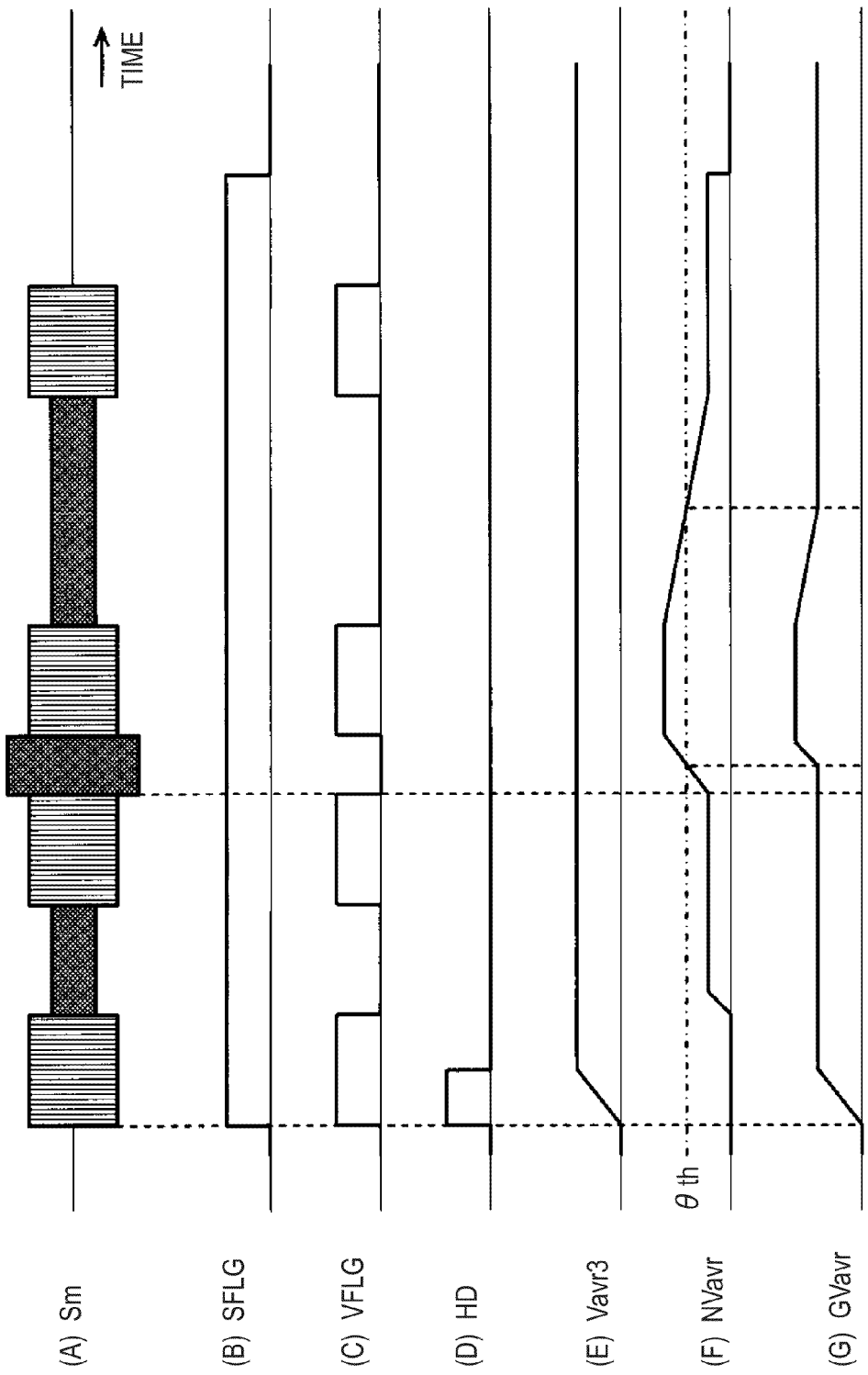
FIG. 33 is a diagram showing a timing chart for use in explaining the volume correction device in accordance with the fifth embodiment of the present invention.

Referring to FIG. 33, actions to be performed in the mean level detection unit 22 included in the fifth embodiment will be described below.

Even in the fifth embodiment, as long as the sum output signal Sm is a wave shown in part (A) of FIG. 33, the consecutive relevant sounds interval detection flag SFLG is a wave shown in part (B) of FIG. 33. The voice detection flag VFLG is a wave shown in part (C) of FIG. 33. Further, the leading period detection flag HD is a wave shown in part (D) of FIG. 33.

In the example shown in FIG. 33, the voice mean level signal Vavr3 is a wave shown in part (E) of FIG. 33, and the non-voice mean level signal NVavr is a wave shown in part (F) of FIG. 33.

Therefore, the gross mean level signal GVavr is a wave shown in part (G) of FIG. 33. Specifically, when the level of the non-voice mean level signal NVavr is lower than the threshold level θth that is twice higher than the level of the voice mean level signal Vavr3, the voice mean level signal Vavr3 is outputted as the gross mean level signal GVavr from the gross mean level production block 72.

When the level of the non-voice mean level signal NVavr is equal to or higher than the threshold level θth that is twice higher than the level of the voice mean level signal Vavr3, the non-voice mean level signal NVavr is outputted as the gross mean level signal GVavr from the gross mean level production block 72. Thus, sounds other than voice are prevented from being abnormally loud.

[Another Example of the Gross Mean Level Production Block 72]

In FIG. 32, the non-voice mean level signal NVavr is compared with a signal produced by weighting the voice mean level signal Vavr3. Based on the result-of-comparison output, either the non-voice mean level signal NVavr or voice mean level signal Vavr3 is fed to the gain control signal production unit 23.

Figure 34:
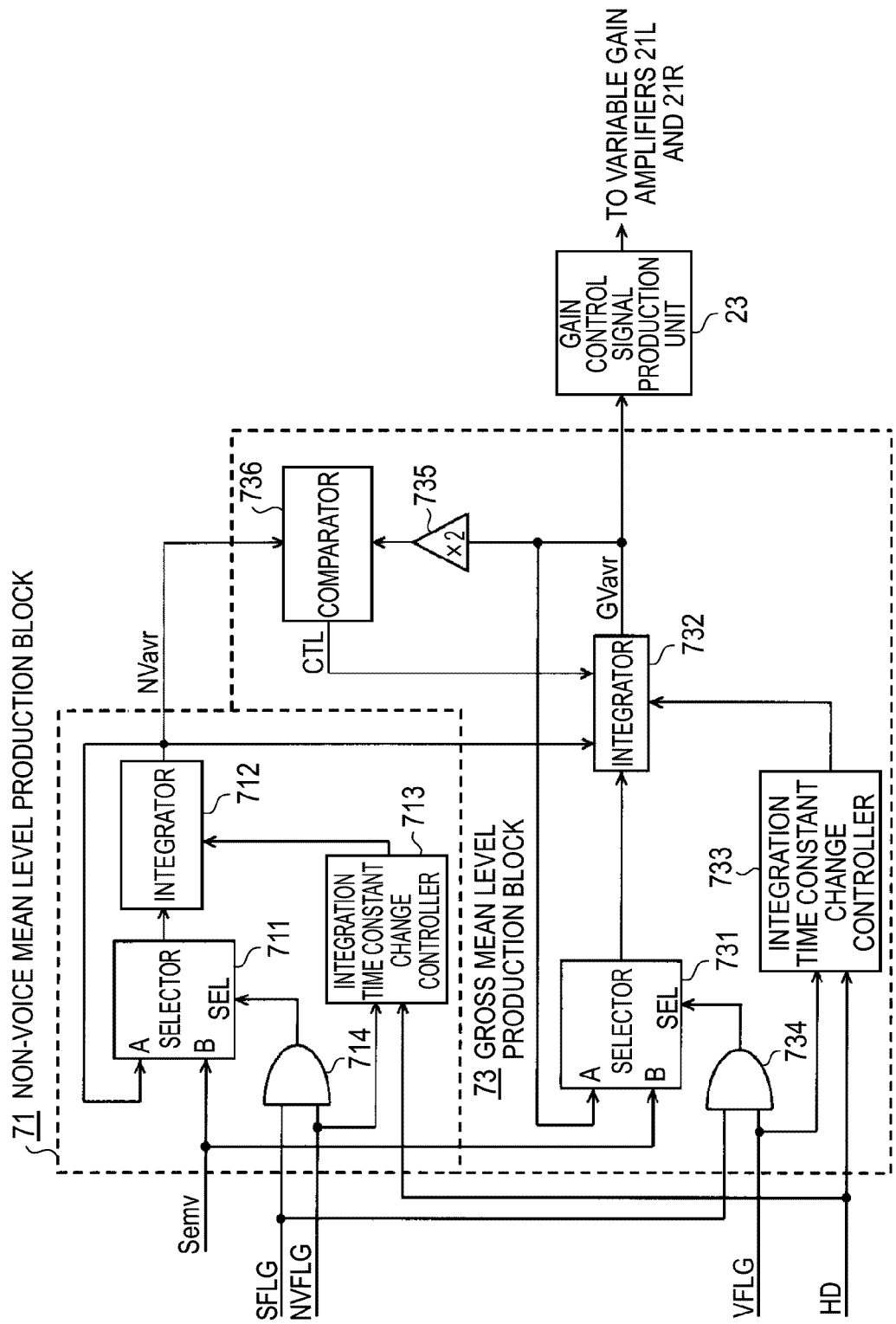
FIG. 34 is a block diagram for use in explaining another example of the configuration of the gross mean level production block employed in the fifth embodiment of the present invention.

However, the voice mean level production block 39, non-voice mean level production block 71, and gross mean level production block 72 which are shown in FIG. 32 may be modified as shown in FIG. 34.

In an example shown in FIG. 34, similarly to the example shown in FIG. 31, the non-voice mean level production block 71 is included. In the example shown in FIG. 34, a gross mean level production block 73 is substituted for the voice mean level production block 39 and gross mean level production block 72.

The gross mean level production block 73 includes, as shown in FIG. 34, similarly to the voice mean level production block 39, a selector 731, an integrator 732, an integration time constant change controller 733, and an AND gate 734. The gross mean level production block 73 includes a weighting amplifier 735 and a comparator 736.

An output signal (gross mean level signal GVavr) of the integrator 732 is fed to the input terminal A of the selector 731. The envelope signal Semv sent from the envelope detection block 33 is fed to the input terminal B of the selector 731. The AND output of the consecutive relevant sounds interval detection flag SFLG and voice detection flag VFLG sent from the AND gate 734 is fed to a selection control terminal SEL of the selector 731.

The output signal selected by the selector 731 according to the AND output of the AND gate 734 is fed to the integrator 732. An output signal of the integrator 732 has the level thereof doubled in this example by the weighting amplifier 735, and is then fed to the comparator 736. The non-voice mean level signal NVavr that is the output signal of the integrator 712 included in the non-voice mean level production block 71 is fed to the comparator 736.

The non-voice mean level signal NVavr that is the output signal of the integrator 712 included in the non-voice mean level production block 71 is fed to the integrator 732, and the result-of-comparison output signal CTL of the comparator 736 is fed to the integrator 732. When the output signal CTL of the comparator 736 signifies that a condition to be described later is established, the integrator 732 changes the integral output value thereof to the non-voice mean level signal NVavr sent from the non-voice mean level production block 71.

Processing actions to be performed in the example shown in FIG. 34 will be described below.

In the example shown in FIG. 34, the gross mean level production block 73 and non-voice mean level production block 71 perform the aforesaid integrating actions on the envelope signal Semv sent from the envelope detection block 33.

In the gross mean level production block 73, the envelope signal Semv is outputted from the selector 731 during a voice interval indicated with the voice interval detection flag VFLG. The integrator 732 performs an integrating action with the gross mean level GVavr as an initial value. During an interval other than the voice interval, the output signal of the integrator 732 is outputted from the selector 731. The value of the gross mean level GVavr is sustained (pre-held) as the output of the integrator 732.

In the non-voice mean level production block 71, the envelope signal Semv is outputted from the selector 711 during the non-voice interval indicated with the non-voice interval detection flag NVFLG. The integrator 712 performs an integrating action with the level of the non-voice mean level signal NVavr as an initial value. During the voice interval, the output signal of the integrator 712 is outputted from the selector 711. The value of the non-voice mean level signal NVavr is sustained (pre-held) as the output of the integrator 712.

Non-voice mean level production block 71 also includes gate 714 and integration time constant change controller 713. Gate 714 received signals SFLG and NVFLG and provides an output to selector 711. Integration time constant change controller receives signals NVFLG and HD as inputs and provides an output to integrator 712.

The comparator 736 compares a value, which is a double of the level of the gross mean level signal GVavr sent from the gross mean level production block 73 via the amplifier 735, with the level of the non-voice mean level signal NVavr sent from the non-voice mean level production block 71, and feeds a comparison output CTL to the integrator 732.

The integrator 732 references the comparison output CTL so as to decide whether the level of the non-voice mean level signal NVavr meets a condition (NVavr<2GVavr) that the level does not exceed the value, which is a double of the level of the gross mean level signal GVavr, or a condition (NVavr≥2GVavr) that the level exceeds the value which is the double of the level of the gross mean level signal GVavr.

If the integrator 732 decides that the NVavr value does not exceed the 2GVavr value (the condition NVavr<2GVavr is met), the integrator 732 does not change the value in a holder that holds the result of integration, and produces and outputs, similarly to that included in the third embodiment, the voice mean level signal Vavr3 as the gross mean level signal GVavr.

Specifically, when the signal CTL sent from the comparator 736 signifies that the condition NVavr<2GVavr is met, the integrator 732 ignores the non-voice mean level signal NVavr sent from the non-voice mean level production block 71 and performs the same processing as that included in the third embodiment does.

When the integrator 732 decides that the NVavr value exceeds the 2GVavr value (the condition NVavr≥2GVavr is met), the integrator 732 changes the value in the holder, which holds the result of integration, into the non-voice mean level signal VNavr. Therefore, as long as the NVavr value exceeds the 2GVavr value (the condition NVavr≥2GVavr is met), the non-voice mean level signal NVavr is adopted as the output of the integrator 732.

When the NVavr value does not exceed the 2GVavr value (the condition NVavr<2GVavr is met), the integrator 732 ceases the action of setting the value in the holder, which holds the result of integration, to the non-voice mean level signal NVavr according to the comparison output CTL, and resumes the processing of integrating an output of the selector 731.

In the example shown in FIG. 34, the output signal sent from the integrator 732 is fed as the gross mean level signal GVavr to the gain control signal production unit 23. The gain control signal production unit 23 produces a gain control signal which makes the level of the gross mean level signal GVavr equal to a reference level.

The fifth embodiment is a case where a constituent feature of the present invention is applied to the third embodiment. Needless to say, the constituent feature may be applied to the fourth embodiment.

Other Embodiments and Variants

In the aforesaid embodiments, a voice mean level and a non-voice mean level of an input audio signal are detected in real time in order to control a gain. However, the present invention is not limited to real-time processing.

For example, a voice mean level and a non-voice mean level of an audio signal recorded in a recording medium may be detected in order to produce a gain control signal, and the gain control signal may be recorded in association with the record signal. In this case, for reproduction, the recorded gain control signal is used to control a volume represented by a reproduction audio signal.

Figure 35:
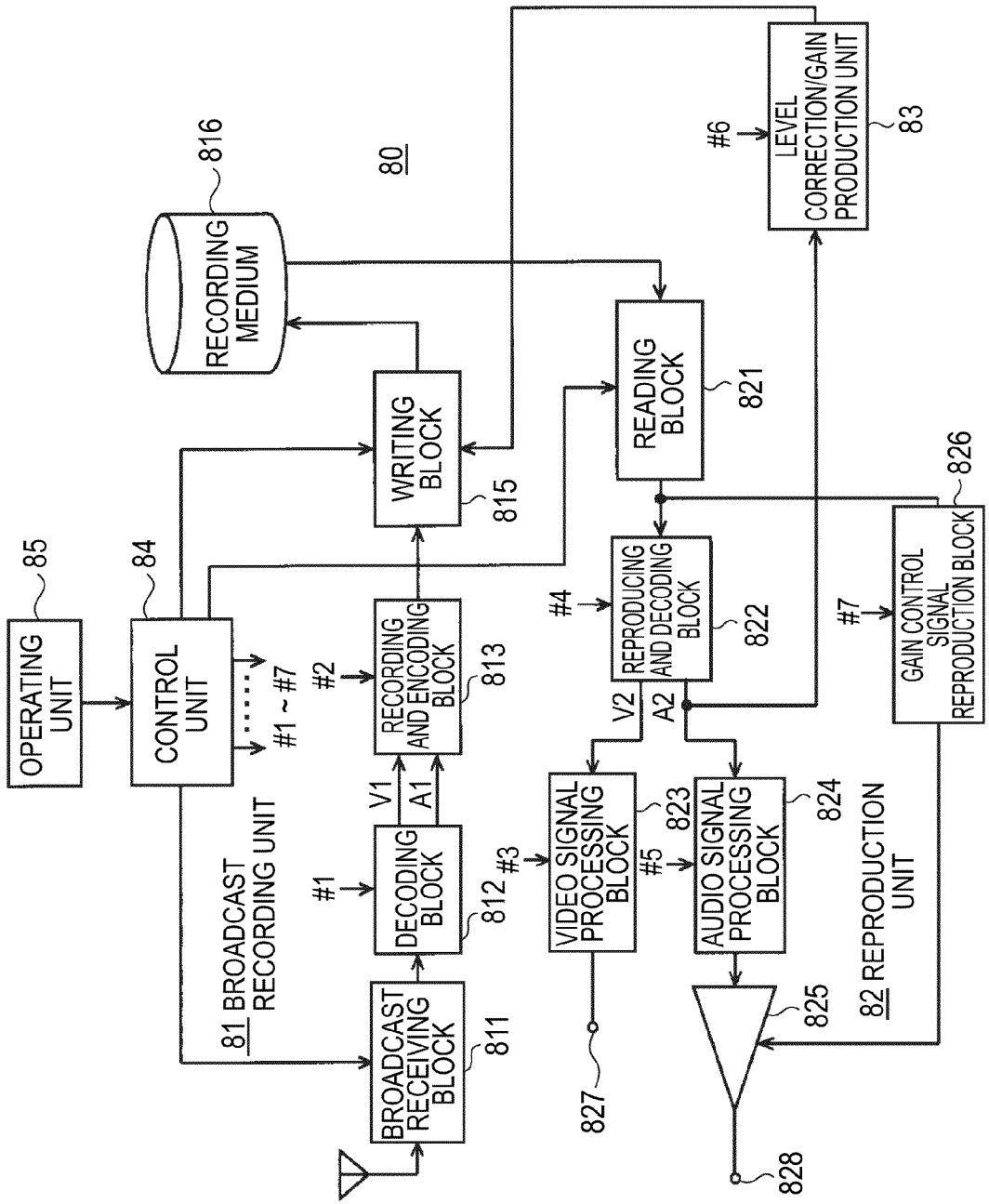
FIG. 35 is a diagram showing another example of electronic equipment to which the volume correction device in accordance with any of the embodiments of the present invention is adapted.

FIG. 35 is a block diagram showing a recording/reproducing apparatus which can record a television broadcast signal in a recording medium, for example, a hard disk or a digital versatile disc (DVD) and to which the present invention is applied.

Specifically, a recording/reproducing apparatus 80 that is an example shown in FIG. 35 includes a broadcast recording unit 81, a reproducing unit 82, a level correction/gain production unit 83, a control unit 84, and an operating unit 85. The operating unit 85 is realized with, for example, a remote-control transmitting/receiving unit. The control unit 84 includes, for example, a microcomputer and controls the components of the recording/reproducing apparatus 80 according to a manipulative input sent from the operating unit 85.

The level correction/gain production unit 83 is realized with the mean level detection unit 22 and gain control signal production unit 23 that are included in the aforesaid embodiments.

When a user performs a recording instructing manipulation with the operating unit 85, the control unit 84 controls the broadcast recording unit 81 so as to execute recording of a broadcast program whose recording has been instructed.

In the broadcast recording unit 81, a broadcast receiving block 811 receives a broadcasting wave signal that represents the broadcast program whose recording has been instructed, and feeds it to a decoding block 812. The decoding block 812 decodes and outputs, in this example, a video signal V1 and an audio signal A1 included in the received signal. Herein, the audio signal A1 is, for example, composed of audio signals on two left and right channels.

The video signal V1 and audio signal A1 sent from the decoding block 812 are encoded by a recording and encoding block 813 for the purpose of recording, and then recorded in a recording medium 816 via a writing block 815. For example, a hard disk drive is adopted as the recording medium 816.

The operating unit 85 includes keys, which are used to designate a broadcast program content recorded in the recording medium 816, and a level correction/gain production instruction key. When a user designates a recorded broadcast program content and manipulates the level correction/gain production instruction key, the control unit 84 executes level correcting/gain producing processing for correcting a reproduction volume of the designated broadcast program content represented by the audio signal.

Specifically, the control unit 84 controls the acting states of a reading block 821, a reproducing and decoding block 822, a level correction/gain production block 83, and a writing block 815, which are included in the reproduction unit, according to a manipulative input sent from the level correction/gain production instruction key.

The control unit 84 controls the reading block 821 so as to read a record signal, which represents the designated broadcast program, from the recording medium 816. The reading block 821 feeds the read record signal to the reproducing and decoding block 822. The reproducing and decoding block 822 decodes the record signal for reproduction, and outputs a reproduction video signal V2 and a reproduction audio signal A2.

The reproduction audio signal A2 sent from the reproducing and decoding block 822 is fed to the level correction/gain production unit 83. The level correction/gain production unit 83 produces a gain control signal as described in relation to the first or second embodiment.

The level correction/gain production unit 83 feeds the produced gain control signal to the writing block 815. The writing block 815 records the gain control signal, which is sent from the level correction/gain production unit 83, in the recording medium 816 in association with the record signal, which is being reproduced, under the control of the control unit 84.

When the user performs a reproduction instructing manipulation with the operating unit 85, the control unit 84 controls the reproduction unit 82 so as to execute reproduction of the broadcast program whose reproduction has been instructed.

The control unit 84 controls the reading block 821 to read the record signal, which represents the designated broadcast program, and the gain control signal, which is recorded in association with the record signal, from the recording medium 816. The reading block 821 feeds the read record signal to the reproducing and decoding block 822, and feeds the read gain control signal to a gain control signal reproduction block 826.

The reproducing and decoding block 822 decodes the record signal for reproduction, and thus obtains the reproduction video signal V2 and reproduction audio signal A2. The reproduction video signal V2 is outputted through a video output terminal 827 via a video signal processing block 823. A display device is connected to an output terminal 827, and a reproduced picture of the broadcast program is displayed on the display screen.

The reproduction audio signal sent from the reproducing and decoding block 822 is fed to a variable gain amplifier 825 via an audio signal processing block 824.

The gain control signal reproduction block 826 reproduces the gain control signal from the signal sent from the reading block 821. The gain control signal reproduction block 826 feeds the reproduced gain control signal to the variable gain amplifier 825, and thus controls the gain to be given by the variable gain amplifier. Therefore, the audio signal sent from the variable gain amplifier 825 represents, similarly to that in the first or second embodiment, human voice that is comfortably audible, and other sounds which are not too loud.

The reproduction audio signal sent from the variable gain amplifier 825 is fed to a loudspeaker through an audio output terminal 828.

In the example shown in FIG. 35, the level correction/gain production unit 83 has the same configuration as that in the aforesaid embodiments. However, since processing need not be performed in real time in the example shown in FIG. 35, although a processing time is long, the processing is achieved highly precisely.

For example, the consecutive relevant sounds interval detection block 34 may not have the foregoing constitution, but may perform cepstrum analysis so as to obtain a spectral envelope through fast Fourier transform (FFT), and may thus more precisely detect a consecutive relevant sounds interval and an extension interval.

When the constituent features of the third to fifth embodiments are adopted, if the recording/reproducing apparatus 80 is designed to have a sufficient buffering capacity and throughput, a pitch may be detected along with auto-correlation of an audio signal in order to detect a voice interval during which a human voice signal is present. Cepstrum analysis may be performed to obtain a spectral envelope through FFT, whereby the voice interval during which the human voice signal is present may be more precisely detected.

In the above example, the audio signal falls into signals on two left and right channels. Since the object signal to be treated by the mean level detection unit 22 is the sum audio signal Sm, the audio signal to be subjected to volume correction may be, needless to say, a monophonic audio signal.

In recent years, the audio signal may have been a surround audio signal composed of signals on 5.1 channels or an audio signal composed of signals on three or more multiple channels. In the case of the multi-channel audio signal, a human voice signal is mainly contained in a signal on a center channel. When the constituent features of the third to fifth embodiments are adopted, the audio signal on the center channel is used to detect a voice interval.

Figure 36:
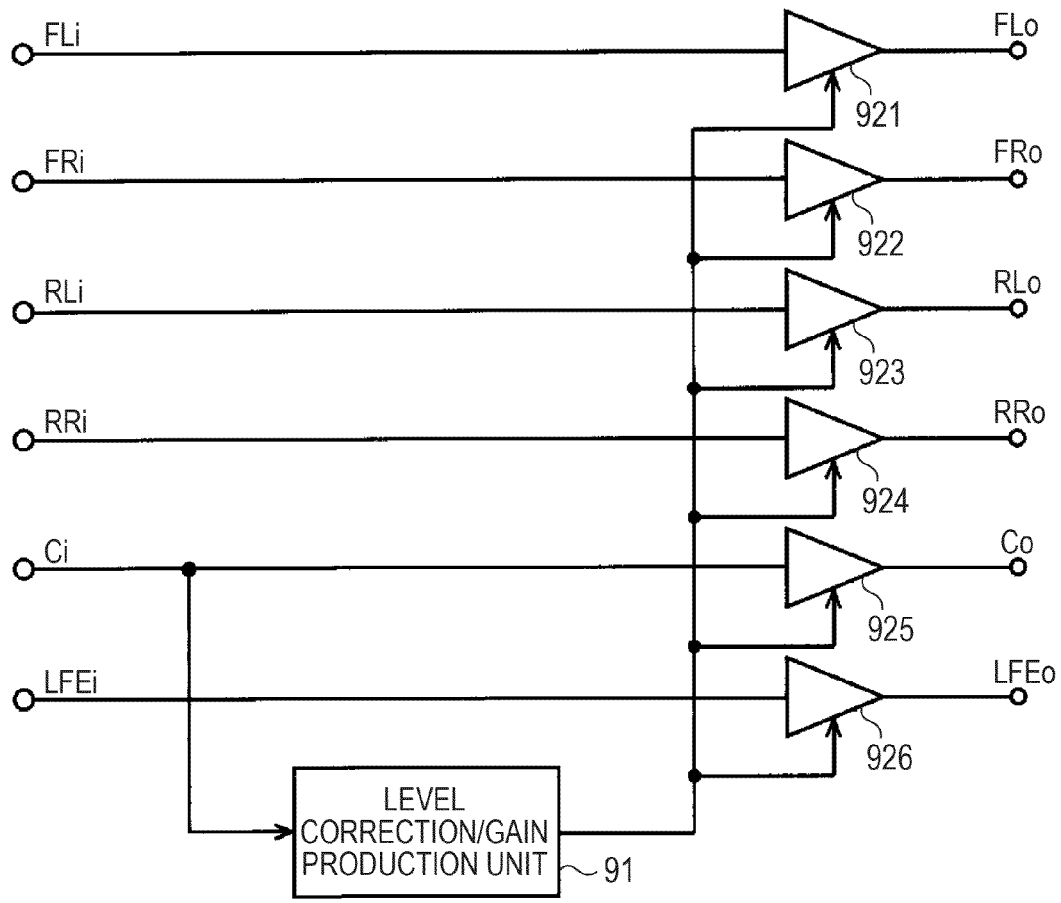
FIG. 36 is a block diagram for use in explaining a volume correction device in accordance with one another embodiment of the present invention.

FIG. 36 is a diagram for use in explaining the gist of a volume correction device of an embodiment in which: the constituent features of the third to fifth embodiments are employed; and the 5.1-channel surround audio signal is used as an input audio signal.

In this example, audio signals FLi and FRi on left and right front channels are fed to variable gain amplifiers 921 and 922. Audio signals RLi and RRi on left and right rear channels are fed to variable gain amplifiers 923 and 924. An audio signal LFE (low-frequency effect) dedicated to a low frequency is fed to a variable gain amplifier 926.

An audio signal Ci on a center channel is fed to a level correction/gain production unit 91. The level correction/gain production unit 91 has the same constitution as the level correction/gain production unit 83 shown in FIG. 35 does. However, the level correction/gain production unit 91 uses the audio signal Ci on the center channel as the sum audio signal Sm, and produces a gain control signal, based on which the gains to be given by the variable gain amplifiers 921 to 926 are controlled, according to any of the techniques employed in the third to fifth embodiments.

Output audio signals FLo, FRo, RLo, RRo, Co, and LFo are outputted from the variable gain amplifiers 921 to 926, and sounds are released from associated loudspeakers.

According to the example shown in FIG. 36, the output audio signals FLo, FRo, RLo, RRo, Co, and LFo on the 5.1 channels have the gains thereof controlled with the gain control signal produced by the level correction/gain production unit 91. Therefore, human voice is comfortably audible, and sounds other than the human voice are prevented from being too loud.

When audio signals on three or more multiple channels are mixed down into audio signals on two channels, a level correction/gain production unit treats the resultant audio signals on the mixed-down two channels.

Figure 37:
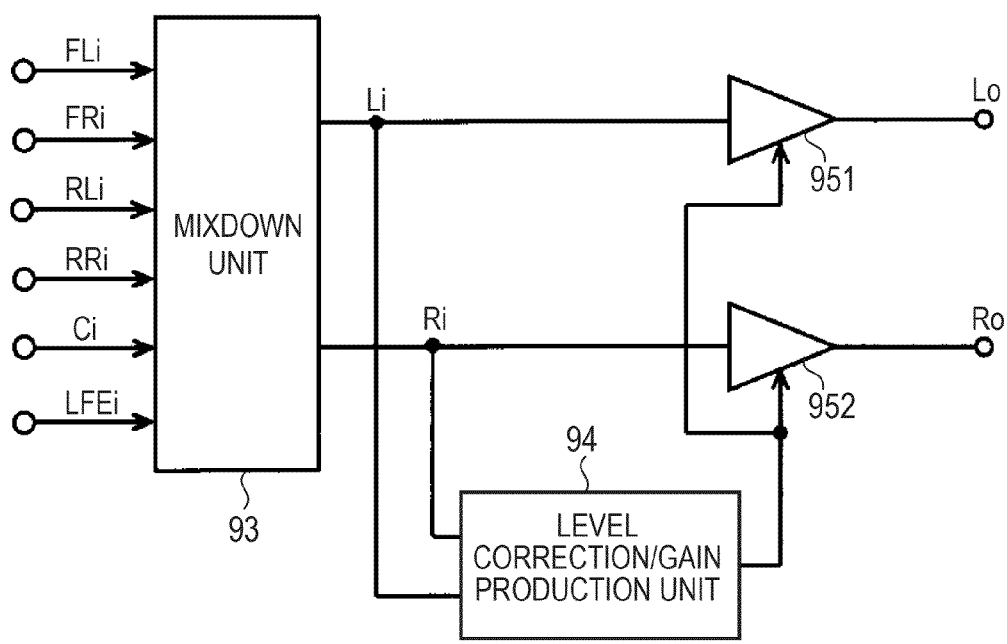
FIG. 37 is a block diagram for use in explaining a volume correction device in accordance with still one another embodiment of the present invention.
Figure 38:
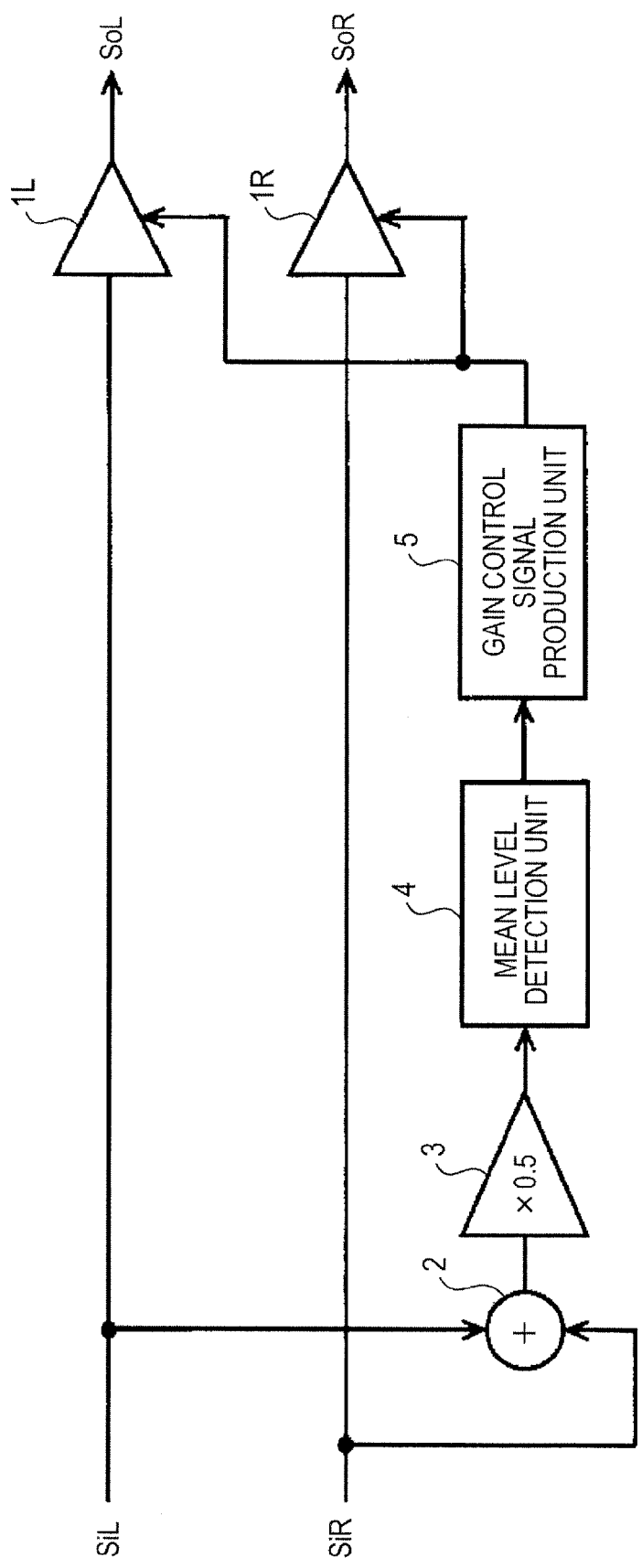
FIG. 38 is a block diagram for use in explaining a volume correction device in accordance with a related art.

FIG. 37 is a diagram for use in explaining the outline of a volume correction device of an embodiment in which an input audio signal has surround audio signals on 5.1 channels mixed down into audio signals on two channels.

Specifically, in the example shown in FIG. 37, the surround audio signals on 5.1 channels FLi, FRi, RLi, RRi, Ci, and LFi are fed to a downmix unit 93, and mixed down into audio signals Li and Ri on two left and right channels.

The audio signals Li and Ri on two left and right channels sent from the downmix unit 93 are fed to variable gain amplifiers 951 and 952 respectively, and also fed to a level correction/gain production unit 94.

The level correction/gain production unit 94 has the same constitution as the level correction/gain production unit 83 shown in FIG. 34 does. Specifically, the level correction/gain production unit 94 produces, in this example, a gain control signal, based on which the gains to be given by the variable gain amplifiers 951 and 952 are controlled, from the audio signals Li and Ri on the left and right channels according to any of the techniques employed in the aforesaid embodiments.

Even in the example shown in FIG. 37, the same operation and advantage as the aforesaid ones are provided.

Other Variants

In the above description, the mean level detection unit 22 is configured as hardware including discrete circuit blocks. Alternatively, the mean level detection unit 22 may include a digital signal processor (DSP).

Needless to say, the mean level detection unit 22 may be configured as software processing to be performed by a program installed in a computer. In this case, for instance, in the example shown in FIG. 2, the control section 10 includes the mean level detection unit 22 as a software processing facility. In FIG. 2, as indicated with a dashed line, the gains to be given by the variable gain amplifiers included in the volume correction section 18 are controlled based on a gain control signal sent from the control section 10.

Assuming that an audio signal is subjected to digital signal processing, all of the components of the volume correction section 18 including the variable gain amplifiers may be configured as pieces of software processing.

Needless to say, electronic equipment to which the volume correction device in which the present invention is implemented is adapted is not limited to the television set shown in FIG. 2.

In the aforesaid embodiments, a consecutive relevant sounds interval is detected using an input audio signal alone. However, assuming that a video signal is associated with an audio signal as it is in a television broadcast program signal, the result of voice presence/absence detection, and information on a scene change time point detected using a feature quantity of the video signal may be used in combination in order to detect the consecutive relevant sounds interval.

The present application contains subject matter related to that disclosed in Japanese Priority Patent Application JP 2009-032272 filed in the Japan Patent Office on Feb. 16, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A volume correction device comprising:
    a variable gain device that controls a gain given to an input audio signal, according to a gain control signal;
    a consecutive relevant sounds interval detection device that detects a consecutive relevant sounds interval, during which a group of temporally adjoining consecutive relevant sounds is present, in the input audio signal;
    a mean level detection device that detects a first mean level of the input audio signal attained during the consecutive relevant sounds interval detected by the consecutive relevant sounds interval detection device, in which a time constant for mean level detection is set to a smaller value during a leading period of the consecutive relevant sounds interval than during a remaining period of the consecutive relevant sounds interval; and
    a gain control signal production device that produces the gain control signal, by which the gain to be given to the input audio signal is controlled, so that the first mean level detected by the mean level detection device will be equal to a reference level, and for feeding the produced gain control signal to the variable gain device.

2. The volume correction device according to claim 1, wherein during the leading period of the consecutive relevant sounds interval, the mean level detection device compares the first mean level detected by the mean level detection device to a second mean level of the input audio signal and changes the time constant for mean level detection, according to the result of the comparison.

3. The volume correction device according to claim 1, wherein the consecutive relevant sounds interval detection device includes:
    a voice signal presence/absence detection device that detects the presence or absence of the input audio signal, and
    an extension device that extends an interval during which a signal is detected to be present by the audio signal presence/absence detection device by a certain time.

4. The volume correction device according to claim 3, wherein the voice signal presence/absence detection device includes:
    a second mean level detection device that detects a second mean level of the input audio signal while being set to a first time constant for mean level detection and outputting a second mean level output signal;
    a third mean level detection device that detects a third mean level of the input audio signal while being set to a time constant for mean level detection larger than the first time constant for mean level detection and outputting a third mean level output signal; and
    a comparison device that compares level of the second mean level output signal with a threshold that is a signal level obtained by attenuating a level of the third mean level output signal sent from the third mean level detection device, and outputting a detection signal, which indicates an interval during which the level of the second mean level output signal is higher than the threshold, as a signal indicating an interval during which a signal is detected to be present by the audio signal presence/absence detection device.

5. A volume correction device comprising:
    a variable gain device that controls a gain given to an input audio signal according to a gain control signal;
    a consecutive relevant sounds interval detection device that detects a consecutive relevant sounds interval, during which a group of temporally adjoining consecutive relevant sounds is present, in the input audio signal;
    a voice interval detection device that detects a voice interval that is a time interval during which the input audio signal contains an audio signal representing human voice;
    a voice mean level detection device that detects a first mean level of the input audio signal attained during the voice interval detected by the voice interval detection device, in which a time constant for mean level detection is set to a smaller value during a leading period of the consecutive relevant sounds interval than during a remaining period of the consecutive relevant sounds interval; and
    a gain control signal production device that produces the gain control signal by which the gain to be given to the input audio signal is controlled, so that the first mean level detected by the voice mean level detection device will be equal to a reference level, and for feeding the produced gain control signal to the variable gain device.

6. The volume correction device according to claim 5, wherein during the leading period of the consecutive relevant sounds interval, the voice mean level production device compares the first mean level detected by the voice mean level detection device to a second mean level of the input audio signal attained during the voice interval and changes the time constant for mean level detection according to the result of the comparison.

7. A volume correction device comprising:
    a variable gain device that controls a gain given to an input audio signal according to a gain control signal;
    a consecutive relevant sounds interval detection device that detects a consecutive relevant sounds interval, during which a group of temporally adjoining consecutive relevant sounds is present, in the input audio signal;
    a voice interval detection device that detects a voice interval that is a time interval during which the input audio signal contains an audio signal representing human voice;
    a voice mean level detection device that detects a first mean level of the input audio signal attained during the voice interval detected by the voice interval detection device, in which a time constant for mean level detection is set to a smaller value during a leading period of the consecutive relevant sounds interval than during a remaining period of the consecutive relevant sounds interval;
    a non-voice mean level detection device that detects a second mean level of an audio signal that represents sounds other than human voice and silence and that is contained in the input audio signal; and
    a gain control signal production device that produces when the second mean level detected by the non-voice mean level detection device is not higher by a certain magnitude than the first mean level detected by the voice mean level detection device, the gain control signal by which the gain to be given to the input audio signal is controlled so that the first mean level detected by the voice mean level detection device will be equal to a reference level, for producing, when the second mean level detected by the non-voice mean level detection device is higher by the certain magnitude than the first mean level detected by the voice mean level detection device, the gain control signal which the gain to be given to the input audio signal is controlled so that the second mean level detected by the non-voice mean level detection device will be equal to the reference level, and for feeding the produced gain control signal to the variable gain device.

8. The volume correction device according to claim 7, wherein the consecutive relevant sounds interval detection device includes:
a voice signal presence/absence detection device that detects the presence or absence of the input audio signal, and
an extension device that extends an interval during which a signal is detected to be present by the audio signal presence/absence detection device by a certain time.

9. The volume correction device according to claim 8, wherein the voice signal presence/absence detection device includes:
a third mean level detection device that detects a third mean level of the input audio signal while being set to a first time constant for mean level detection and outputting a third mean level output signal;
a fourth mean level detection device that detects a fourth mean level of the input audio signal while being set to a time constant for mean level detection larger than the first time constant for mean level detection and outputting a fourth mean level output signal; and
a comparison device that compares a level of the third mean level output signal with a threshold that is a signal level obtained by attenuating a level of the fourth mean level output signal sent from the fourth mean level detection device, and outputting a detection signal, which indicates an interval during which the level of the third mean level output signal is higher than the threshold, as a signal indicating an interval during which a signal is detected to be present by the audio signal presence/absence detection device.

10. A volume correction method to be implemented in a volume correction device including a variable gain means for controlling a gain, which is given to an input audio signal, according to a gain control signal, a consecutive relevant sounds interval detection means, a mean level detection means, and a gain control signal production means, the method comprising the steps of:
causing the consecutive relevant sounds interval detection means to detect a consecutive relevant sounds interval, during which a group of temporally adjoining consecutive relevant sounds is present, in the input audio signal;
causing the mean level detection means to detect a first mean level of the input audio signal attained during the consecutive relevant sounds interval detected at the consecutive relevant sounds interval detection step, and to set a time constant thereof for mean level detection to a smaller value during a leading period of the consecutive relevant sounds interval than during a remaining period of the consecutive relevant sounds interval; and
causing the gain control signal production means to produce the gain control signal by which the gain to be given to the input audio signal is controlled so that the first mean level detected at the mean level detection step will be equal to a reference level,
wherein the gain to be given by the variable gain means is controlled based on the gain control signal produced by the gain control signal production step.

11. A volume correction method to be implemented in a volume correction device including a variable gain means for controlling a gain, which is given to an input audio signal, according to a gain control signal, a consecutive relevant sounds interval detection means, a voice interval detection means, a voice mean level detection means, and a gain control signal production means, the method comprising the steps of:
causing the consecutive relevant sounds interval detection means to detect a consecutive relevant sounds interval, during which a group of temporally adjoining consecutive relevant sounds is present, in the input audio signal;
causing the voice interval detection means to detect a voice interval that is a time interval during which the input audio signal contains an audio signal representing human;
causing the voice mean level detection means to detect a first mean level of the input audio signal attained during the voice interval detected by the voice interval detection means, and to set a time constant thereof for mean level detection to a smaller value during a leading period of the consecutive relevant sounds interval than during a remaining period of the consecutive relevant sounds interval; and
causing the gain control signal production means to produce the gain control signal by which the gain to be given to the input audio signal is controlled so that the first mean level detected by the voice mean level detection means will be equal to a reference level,
wherein the gain to be given by the variable gain means is controlled based on the gain control signal produced by the gain control signal production step.

12. A volume correction method to be implemented in a volume correction device including a variable gain means for controlling a gain, which is given to an input audio signal, according to a gain control signal, a consecutive relevant sounds interval detection means, a voice interval detection means, a voice mean level detection means, a non-voice mean level detection means, and a gain control signal production means, the method comprising the steps of:
causing the consecutive relevant sounds interval detection means to detect a consecutive relevant sounds interval, during which a group of temporally adjoining consecutive relevant sounds is present, in the input audio signal;
causing the voice interval detection means to detect a voice interval that is a time interval during which the input audio signal contains an audio signal representing human;
causing the voice mean level detection means to detect a first mean level of the input audio signal attained during the voice interval detected by the voice interval detection step, and to set a time constant thereof for mean level detection to a smaller value during a leading period of the consecutive relevant sounds interval than during a remaining period of the consecutive relevant sounds interval;
causing the non-voice mean level detection means to detect a second mean level of an audio signal that represents sounds other than human voice and silence and that is contained in the input audio signal; and
causing the gain control signal production means to produce, when the second mean level detected at the non-voice mean level detection step is not higher by a certain magnitude than the first mean level detected by the voice mean level detection step, the gain control signal by which the gain to be given to the input audio signal is controlled so that the first mean level detected by the voice mean level detection means will be equal to a reference level, and to produce, when the second mean level detected by the non-voice mean level detection step is higher by the certain magnitude than the first mean level detected by the voice mean level detection step, the gain control signal by which the gain to be given to the input audio signal is controlled so that the second mean level detected by the non-voice mean level detection step will be equal to the reference level, wherein the gain to be given by the variable gain means is controlled based on the gain control signal produced by the gain control signal production step.

* * * * *